United States Patent
Hoshino et al.

(10) Patent No.: US 7,750,377 B2
(45) Date of Patent: Jul. 6, 2010

(54) VERTICAL JUNCTION FIELD EFFECT TRANSISTORS, AND METHODS OF PRODUCING THE VERTICAL JUNCTION FIELD EFFECT TRANSISTORS

(75) Inventors: Takashi Hoshino, Osaka (JP); Shin Harada, Osaka (JP); Kazuhiro Fujikawa, Osaka (JP); Satoshi Hatsukawa, Osaka (JP); Kenichi Hirotsu, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 395 days.

(21) Appl. No.: 11/770,414

(22) Filed: Jun. 28, 2007

(65) Prior Publication Data
US 2007/0278540 A1    Dec. 6, 2007

Related U.S. Application Data

(62) Division of application No. 10/522,278, filed as application No. PCT/JP03/09412 on Jul. 24, 2003, now Pat. No. 7,282,760.

(30) Foreign Application Priority Data
Jul. 24, 2002    (JP)    ............................ P2002-215804
Aug. 12, 2002    (JP)    ............................ P2002-235045

(51) Int. Cl.
   *H01L 29/80*    (2006.01)
(52) U.S. Cl. .............. 257/263; 257/328; 257/E29.313; 257/E29.262
(58) Field of Classification Search ................. 257/213, 257/263, 301, 328, E21.447, E29.313, E29.262
See application file for complete search history.

(56) References Cited

U.S. PATENT DOCUMENTS 4,754,310 A    6/1988    Coe (Continued)

FOREIGN PATENT DOCUMENTS

EP    0 053 854    6/1982

(Continued)

OTHER PUBLICATIONS

European Search Report dated Jun. 19, 2009 for European Patent Application No. 03765376.3 (3 pages).

*Primary Examiner*—Thomas L Dickey
*Assistant Examiner*—Fazli Erdem
(74) *Attorney, Agent, or Firm*—Fish & Richardson P.C.

(57) ABSTRACT

A vertical JFET $1a$ according to the present invention has an $n^+$ type drain semiconductor portion 2, an n-type drift semiconductor portion 3, a $p^+$ type gate semiconductor portion 4, an n-type channel semiconductor portion 5, an $n^+$ type source semiconductor portion 7, and a $p^+$ type gate semiconductor portion 8. The n-type drift semiconductor portion 3 is placed on a principal surface of the $n^+$ type drain semiconductor portion 2 and has first to fourth regions $3a$ to $3d$ extending in a direction intersecting with the principal surface. The $p^+$ type gate semiconductor portion 4 is placed on the first to third regions $3a$ to $3c$ of the n-type drift semiconductor portion 3. The n-type channel semiconductor portion 5 is placed along the $p^+$ type gate semiconductor portion 4 and is electrically connected to the fourth region $3d$ of the n-type drift semiconductor portion 3.

21 Claims, 48 Drawing Sheets

U.S. PATENT DOCUMENTS

| | | | |
|---|---|---|---|
| 5,895,939 A * | 4/1999 | Ueno | 257/279 |
| 6,072,215 A | 6/2000 | Kawaji et al. | |
| 6,137,136 A | 10/2000 | Yahata et al. | |
| 6,281,521 B1 | 8/2001 | Singh | |
| 6,303,947 B1 | 10/2001 | Ueno | |
| 6,373,318 B1 | 4/2002 | Dohnke et al. | |
| 6,525,375 B1 | 2/2003 | Yamaguchi et al. | |
| 6,784,486 B2 | 8/2004 | Baliga | |
| 6,787,848 B2 | 9/2004 | Ono et al. | |
| 6,841,812 B2 * | 1/2005 | Zhao | 257/256 |
| 7,023,033 B2 * | 4/2006 | Harada et al. | 257/287 |
| 2001/0024138 A1 | 9/2001 | Dohnke et al. | |

FOREIGN PATENT DOCUMENTS

| | | |
|---|---|---|
| EP | 0 981 166 | 2/2000 |
| EP | 1 119 054 | 7/2001 |
| JP | 51-135381 | 11/1976 |
| JP | 57-124469 | 8/1982 |
| JP | 60-038885 | 2/1985 |
| JP | 04-276664 | 10/1992 |
| JP | 2000-114544 | 4/2000 |
| JP | 2000-150912 | 5/2000 |
| JP | 2000-252475 | 9/2000 |
| JP | 2000-269518 | 9/2000 |
| JP | 2001-144292 | 5/2001 |
| JP | 2001-196602 | 7/2001 |
| JP | 2002-520857 | 7/2002 |
| WO | WO00/19536 | 4/2000 |

* cited by examiner

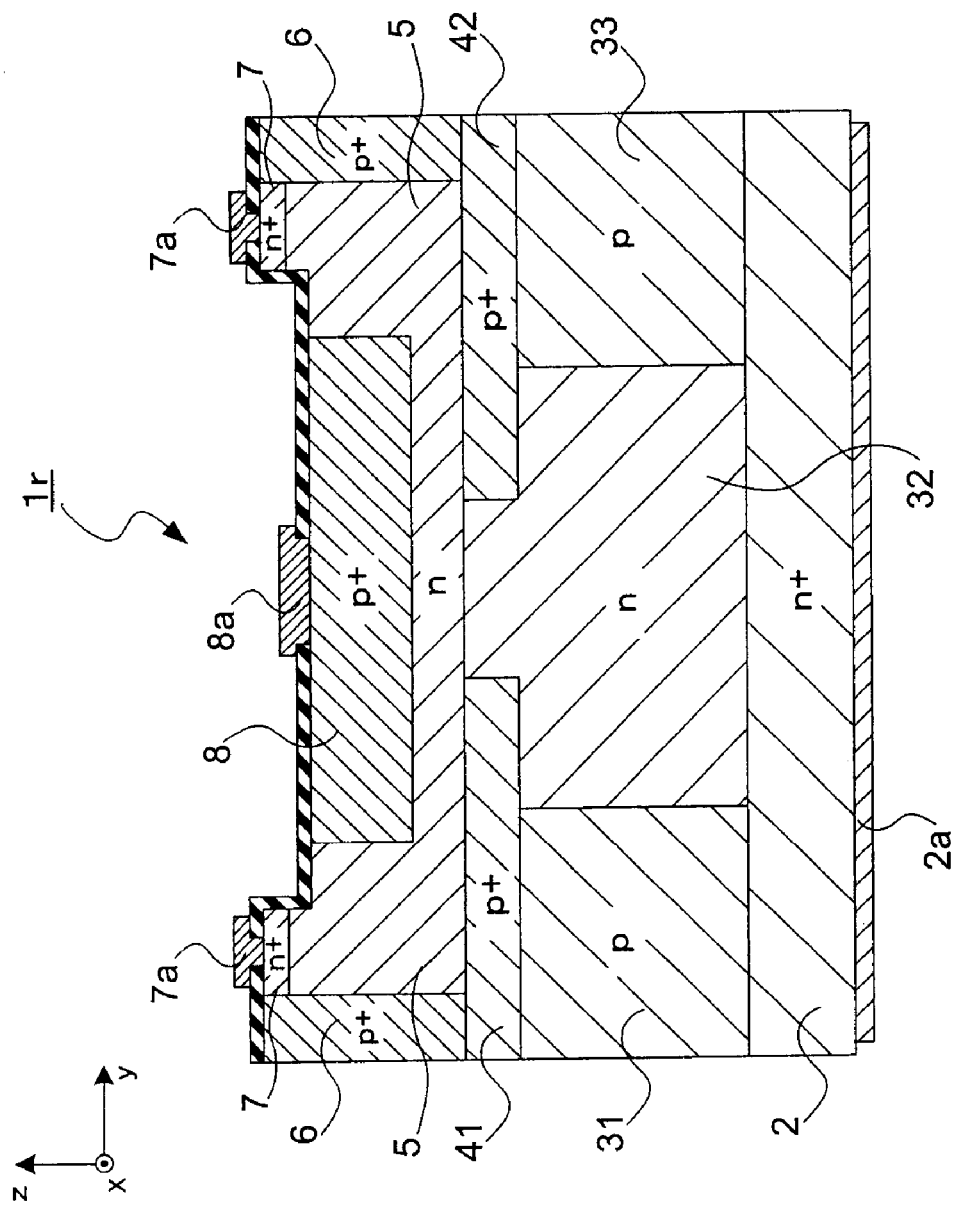

VERTICAL JUNCTION FIELD EFFECT TRANSISTORS, AND METHODS OF PRODUCING THE VERTICAL JUNCTION FIELD EFFECT TRANSISTORS

CROSS-REFERENCE TO RELATED APPLICATIONS

This application is a divisional application of and claims priority to U.S. patent application Ser. No. 10/522,278, filed Jan. 24, 2005, which is a 371 of International Application No. PCT/JP2003/009412, filed Jul. 24, 2003, which claims the benefit of Japanese Patent Application Nos. P2002-215804, filed Jul. 24, 2002, and P2002-235045, filed Aug. 12, 2002. The disclosures of the prior applications are considered part of (and are incorporated by reference in) the disclosure of this application.

TECHNICAL FIELD

The present invention relates to vertical junction field effect transistors, and methods of producing the vertical junction field effect transistors.

BACKGROUND

Junction Field Effect Transistors (JFETs) are voltage-controlled semiconductor devices configured to control an electric current between a source electrode and a drain electrode by a gate voltage. Specifically, a JFET is a device that has a channel region between the source electrode and the drain electrode and in contact with a gate electrode, and that is configured to alter the thickness of a depletion layer in a pn junction formed by a gate semiconductor layer and a channel semiconductor layer, by a voltage applied to the gate electrode, thereby controlling a drain current flowing in the channel region.

Semiconductor devices using silicon as a semiconductor material prevail nowadays. In the case of silicon-based power semiconductor devices, device types to be used differ depending upon breakdown voltages of the devices: MOSFETs (metal/oxide/semiconductor field effect transistors) are the mainstream in low voltage systems where the device breakdown voltage is not more than 200 V; IGBTs (insulated gate bipolar transistors), thyristors, or the like are the mainstream in high voltage systems where the device breakdown voltage is higher than 200 V.

As for the JFETs, static induction transistors (SITs), a type of JFETs, have been developed and manufactured as power semiconductors. The SITs have the device structure similar to the JFETs; precisely, the static characteristics of the JFETs are the pentode characteristics with saturation, whereas the static characteristics of the SITs are the triode characteristics characterized by unsaturation.

DISCLOSURE OF THE INVENTION

In recent years, wide-gap semiconductor materials such as silicon carbide (SiC) and gallium nitride (GaN) are drawing attention as semiconductor materials capable of implementing excellent power semiconductor devices capable of high-frequency operation with higher breakdown voltage, lower loss, and higher output than silicon. Particularly, as to the higher breakdown voltage and lower loss, the loss two or more digits lower than that by silicon can be expected at the breakdown voltage of 1 kV. Among the currently existing MOS structure devices, however, no device has been implemented with expected low loss because the surface mobility is low immediately below the oxide film.

As a power device type, the MOS structure has the advantage of voltage drive and normally-off type. Inventors then focused attention on the JFETs with characteristics characterized by mobility inside crystals, which have not been developed very much with silicon, and studied high-breakdown-voltage low-loss devices. In addition, it is feasible to implement a JFET of the normally-off type device. Inventors judged that the structure of letting the electric current flow in the direction from the front surface to the back surface of the substrate was the preferred structure for power devices, and studied vertical JFETs.

An object of the present invention is therefore to provide vertical junction field effect transistors capable of achieving low loss while maintaining high drain blocking voltage, and to provide methods of producing the vertical junction field effect transistors.

First, Inventors have conducted studies for realizing low loss in the vertical JFET structure and accomplished the invention as described below.

A vertical junction field effect transistor according to the present invention comprises a drain semiconductor portion, a drift semiconductor portion, a buried semiconductor portion, a channel semiconductor portion, a source semiconductor portion, and a gate semiconductor portion. The drift semiconductor portion is placed on a principal surface of the drain semiconductor portion and has first, second, third, and fourth regions extending in a predetermined axial direction intersecting with the principal surface. The buried semiconductor portion has a conductivity type opposite to a conductivity type of the drift semiconductor portion and is placed on the first, second, and third regions of the drift semiconductor portion. The channel semiconductor portion is placed along the buried semiconductor portion, has the conductivity type opposite to the conductivity type of the buried semiconductor portion, and is electrically connected to the fourth region of the drift semiconductor portion. The source semiconductor portion is placed on the channel semiconductor portion and the first region of the drift semiconductor portion. The gate semiconductor portion has a conductivity type opposite to a conductivity type of the drain semiconductor portion and is placed on the channel semiconductor portion and the third and fourth regions. The gate semiconductor portion has a plurality of projections extending in a direction from the third region toward the fourth region, the channel semiconductor portion is placed between the projections, and the projections are connected to the buried semiconductor portion.

In the vertical junction field effect transistor of this configuration, the buried semiconductor portion and the channel semiconductor portion can be arranged on the drift semiconductor portion. In this structure, the fundamental loss of the device is the sum of loss of the channel semiconductor portion and loss of the drift semiconductor portion. For this reason, if the breakdown voltage of the device were raised to a high voltage by the channel semiconductor portion only, the impurity concentration of the channel would be low and the channel length would be long, so as to increase the loss of the device. Therefore, the following advantages can be enjoyed by providing the channel semiconductor portion in charge of control of the drain current and the drift semiconductor portion in charge of the breakdown voltage of the device, as in the structure of the present invention. Firstly, the channel semiconductor portion permits increase of the impurity concentration and decrease of the channel length, so as to decrease the loss of the channel semiconductor portion. Secondly, the drift semiconductor portion can attain a desired drain blocking voltage by its impurity concentration and thickness, so that the loss can be minimized. Thirdly, the device loss in the limited area is reduced by the vertical stack of the drift semiconductor portion and the channel semiconductor portion.

Another vertical junction field effect transistor comprises a drain semiconductor portion, a drift semiconductor portion, a buried semiconductor portion, a channel semiconductor portion, a source semiconductor portion, and a plurality of gate semiconductor portions. The drift semiconductor portion is placed on a principal surface of the drain semiconductor portion and has first, second, third, and fourth regions extending in a predetermined axial direction intersecting with the principal surface. The buried semiconductor portion has a conductivity type opposite to a conductivity type of the drift semiconductor portion and is placed on the first, second, and third regions of the drift semiconductor portion. The channel semiconductor portion is placed along the buried semiconductor portion, has the conductivity type opposite to the conductivity type of the buried semiconductor portion, and is electrically connected to the fourth region of the drift semiconductor portion. The source semiconductor portion is placed on the channel semiconductor portion and the first region of the drift semiconductor portion. The plurality of gate semiconductor portions have a conductivity type opposite to a conductivity type of the drain semiconductor portion and are placed on the channel semiconductor portion and the third and fourth regions. Each of the plurality of gate semiconductor portions extends in a direction from the third region toward the fourth region, the channel semiconductor portion is placed between the gate semiconductor portions, and each gate semiconductor portion is connected to the buried semiconductor portion.

Since the transistor of this configuration has the channel semiconductor portion between the plurality of gate semiconductor portions, the channel semiconductor portion is controlled from both sides. Therefore, the thickness of the channel can be increased and the loss can be reduced.

Another vertical junction field effect transistor comprises a drain semiconductor portion, a drift semiconductor portion, a buried semiconductor portion, a channel semiconductor portion, and a gate semiconductor portion. The drift semiconductor portion is placed on a principal surface of the drain semiconductor portion and has first, second, third, and fourth regions extending in a predetermined axial direction intersecting with the principal surface. The buried semiconductor portion is placed on a principal surface of the drift semiconductor portion and is placed on the first, second, and third regions extending in a predetermined axial direction intersecting with the principal surface. The channel semiconductor portion is placed along the buried semiconductor portion, has a conductivity type opposite to a conductivity type of the buried semiconductor portion, and is electrically connected to the fourth region of the drift semiconductor portion. The gate semiconductor portion has a conductivity type opposite to a conductivity type of the drift semiconductor portion and is placed on the channel semiconductor portion and the third and fourth regions. The gate semiconductor portion has a plurality of projections extending in a direction from the third region toward the fourth region, the channel semiconductor portion is placed between the projections, and the drift semiconductor portion is connected to the buried semiconductor portion. The drift semiconductor portion has a fifth region extending in the axial direction intersecting with the principal surface of the drain semiconductor portion, and the transistor further comprises a second semiconductor portion having a conductivity type opposite to a conductivity type of the drain semiconductor portion and placed above the fifth region. The second semiconductor portion extends from the buried semiconductor portion in the predetermined axial direction along a source semiconductor portion.

Since the transistor of this configuration has the channel semiconductor portion between the buried semiconductor portion and the gate semiconductor portion, the channel semiconductor portion is controlled from both sides. Therefore, the thickness of the channel can be increased and the loss can be reduced.

Any one of the foregoing vertical junction field effect transistors further comprises a first semiconductor portion. The first semiconductor portion is placed on the channel semiconductor portion and the first and second regions of the drift semiconductor portion and has the same conductivity type as the source semiconductor portion. A dopant concentration of the first semiconductor portion is preferably lower than a dopant concentration of the channel semiconductor portion.

In the transistor of this configuration, the first semiconductor portion is placed between the channel semiconductor portion and the source semiconductor portion. This structure can absorb tolerances of thickness of the channel semiconductor portion associated with etching. Therefore, individual differences can be reduced in electrical characteristics among vertical junction field effect transistors.

Another vertical junction field effect transistor comprises a drain semiconductor portion, a drift semiconductor portion, a buried semiconductor portion, a plurality of gate semiconductor portions, a channel semiconductor portion, a connection semiconductor portion, a first aggregate semiconductor portion, a second aggregate semiconductor portion, and a source semiconductor portion. The drift semiconductor portion is placed on a principal surface of the drain semiconductor portion and has first to fifth regions extending in a predetermined axial direction intersecting with a reference plane extending along the principal surface. The buried semiconductor portion has a conductivity type opposite to a conductivity type of the drift semiconductor portion and is placed along the reference plane on the first to fourth regions of the drift semiconductor portion. The plurality of gate semiconductor portions are placed along the reference plane on the second to fourth regions of the drift semiconductor portion and have the same conductivity type as the conductivity type of the buried semiconductor portion. The channel semiconductor portion is placed between the buried semiconductor portion and the plurality of gate semiconductor portions, and between the plurality of gate semiconductor portions, and has the conductivity type opposite to the conductivity type of the buried semiconductor portion. The connection semiconductor portion has the same conductivity type as the conductivity type of the buried semiconductor portion and the channel semiconductor portion, extends in the predetermined axial direction, and connects the buried semiconductor portion and the plurality of gate semiconductor portions. The first aggregate semiconductor portion connects the channel semiconductor portion on the first region of the drift semiconductor portion. The second aggregate semiconductor portion connects the channel semiconductor portion on the fifth region of the drift semiconductor portion. The source semiconductor portion is placed above the first region of the drift semiconductor portion and is connected to the first aggregate semiconductor portion.

In the vertical junction field effect transistor of this configuration, the channel region is placed between the buried semiconductor portion and the plurality of gate semiconductor portions. Accordingly, it is feasible to increase the channel region that can be controlled by the gate semiconductor portions. In addition, the buried semiconductor portion and the channel semiconductor portion can be arranged on the drift semiconductor portion. Therefore, a desired drain blocking voltage can be attained by the thickness of the drift semiconductor portion.

A further vertical junction field effect transistor comprises a drain semiconductor portion, a drift semiconductor portion, a buried semiconductor portion, a plurality of gate semiconductor portions, a channel semiconductor portion, a connection semiconductor portion, a first aggregate semiconductor portion, a second aggregate semiconductor portion, a source semiconductor portion, and a third connection semiconductor portion. The drift semiconductor portion is placed on a principal surface of the drain semiconductor portion and has first to fifth regions extending in a predetermined axial direction intersecting with a reference plane extending along the principal surface. The buried semiconductor portion has a conductivity type opposite to a conductivity type of the drift semiconductor portion and is placed along the reference plane on the first to fourth regions of the drift semiconductor portion. The plurality of gate semiconductor portions are placed along the reference plane on the second to fourth regions of the drift semiconductor portion and have the same conductivity type as the conductivity type of the buried semiconductor portion. The channel semiconductor portion is placed between the buried semiconductor portion and the plurality of gate semiconductor portions, and between the plurality of gate semiconductor portions, and has the conductivity type opposite to the conductivity type of the buried semiconductor portion. The connection semiconductor portion has the same conductivity type as the conductivity type of the channel semiconductor portion and connects the plurality of gate semiconductor portions. The first aggregate semiconductor portion connects the channel semiconductor portion on the first region of the drift semiconductor portion. The second aggregate semiconductor portion connects the channel semiconductor portion on the fifth region of the drift semiconductor portion. The source semiconductor portion is placed above the first region of the drift semiconductor portion and is connected to the first aggregate semiconductor portion. The drift semiconductor portion has a sixth region provided on a principal surface thereof and extending in the direction intersecting with the principal surface. The third connection semiconductor portion has a conductivity type opposite to a conductivity type of the drain semiconductor portion and is placed above the sixth region. The third connection semiconductor portion is placed along the first aggregate semiconductor portion.

In this configuration, the plurality of gate semiconductor portions are electrically connected through the third connection semiconductor portion to the buried semiconductor portion. This permits the buried semiconductor portion and the plurality of gate semiconductor portions both to be used as a gate. Therefore, it increases the thickness of the channel that can be controlled.

In the vertical junction field effect transistors, preferably, a thickness of the gate semiconductor portion and the channel semiconductor portion is smaller than a space between the source semiconductor portion and the buried semiconductor portion on the first region of the drift semiconductor portion.

In the vertical junction field effect transistors, preferably, a thickness of the gate semiconductor portions and the channel semiconductor portion on the second to fourth regions of the drift semiconductor portion is smaller than a space between the source semiconductor portion and the buried semiconductor portion on the first region of the drift semiconductor portion.

In these transistors, the buried semiconductor portion can be separated from the source semiconductor portion. This improves the breakdown voltage between the gate and the source. Since the distance between the channel semiconductor portion and the source semiconductor portion is taken in the vertical direction, the chip size of the transistor will not increase even if the distance is large.

In the vertical junction field effect transistors, preferably, a space between the projections of the gate semiconductor portion is determined so that the vertical junction field effect transistor can exhibit the normally-off characteristic.

In the vertical junction field effect transistor, preferably, a space between the projections of the gate semiconductor portion and a space between the projections of the gate semiconductor portion and the buried semiconductor portion are determined so that the vertical junction field effect transistor can exhibit the normally-off characteristic.

In the vertical junction field effect transistors, preferably, a space between the gate semiconductor portions, and a space between the gate semiconductor portions and the buried semiconductor portion are determined so that the vertical junction field effect transistor can exhibit the normally-off characteristic.

In these vertical junction field effect transistors, the thickness of the channel semiconductor portion can be determined by etching. For this reason, it becomes easy to decrease the impurity concentration and thickness of the channel semiconductor portion so that the depletion layer caused by a diffusion potential between each gate semiconductor portion or the buried semiconductor portion and the channel semiconductor portion having the conductivity type opposite to that of the semiconductor portion spreads over the entire area of the channel semiconductor portion. Therefore, it becomes feasible to deplete the channel semiconductor portion, even without application of a gate voltage, and to substantialize the transistor of the normally-off type.

In the vertical junction field effect transistor, the channel semiconductor portion has a structure in which low-concentration layers and high-concentration layers are alternately stacked. The thickness of each layer is of nm (nanometer: $10^{-9}$ m) order. In this structure, the quantum effect causes carriers to migrate from the high-concentration layers with majority carriers therein into the low-concentration layers with larger carrier mobility. This results in increasing the electric current flowing in the channel semiconductor portion and reducing the loss of the channel semiconductor portion.

The drift semiconductor portion of the vertical junction field effect transistor preferably has: an electroconductive semiconductor region extending along a reference plane intersecting with the principal surface of the drain semiconductor portion, having the same conductivity type as the conductivity type of the drain semiconductor portion, and electrically connected to the channel semiconductor portion; and a non-electroconductive semiconductor region placed next to the electroconductive semiconductor region, having the conductivity type opposite to the conductivity type of the drain semiconductor portion, and electrically connected to the buried semiconductor portion. The electroconductive semiconductor region and the non-electroconductive semiconductor region are preferably formed in the same direction as a direction in which the first to fourth regions of the drift semiconductor portion are arranged, or in a direction intersecting therewith.

In the vertical junction field effect transistor of this configuration, the loss of the drift semiconductor portion can be reduced. Namely, when a voltage is applied so as to let the drain current flow in the gate semiconductor portion, the drain current controlled in the channel semiconductor portion flows via the electroconductive semiconductor region of the drift semiconductor portion to the drain semiconductor portion. On the other hand, when a voltage is applied so as not to let the drain current flow in the gate semiconductor portion, a state equivalent to a kind of dielectric is established because the impurity concentration and the thickness of each semiconductor region are determined so as to deplete both the electroconductive semiconductor region and the non-electroconductive semiconductor region of the drift semiconductor portion. In such a state the drift semiconductor portion has a constant electric field intensity, and thus the thickness of the drift semiconductor portion can be half of that in the case where the drift semiconductor portion is not provided with the electroconductive semiconductor region and the non-electroconductive semiconductor region. Therefore, for achieving a desired drain blocking voltage, the impurity concentration of the electroconductive semiconductor region can be increased and the thickness of the drift semiconductor portion can be decreased to half. This results in decreasing the loss of the drift semiconductor portion.

In the vertical junction field effect transistors as described above, each of the semiconductor portions such as the drain semiconductor portion, the drift semiconductor portion, the buried semiconductor portion, the gate semiconductor portion, the channel semiconductor portion, the connection semiconductor portion, and the source semiconductor portion is preferably made of SiC, GaN, or the like which is a wide-gap semiconductor material. A wide-gap semiconductor has excellent characteristics as a power device semiconductor material, such as a larger bandgap and greater maximum breakdown field than silicon. Accordingly, lower loss can be realized, particularly, in comparison with silicon.

A production method of a vertical junction field effect transistor comprises a step of forming a first semiconductor layer of a first conductivity type on a substrate of the first conductivity type, wherein a principal surface of the first semiconductor layer has first to fourth regions arranged in order in a predetermined axial direction; a step of introducing a dopant of a second conductivity type into the first to third regions of the principal surface of the first semiconductor layer to form a buried semiconductor portion; a step of forming a second semiconductor layer of the first conductivity type on the first semiconductor layer; a step of forming a source semiconductor layer of the first conductivity type on the second semiconductor layer; a step of etching the source semiconductor layer above at least one of the second, third, and fourth regions of the principal surface of the first semiconductor layer, up to the first semiconductor layer to expose a predetermined region of the second semiconductor layer, wherein the predetermined region has a plurality of first portions extending in the predetermined axial direction, and a second portion defined so as to embrace the plurality of portions; and a step of introducing a dopant of the second conductivity type for a gate semiconductor portion into the plurality of first portions to form a first semiconductor portion of the second conductivity type.

Preferably, the production method of the vertical junction field effect transistor further comprises a step of introducing a dopant of the second conductivity type for the gate semiconductor portion into the second portion to form a second semiconductor portion of the second conductivity type, and a depth of the second semiconductor portion is smaller than a depth of the first semiconductor portion.

In the production method of the vertical junction field effect transistor, preferably, the first semiconductor portion is formed so as to be connected to the buried semiconductor portion.

Another production method of a vertical junction field effect transistor comprises a first semiconductor layer forming step of forming a first semiconductor layer of a first conductivity type on a substrate of the first conductivity type, wherein a principal surface of the first semiconductor layer has first to fourth regions arranged in order in a predetermined axial direction; a buried semiconductor portion forming step of introducing a dopant of a second conductivity type into the first to third regions of the principal surface of the first semiconductor layer to form a buried semiconductor portion; a second semiconductor layer forming step of forming a second semiconductor layer of the first conductivity type on the first semiconductor layer; a second semiconductor region step of introducing a dopant of the second conductivity type for a gate semiconductor portion into the second semiconductor layer on the second and third regions of the principal surface of the first semiconductor layer up to a predetermined depth to form a second semiconductor region of the second conductivity type; a channel semiconductor portion forming step of repeating the second semiconductor layer forming step and the second semiconductor region step before obtaining a desired number of said second semiconductor layers, to form a stack of gate semiconductor portions and channel semiconductor portions; and a source semiconductor portion forming step of forming a source semiconductor portion on the channel semiconductor portion.

In the production method of the vertical junction field effect transistor, preferably, the second semiconductor layer forming step comprises forming the second semiconductor layer of the first conductivity type in a predetermined thickness on the first semiconductor layer, and the channel semiconductor portion forming step comprises introducing the dopant of the second conductivity type so as to achieve a maximum concentration in a predetermined depth in the second semiconductor layer, thereby forming the stack of gate semiconductor portions and channel semiconductor portions.

In the production method of the vertical junction field effect transistor, preferably, the channel semiconductor portion forming step comprises alternately introducing a first dopant and a second dopant so as to achieve a maximum concentration in a predetermined depth in the second semiconductor layer, thereby forming the stack of gate semiconductor portions and channel semiconductor portions.

In the production method of the vertical junction field effect transistor, preferably, the channel semiconductor portion forming step comprises a connection region forming step of forming a second semiconductor connection region of the second conductivity type so as to connect interiors of the second semiconductor layers to each other.

In the production method of the vertical junction field effect transistor, preferably, the step of forming the first semiconductor layer comprises forming the first semiconductor layer so as to form an electroconductive semiconductor layer of the same conductivity type as the substrate of the first conductivity type, form a non-electroconductive semiconductor layer of the conductivity type opposite to that of the electroconductive semiconductor layer, on the electroconductive semiconductor layer, and electrically connect the electroconductive semiconductor layer to the channel semiconductor portion.

In the production method of the vertical junction field effect transistor, preferably, the step of forming the first semiconductor layer comprises forming the first semiconductor layer so as to form a non-electroconductive semiconductor layer of the conductivity type opposite to the substrate of the first conductivity type, form an electroconductive semiconductor layer of the conductivity type opposite to that of the non-electroconductive semiconductor layer, on the non-electroconductive semiconductor layer, and electrically connect the electroconductive semiconductor layer to the channel semiconductor portion.

In the production method of the vertical junction field effect transistor, preferably, the step of forming the first semiconductor layer comprises forming the electroconductive semiconductor layer and the non-electroconductive semiconductor layer in a direction intersecting with the principal surface of the substrate, thereby forming the first semiconductor layer.

Preferably, the vertical junction field effect transistor further comprises a source electrode electrically connected to the source semiconductor portion and the second semiconductor portion, and the buried semiconductor portion is electrically connected through the second semiconductor portion to the source electrode.

In the vertical junction field effect transistor of this type, the buried semiconductor portion and the source semiconductor portion are electrically connected to the same source electrode by connecting the second semiconductor portion to the source electrode. This turns the gate-drain capacitance component into the gate-source capacitance component, enabling high-frequency operation.

A vertical junction field effect transistor according to the present invention comprises a drain semiconductor portion, a drift semiconductor portion, a buried semiconductor portion, a channel semiconductor portion, a source semiconductor portion, a first gate semiconductor portion, a first gate electrode, and a source electrode. The drift semiconductor portion is placed on a principal surface of the drain semiconductor portion and has first, second, third, and fourth regions extending in a direction intersecting with the principal surface. The buried semiconductor portion has a conductivity type opposite to a conductivity type of the drift semiconductor portion and is placed on the first, second, and fourth regions of the drift semiconductor portion. The channel semiconductor portion is placed along the buried semiconductor portion on the first and second regions, has a conductivity type different from the conductivity type of the buried semiconductor portion, and is electrically connected to the third region of the drift semiconductor portion. The source semiconductor portion is placed on the channel semiconductor portion and the first region of the drift semiconductor portion. The first gate semiconductor portion has the same conductivity type as the buried semiconductor portion, is electrically connected to the buried semiconductor portion, and is placed above the fourth region of the drift semiconductor portion. The first gate electrode is electrically connected to the first gate semiconductor portion above the fourth region of the drift semiconductor portion. The source electrode is electrically connected to the source semiconductor portion above the first region of the drift semiconductor portion, is electrically insulated from the first gate electrode above the first gate electrode, and is placed above the first, second, third, and fourth regions of the drift semiconductor portion.

In the vertical junction field effect transistor of this configuration, the buried semiconductor portion and the channel semiconductor portion, and the first gate electrode and source electrode can be arranged on the drift semiconductor portion. In this structure, the fundamental loss of the device is the sum of the loss of the channel semiconductor portion and the loss of the drift semiconductor portion. For this reason, if the breakdown voltage of the device were increased to a high voltage by the channel semiconductor portion only, the impurity concentration of the channel would be reduced and the channel length would be increased, so as to increase the loss of the device. Therefore, the following advantages can be enjoyed by providing the channel semiconductor portion in charge of control of the drain current and the drift semiconductor portion in charge of the breakdown voltage of the device, as in the structure of the present invention. Firstly, the channel semiconductor portion permits increase of the impurity concentration and decrease of the channel length, so as to decrease the loss of the channel semiconductor portion. Secondly, the drift semiconductor portion can attain a desired drain blocking voltage by its impurity concentration and thickness, so that the loss can be minimized. Thirdly, the device loss in the limited area is reduced by the vertical stack of the drift semiconductor portion and the channel semiconductor portion.

Preferably, the vertical junction field effect transistor further comprises a second gate semiconductor portion. The second gate semiconductor portion has a conductivity type opposite to a conductivity type of the drain semiconductor portion and is placed above the second region or above the second and third regions of the drift semiconductor portion. The channel semiconductor portion is placed between the first gate semiconductor portion and the second gate semiconductor portion. A second gate electrode electrically connected to the second gate semiconductor portion and electrically isolated under the source electrode is placed above the second region or above the second and third regions of the drift semiconductor portion.

Since the transistor of this configuration has the channel semiconductor portion between the first gate buried semiconductor portion and the second gate semiconductor portion, the channel semiconductor portion is controlled from both sides. Therefore, the thickness of the channel can be increased and the loss can be reduced.

In the vertical junction field effect transistor, the first gate semiconductor portion and the source semiconductor portion are electrically connected by the source electrode, whereby only the second gate semiconductor portion serves as a gate electrode. Feedback capacitance (gate-drain capacitance) ÷mutual conductance is often used as an index indicating the operating frequency of the transistor. Since the connection of the first gate semiconductor portion to the source electrode eliminates the capacitance component due to the drain semiconductor portion and the buried semiconductor portion from the feedback capacitance, the transistor can operate in a higher frequency region.

The vertical junction field effect transistor comprises connection semiconductor portions. The connection semiconductor portions have the same conductivity type as the buried semiconductor portion, penetrate the channel semiconductor portion so as to electrically connect the second gate semiconductor portion and the buried semiconductor portion, and are scattered above the second region of the drift semiconductor portion. This structure obviates the need for the fourth region of the drift semiconductor portion and the first gate semiconductor portion, whereby the device area can be reduced with the same loss.

The vertical junction field effect transistor further comprises a first semiconductor portion. The first semiconductor portion is placed on the channel semiconductor portion and the first region of the drift semiconductor portion and has the same conductivity type as a conductivity type of the source semiconductor portion. An impurity concentration of the first semiconductor portion is preferably lower than an impurity concentration of the channel semiconductor portion.

In the transistor of this configuration, the first semiconductor portion is placed between the channel semiconductor portion and the source semiconductor portion. This structure can absorb tolerances of thickness of the channel semiconductor portion associated with etching. Therefore, individual differences can be reduced in electrical characteristics among vertical junction field effect transistors.

In the vertical junction field effect transistor, at least one of the first and second gate electrodes is provided as a gate electrode in a peripheral portion of a primitive cell (block) or chip comprised of a plurality of transistors. In the transistor of this configuration, the first gate semiconductor portion and the source semiconductor portion are preferably electrically connected by the source electrode. The vertical junction field effect transistor of this type permits simultaneous formation of the gate electrode and the source electrode, so that the production steps can be simplified.

The vertical junction field effect transistor may be configured so that a heterojunction semiconductor material is provided as a second gate electrode to comprise a heterojunction of the second gate semiconductor portion and the channel semiconductor portion. The transistor of this structure obviates the need for the step of forming the second gate semiconductor portion, thus simplifying the production steps.

In the vertical junction field effect transistor, preferably, a thickness of the channel semiconductor portion placed above the second region of the drift semiconductor portion is smaller than a space between the source semiconductor portion and the buried semiconductor portion placed on the first region of the drift semiconductor portion. In the transistor of this configuration, the buried semiconductor portion and the second gate semiconductor portion can be separated from the source semiconductor portion. This improves the breakdown voltage between the gate and the source. Since the distance between the channel semiconductor portion and the source semiconductor portion is taken in the vertical direction, the chip size of the transistor will not increase even if this distance is large.

In the vertical junction field effect transistor, preferably, the thickness of the channel semiconductor portion on the buried semiconductor portion, or the thickness of the channel semiconductor portion of the same conductivity type as the conductivity type of the drain semiconductor portion, which is located between the buried semiconductor portion and the second gate semiconductor portion, is determined so that the vertical junction field effect transistor can exhibit the normally-off characteristic.

In the vertical junction field effect transistor of this configuration, the thickness of the channel semiconductor portion can be determined by etching. For this reason, it becomes easy to decrease the impurity concentration and thickness of the channel semiconductor portion so that the depletion layer caused by a built-in potential between each gate semiconductor portion or the buried semiconductor portion and the channel semiconductor portion having the conductivity type opposite to that of the semiconductor portion spreads over the entire area of the channel semiconductor portion. Therefore, it becomes feasible to deplete the channel semiconductor portion, even without application of a gate voltage, and to substantialize the transistor of the normally-off type.

In the vertical junction field effect transistor, the channel semiconductor portion has a structure in which low-concentration layers and high-concentration layers are alternately stacked. The thickness of each layer is of nm (nanometer: $10^{-9}$ m) order. In this structure, the quantum effect causes carriers to migrate from the high-concentration layers with majority carriers therein into the low-concentration layers with larger carrier mobility. This results in increasing the electric current flowing in the channel semiconductor portion and reducing the loss of the channel semiconductor portion.

Preferably, the drift semiconductor portion of the vertical junction field effect transistor has an electroconductive semiconductor region extending along a reference plane intersecting with the principal surface of the drain semiconductor portion, having the same conductivity type as the drain semiconductor portion, and electrically connected from the third region of the drift semiconductor portion to the channel semiconductor portion; and a non-electroconductive semiconductor region placed next to the electroconductive semiconductor region, having the conductivity type opposite to the conductivity type of the drain semiconductor portion, and electrically connected to the buried semiconductor portion. Preferably, the electroconductive semiconductor region and the non-electroconductive semiconductor region are formed in the same direction as a direction in which the first to fourth regions of the drift semiconductor portion are arranged, or in a direction intersecting therewith.

In the vertical junction field effect transistor of this configuration, the loss of the drift semiconductor portion can be reduced. Namely, when a voltage is applied so as to let the drain current flow in the gate semiconductor portion, the drain current controlled in the channel semiconductor portion flows via the electroconductive semiconductor region of the drift semiconductor portion to the drain semiconductor portion. On the other hand, when a voltage is applied so as not to let the drain current flow in the gate semiconductor portion, a state equivalent to a kind of dielectric is established because the impurity concentration and the thickness of each semiconductor region are determined so as to deplete both the electroconductive semiconductor region and the non-electroconductive semiconductor region of the drift semiconductor portion. In such a state the drift semiconductor portion has a constant electric field intensity, and thus the thickness of the drift semiconductor portion can be half of that in the case where the drift semiconductor portion is not provided with the electroconductive semiconductor region and the non-electroconductive semiconductor region. Therefore, for achieving a desired drain breakdown voltage, the impurity concentration of the electroconductive semiconductor region can be increased and the thickness of the drift semiconductor portion can be decreased to half. This results in decreasing the loss of the drift semiconductor portion.

In the vertical junction field effect transistor of this type, each of the semiconductor portions such as the drain semiconductor portion, the drift semiconductor portion, the first gate semiconductor portion, and the channel semiconductor portion is preferably made of SiC, GaN, or the like which is a wide-gap semiconductor material. A wide gap semiconductor has excellent characteristics as a power device semiconductor material, such as a larger bandgap and greater maximum breakdown field than silicon. Accordingly, lower loss can be realized, particularly, in comparison with silicon.

A production method of a vertical junction field effect transistor comprises a step of forming a drift semiconductor layer having first, second, third, and fourth regions, on a substrate of a first conductivity type; a step of introducing an impurity of a conductivity type opposite to a conductivity type of the drift semiconductor layer, into the first, second, and fourth regions of the drift semiconductor layer to form a buried semiconductor portion; a step of forming a channel semiconductor portion having a conductivity type different from the conductivity type of the buried semiconductor portion, on the buried semiconductor portion and the drift semiconductor layer; a step of forming a source semiconductor portion above the first region of the drift semiconductor layer; a step of introducing an impurity of the same conductivity type as the conductivity type of the buried semiconductor portion, into a portion above the fourth region of the drift semiconductor layer to form a first gate semiconductor portion; a step of forming a first gate electrode electrically connected to the first gate semiconductor portion; a step of forming an interlayer film electrically isolated from the first gate electrode; and a step of forming a source electrode electrically connected to the source semiconductor portion, on the interlayer film.

Preferably, the production method of the vertical junction field effect transistor further comprises a step of introducing an impurity of the same conductivity type as the conductivity type of the first gate semiconductor portion, into the second region or into the second and third regions of the drift semiconductor layer, prior to the step of forming the first gate semiconductor portion, to form a second gate semiconductor portion, and a second gate electrode electrically connected to the second gate semiconductor portion is formed in the step of forming the first gate electrode.

Another production method of a vertical junction field effect transistor preferably comprises a step of forming a drift semiconductor layer having first, second, third, and fourth regions, on a substrate of a first conductivity type; a step of introducing an impurity of a conductivity type opposite to a conductivity type of the drift semiconductor layer, into the first, second, and fourth regions of the drift semiconductor layer to form a buried semiconductor portion; a step of forming a channel semiconductor portion having a conductivity type different from the conductivity type of the buried semiconductor portion, on the buried semiconductor portion and the drift semiconductor layer; a step of forming a source semiconductor portion above the first region of the drift semiconductor layer; a step of introducing an impurity of the same conductivity type as the conductivity type of the buried semiconductor portion, into the second region or into the second and third regions of the drift semiconductor layer to form a second gate semiconductor portion; a step of introducing an impurity of the same conductivity type as the conductivity type of the buried semiconductor portion, into a portion above the fourth region of the drift semiconductor layer to form a first gate semiconductor portion; a step of forming a second gate electrode electrically connected to the second gate semiconductor portion; and a step of forming a source electrode for simultaneously electrically connecting the first gate semiconductor portion and the source semiconductor portion.

Another production method of a vertical junction field effect transistor preferably comprises a step of forming a drift semiconductor layer having first, second, third, and fourth regions, on a substrate of a first conductivity type; a step of introducing an impurity of a conductivity type opposite to a conductivity type of the drift semiconductor layer, into the first, second, and fourth regions of the drift semiconductor layer to form a buried semiconductor portion; a step of forming a channel semiconductor portion having a conductivity type different from the conductivity type of the buried semiconductor portion, on the buried semiconductor portion and the drift semiconductor layer; a step of forming a source semiconductor portion above the first region of the drift semiconductor layer; a step of introducing an impurity having the same conductivity type as the conductivity type of the buried semiconductor portion, into the second region or into the second and third regions of the drift semiconductor layer to form a second gate semiconductor portion; a step of introducing an impurity of the same conductivity type as the conductivity type of the buried semiconductor portion, into a portion above the second region of the drift semiconductor layer to form a connection semiconductor portion connecting the second gate semiconductor portion and the buried semiconductor portion; and a step of forming a second gate electrode electrically connected to the second gate semiconductor portion.

Preferably, the production method of the vertical junction field effect transistor further comprises a step of forming a first semiconductor portion having the same conductivity type as the source semiconductor portion, on the channel semiconductor portion, prior to the step of forming the source semiconductor portion, and an impurity concentration of the first semiconductor portion is lower than an impurity concentration of the channel semiconductor portion.

In the production method of the vertical junction field effect transistor, preferably, the step of forming the drift semiconductor layer comprises forming the drift semiconductor layer so as to form an electroconductive semiconductor layer of the same conductivity type as the drain semiconductor portion, form a non-electroconductive semiconductor layer of the conductivity type opposite to that of the electroconductive semiconductor layer, in the electroconductive semiconductor layer, and electrically connect the electroconductive semiconductor layer to the channel semiconductor portion.

In the production method of the vertical junction field effect transistor, preferably, the step of forming the drift semiconductor layer comprises forming the drift semiconductor layer so as to form a non-electroconductive semiconductor layer of the conductivity type opposite to that of the drift semiconductor portion, form an electroconductive semiconductor layer of the conductivity type opposite to that of the non-electroconductive semiconductor layer, in the non-electroconductive semiconductor layer, and electrically connect the electroconductive semiconductor layer to the channel semiconductor portion.

BRIEF DESCRIPTION OF THE DRAWINGS

FIG. 25 is a sectional view of a vertical JFET in the thirteenth embodiment.

BEST MODES FOR CARRYING OUT THE INVENTION

Figure 1A:
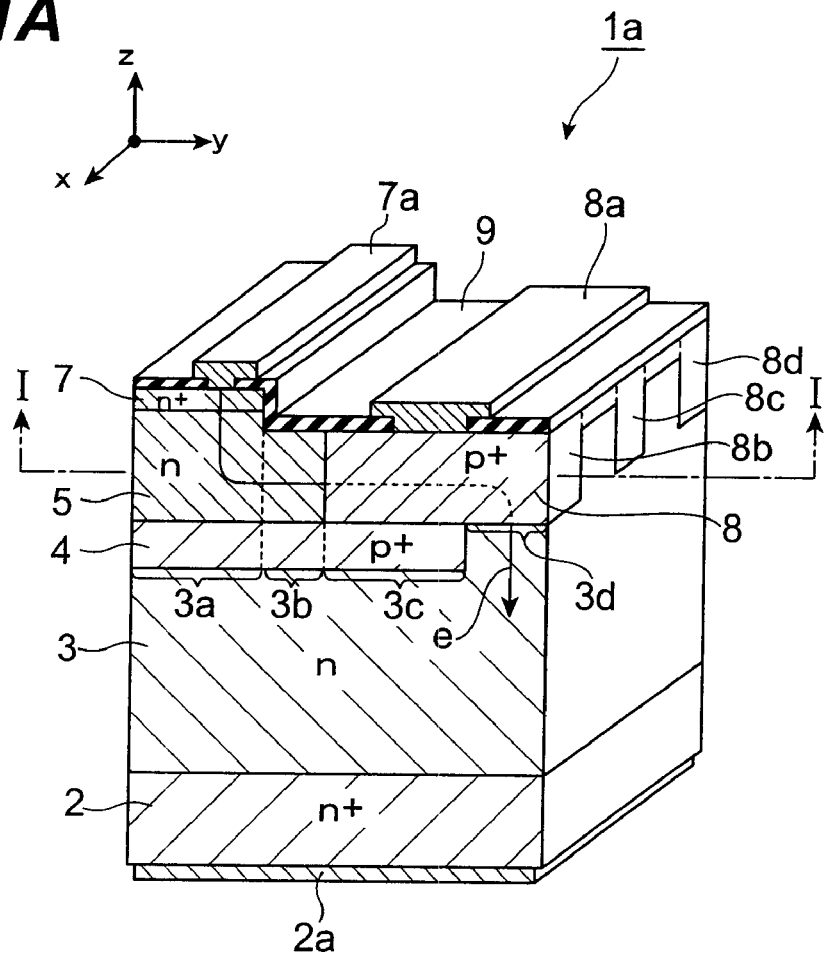
FIG. 1A is a perspective view of a vertical JFET in the first embodiment.

The preferred embodiments of vertical junction field effect transistors according to the present invention will be described below in detail with reference to the accompanying drawings. Identical or equivalent elements will be denoted by the same reference symbols throughout the description below, without redundant description. It is also noted that aspect ratios of transistors in the drawings do not always agree with those of actual transistors.

First Embodiment

FIG. 1A is a perspective view of a vertical JFET 1a in the first embodiment. As shown in FIG. 1A, the vertical JFET 1a has an n$^+$ type drain semiconductor portion 2, an n-type drift semiconductor portion 3, a p$^+$ type buried semiconductor portion 4, an n-type channel semiconductor portion 5, an n$^+$ type source semiconductor portion 7, and a p$^+$ type gate semiconductor portion 8.

The vertical JFET 1a has a vertical structure in which the majority carriers migrate in a direction from one surface to the other surface of this device (hereinafter referred to as a "current direction"). FIG. 1A shows a coordinate system. This coordinate system is defined so that the current direction of the channel portion of the JFET is aligned with the y-axis.

The n$^+$ type drain semiconductor portion 2 has a pair of surfaces opposed to each other. The n$^+$ type drain semiconductor portion 2 can be a substrate doped with a dopant and, in a preferred example, this substrate is made of SiC (silicon carbide). The dopant to be added to SiC can be one of donor impurities such as N (nitrogen), P (phosphorus), and As (arsenic) which are elements of Group 5 in the periodic table. The n$^+$ type drain semiconductor portion 2 has a drain electrode 2a on one (back surface) of a pair of surfaces. The drain electrode 2a is made of metal.

The n-type drift semiconductor portion 3 is placed on the other (front surface) of the pair of surfaces of the n$^+$ type drain semiconductor portion 2. The n-type drift semiconductor portion 3 has first to fourth regions 3a, 3b, 3c, and 3d arranged in order in the y-axis direction on its front surface. Each of the first to fourth regions 3a, 3b, 3c, and 3d extends in a predetermined axial direction (the x-axis direction in FIG. 1A) and, in a preferred example, each region is rectangular. The p$^+$ type buried semiconductor portion 4 is placed on the first, second, and third regions 3a, 3b, and 3c. The channel semiconductor portion 5 is placed on the fourth region 3d. The conductivity type of the drift semiconductor portion 3 is the same as that of the drain semiconductor portion 2, and the dopant concentration of the drift semiconductor portion 3 is lower than that of the drain semiconductor portion 2. In a preferred example, the drift semiconductor portion 3 is made of SiC (silicon carbide) doped with a dopant.

The p$^+$ type buried semiconductor portion 4 is placed on the first, second, and third regions 3a, 3b, and 3c. The conductivity type of the buried semiconductor portion 4 is opposite to that of the drift semiconductor portion 3. The p-type dopant concentration of the buried semiconductor portion 4 is higher than the n-type dopant concentration of the drift semiconductor portion 3. In a preferred example, the p$^+$ type buried semiconductor portion 4 is made of SiC (silicon carbide) doped with a dopant. This dopant can be one of acceptor impurities such as B (boron) and Al (aluminum) which are elements of Group 3 in the periodic table.

The n-type channel semiconductor portion 5 is placed on the p$^+$ type buried semiconductor portion 4 and the first to third regions 3a, 3b, 3c and on the fourth region 3d. The n-type channel semiconductor portion 5 extends in a predetermined axial direction (the y-axis direction in FIG. 1A) along the p$^+$ type buried semiconductor portion 4. The n-type channel semiconductor portion 5 is electrically connected to the n-type drift semiconductor portion 3 in the fourth region 3d. Since the conductivity type of the channel semiconductor portion 5 is opposite to that of the buried semiconductor portion 4, a pn junction is created at the interface between the buried semiconductor portion 4 and the channel semiconductor portion 5. The dopant concentration of the n-type channel semiconductor portion 5 is lower than that of the n$^+$ type drain semiconductor portion 2. In a preferred example, the n-type channel semiconductor portion 5 is made of SiC doped with a dopant.

The n$^+$ type source semiconductor portion 7 is placed on the n-type channel semiconductor portion 5 and the first region 3a. The source semiconductor portion 7 has the same conductivity type as the drain semiconductor portion 2. The source semiconductor portion 7 is connected through the channel semiconductor portion 5 to the drift semiconductor portion 3. A source electrode 7a is placed on the n$^+$ type source semiconductor portion 7. The source electrode 7a is made of metal. An insulating film 9 such as a silicon oxide film is placed on the n-type source semiconductor portion 7 and the n-type source semiconductor portion 7 is connected through an aperture of the insulating film 9 to the source electrode 7a.

Figure 1B:
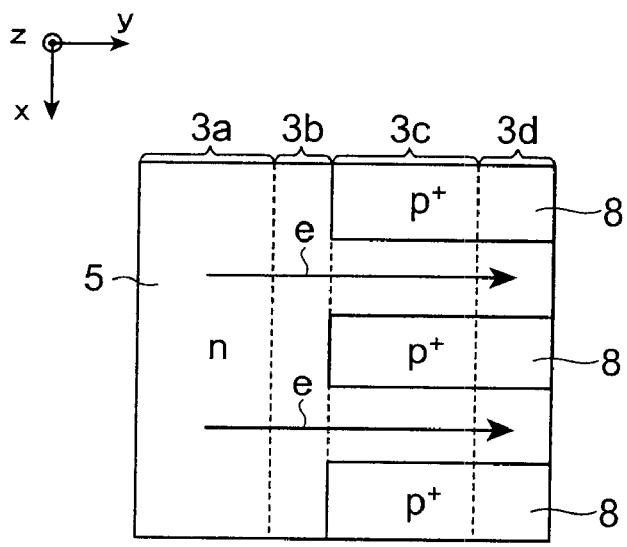
FIG. 1B is a sectional view along I-I line of the vertical JFET in the first embodiment.

The p$^+$ type gate semiconductor portion 8, as shown in FIG. 1B, is placed on the channel semiconductor portion 5 and the third and fourth regions 3c, 3d. The p$^+$ type gate semiconductor portion 8 has projections 8b, 8c, and 8d extending in the direction from the third region 3c toward the fourth region 3d (the y-axis direction in the drawing). The projections 8b, 8c, and 8d extend so as to reach the buried semiconductor portion 4. The projections 8b, 8c, 8d are electrically connected to the buried semiconductor portion 4 on the third region 3c. The n-type channel semiconductor portion 5 is placed between the projections 8b, 8c, 8d. Since the conductivity type of the gate semiconductor portion 8 is opposite to that of the channel semiconductor portion 5, a pn junction is created at the interface between the gate semiconductor portion 8 and the channel semiconductor portion 5. The drain current flowing in the n-type channel semiconductor portion 5 is controlled by the p$^+$ type buried semiconductor portion 4 and the p$^+$ type gate semiconductor portion 8. The p-type dopant concentration of the gate semiconductor portion 8 is higher than the n-type dopant concentration of the channel semiconductor portion 5. In a preferred example, the p$^+$ type gate semiconductor portion 8 is made of SiC doped with a dopant. In a preferred example, the channel length (in the y-axis direction in the drawing) is larger than ten times the channel thickness (in the z-axis direction in the drawing). A gate electrode 8a is placed on a front surface of the p+ type gate semiconductor portion 8. The gate electrode 8a is made of metal. The source electrode 7a is made of metal. The insulating film 9 such as a silicon oxide film is placed on the p+ type gate semiconductor portion 8 and the p+ type gate semiconductor portion 8 is connected through an aperture of the insulating film 9 to the gate electrode 8a. Arrows e indicate paths of electric current flowing from the source semiconductor portion 7 to the drain semiconductor portion 2.

Second Embodiment

Next, a production method of the vertical JFET 1a will be described. FIGS. 2A-2C, FIGS. 3A and 3B, FIGS. 4A and 4B, FIGS. 5A and 5B, FIGS. 6A and 6B, FIGS. 7A and 7B, and FIG. 8 are perspective views showing production steps of the vertical JFET 1a in the second embodiment.

Figure 2A:
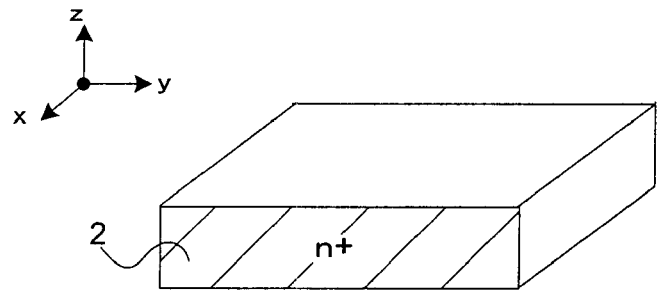
FIG. 2A is a perspective view in a drain semiconductor film forming step.

(Drain Semiconductor Film Forming Step) First, a substrate is prepared as shown in FIG. 2A. An example of the substrate is an n+ type SiC semiconductor substrate. The dopant concentration of the substrate is as high as this substrate can be used as the drain semiconductor portion 2.

Figure 2B:
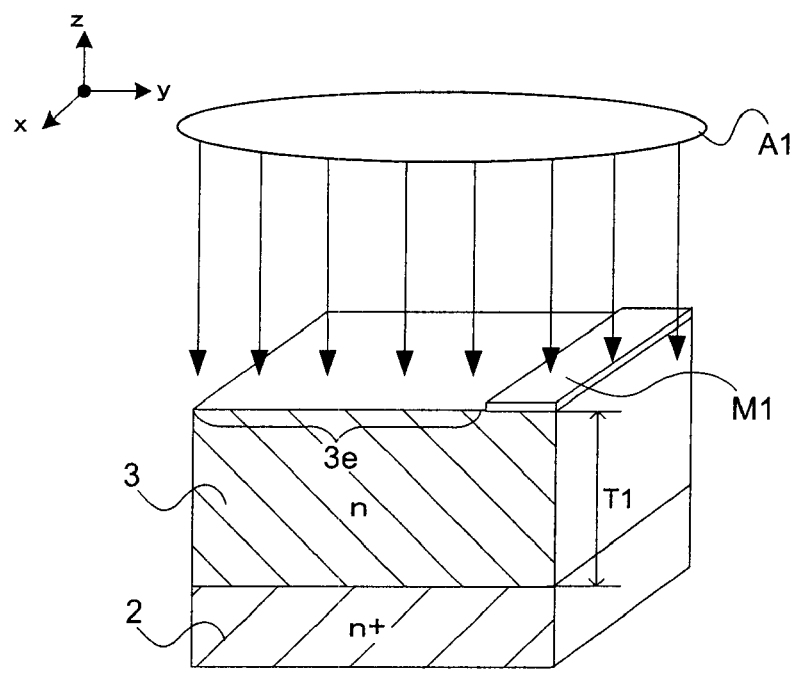
FIG. 2B is a perspective view in a drift semiconductor film forming step.

(Drift Semiconductor Film Forming Step) As shown in FIG. 2B, an SiC film 3 is grown on the front surface of the n+ type drain semiconductor portion 2 by epitaxial growth. The thickness T1 of the SiC film 3 is, for example, 10 µm. The conductivity type of the SiC film 3 is the same as that of the n+ type drain semiconductor portion 2. The dopant concentration of the SiC film 3 is lower than that of the n+ type drain semiconductor portion 2. The dopant concentration of the SiC film 3 is, for example, approximately $1\times10^{16}/cm^3$. The n-type drift semiconductor portion is formed from this SiC film 3.

Figure 2C:
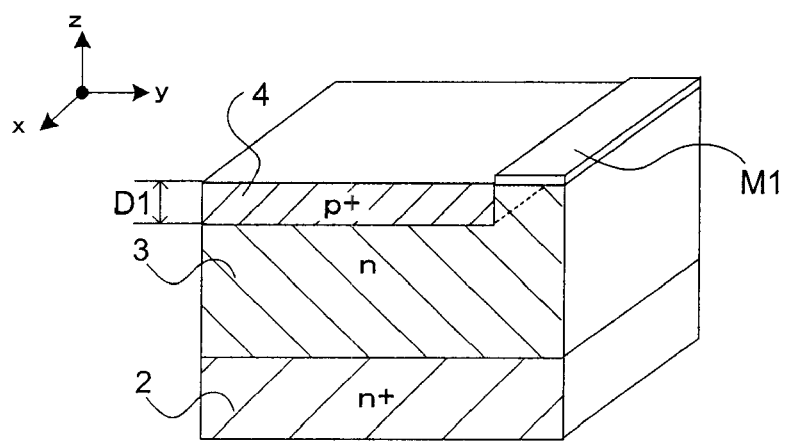
FIG. 2C is a perspective view in a buried semiconductor portion forming step.

(Buried Semiconductor Portion Forming Step) A step of forming a buried semiconductor portion will be described with reference to FIG. 2C. A mask M1 having a pattern extending in a predetermined axial direction (the x-axis direction in the drawing) is formed. Using this mask M1, an area 3e formed on the SiC film 3 is selectively ion-implanted with a dopant A1 to form the p+ type buried semiconductor portion 4 with a predetermined depth. The depth D1 of the p+ type buried semiconductor portion 4 is, for example, approximately 1.2 µm. The dopant concentration of the p+ type buried semiconductor portion 4 is, for example, approximately $1\times10^{18}/cm^3$. After the buried semiconductor portion is formed, the mask M1 is removed.

Figure 3A:
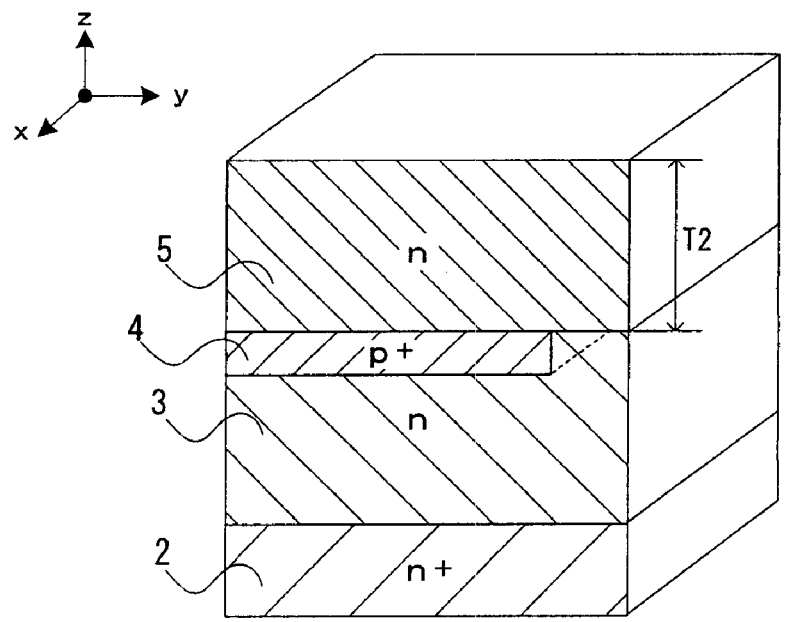
FIG. 3A is a perspective view in a channel semiconductor film forming step.

(Channel Semiconductor Film Forming Step) As shown in FIG. 3A, an SiC film 5 is grown on the front surface of the p+ type buried semiconductor portion 4 and on the SiC film 3 by epitaxial growth. The thickness T2 of the SiC film 5 is, for example, approximately 0.5 µm. The conductivity type of the SiC film 5 is the same as that of the drain semiconductor portion 2. The dopant concentration of the SiC film 5 is lower than that of the drain semiconductor portion 2. The dopant concentration of the SiC film 5 is, for example, approximately $1\times10^{17}/cm^3$. The n-type channel semiconductor portion is formed from this SiC film 5. Although in the present embodiment a single SiC film is formed for each of the n-type drift semiconductor portion and the n-type channel semiconductor portion, the production method may include a plurality of film-forming steps of repeatedly forming SiC films for each of the drift semiconductor portion and the channel semiconductor portion. A desired dopant concentration profile can be adopted for the SiC film so that the SiC film 3 can serve as the drift semiconductor portion and the channel semiconductor portion.

Figure 3B:
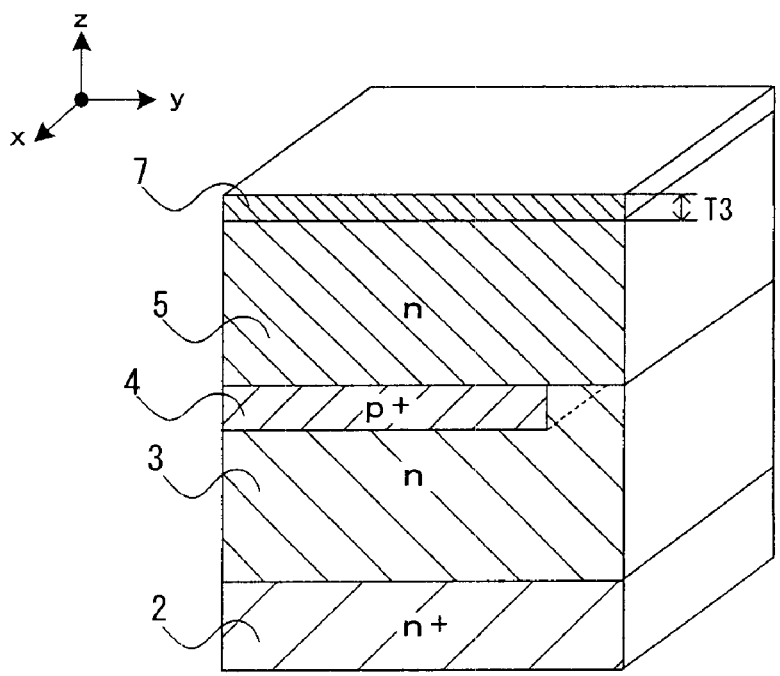
FIG. 3B is a perspective view in a source semiconductor film forming step.

(Source Semiconductor Film Forming Step) As shown in FIG. 3B, an SiC film 7 for the n+ type source semiconductor portion is grown on the front surface of the SiC film 5 by epitaxial growth. The thickness T3 of the SiC film 7 is, for example, approximately 0.2 µm. The conductivity type of the SiC film 7 is the same as that of the drain semiconductor portion 2. The dopant concentration of the SiC film 7 is higher than that of the SiC film 5.

Figure 4A:
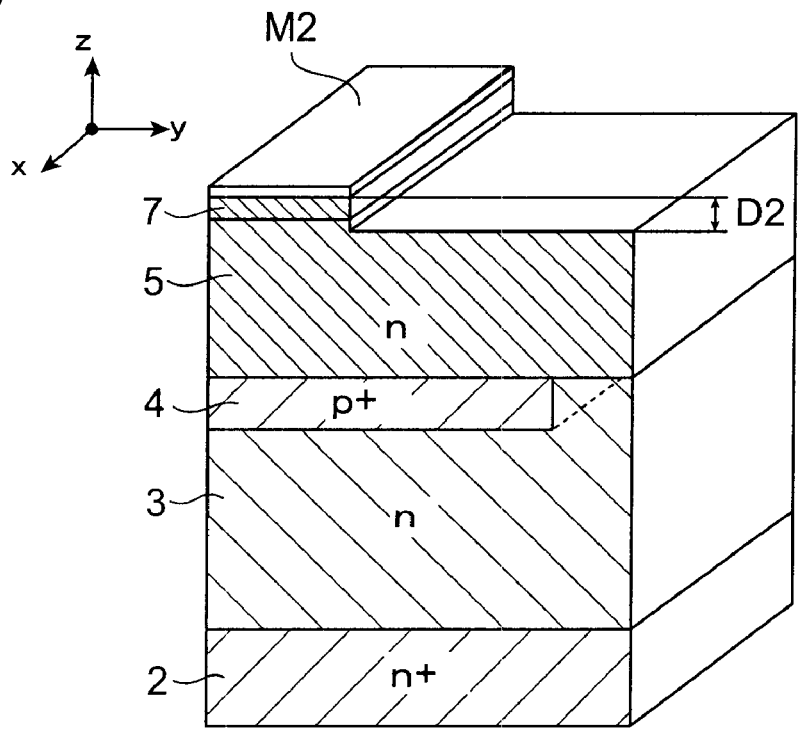
FIG. 4A is a perspective view in a source semiconductor portion forming step.

(Source Semiconductor Portion Forming Step) A step of forming a source semiconductor portion will be described with reference to FIG. 4A. A mask M2 having a pattern extending in a predetermined axial direction (the x-axis direction in the drawing) is formed. Using the mask M2, the n+ type source film 7 and the SiC film 5 are selectively etched. As a result, the part of the n+ type source layer 7 and SiC film 5 covered by the mask M2 remains unetched, to form a semiconductor portion for the n+ type source semiconductor portion. After this semiconductor portion is formed, the mask M2 is removed.

Figure 4B:
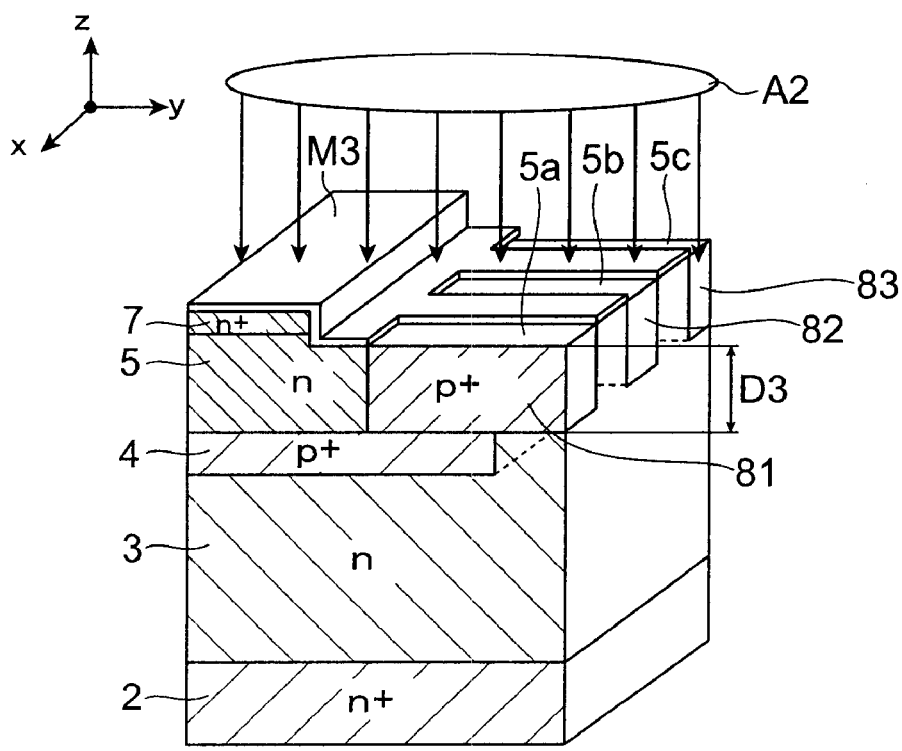
FIG. 4B is a perspective view in a $p^+$ type semiconductor region forming step.

(p+ Type Semiconductor Region Forming Step) A step of forming p+ type semiconductor regions will be described with reference to FIG. 4B. A mask M3 having a pattern of a predetermined shape is formed. Regions 5a, 5b, and 5c defined on the SiC film 5 by the mask M3 are selectively ion-implanted with a dopant A2 to form p+ type semiconductor regions 81, 82, and 83 with a predetermined depth. The dopant concentration of the p+ type semiconductor regions 81, 82, 83 is, for example, approximately $1\times10^{18}/cm^3$. After the p+ type semiconductor regions are formed, the mask M3 is removed.

Figure 5A:
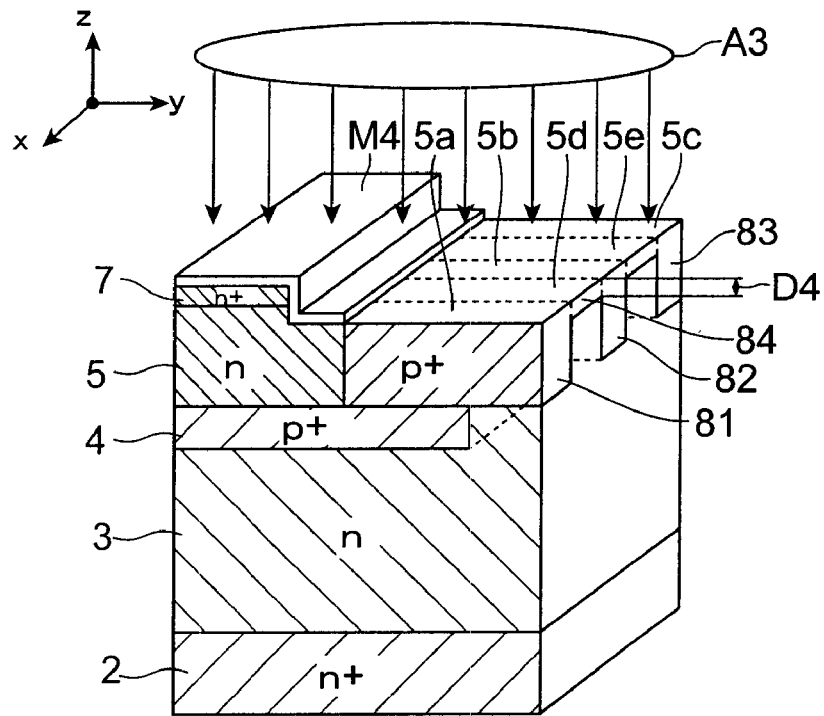
FIG. 5A is a perspective view in a $p^+$ type semiconductor portion forming step.

(p+ Type Semiconductor Portion Forming Step) A step of forming a p+ type semiconductor portion will be described with reference to FIG. 5A. A mask M4 having a pattern of a predetermined shape is formed. Regions defined on the SiC film 5 by the mask M4 (e.g., regions 5a-5e including the regions 5a-5c) are selectively ion-implanted with a dopant A3 to form p+ type semiconductor layers 84, 85 with a predetermined depth. The dopant concentration of the p+ type semiconductor layers 84, 85 is, for example, approximately $1\times10^{18}/cm^3$. The concentration in the vicinity of the front surface is approximately $1\times10^{19}$ to $1\times10^{20}/cm^3$. After the p+ type semiconductor layers are formed, the mask M4 is removed. The sequence of the p+ type semiconductor layer forming step and the p+ type semiconductor portion forming step is reversible.

Figure 5B:
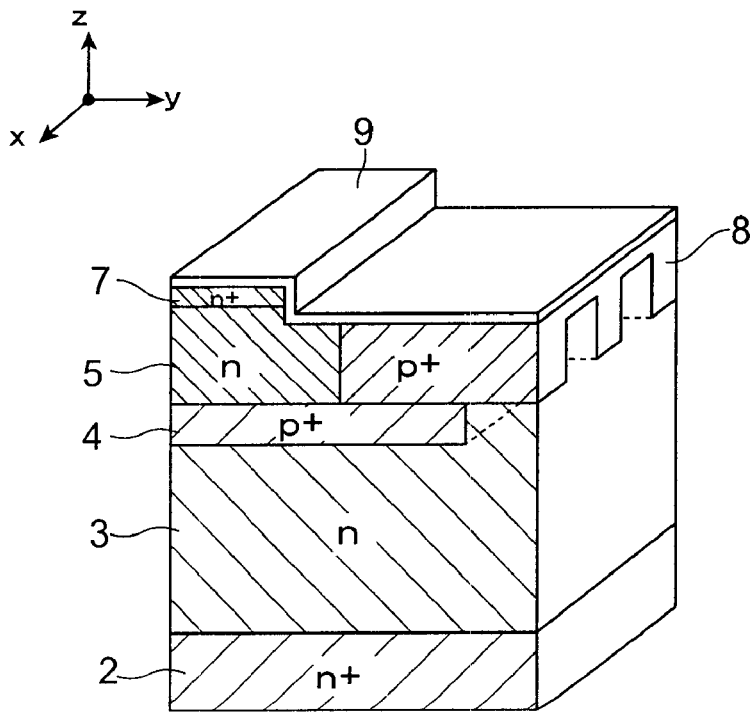
FIG. 5B is a perspective view in a thermal oxidation step.

(Thermal Oxidation Step) A step of thermally oxidizing the vertical JFET 1a will be described with reference to FIG. 5B. The vertical JFET 1a is subjected to a thermal oxidation treatment. The thermal oxidation treatment is a treatment of exposing SiC to an oxidizing atmosphere at a high temperature (e.g., about 1200° C.) to bring about chemical reaction of silicon in each semiconductor portion with oxygen to form a silicon oxide film ($SiO_2$). As a result, the front surface of each semiconductor portion is covered by an oxide film 9.

Figure 6A:
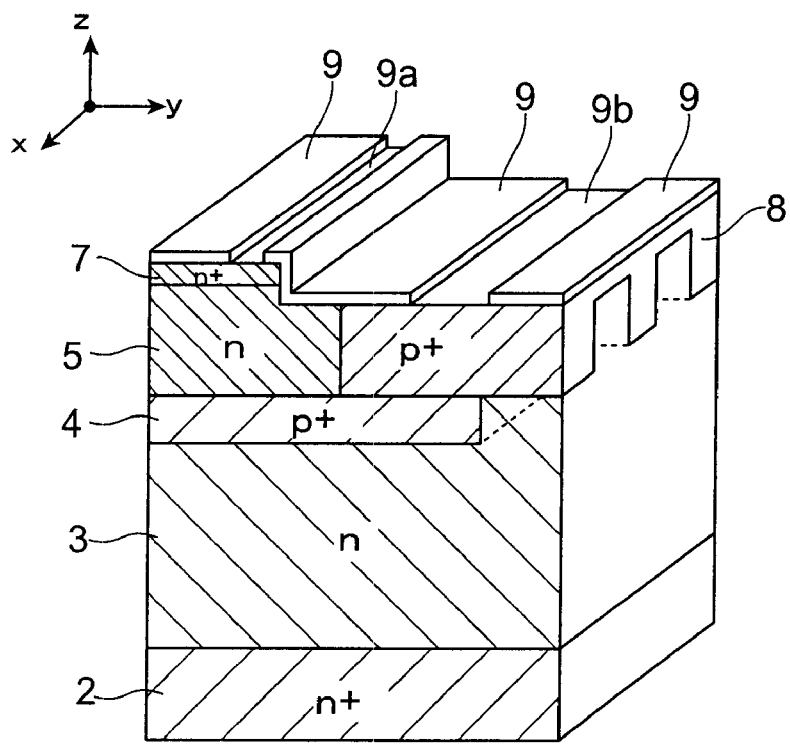
FIG. 6A is a perspective view in an aperture forming step.

(Aperture Forming Step) A step of forming apertures for formation of the source electrode and the gate electrode will be described with reference to FIG. 6A. The oxide film 9 is selectively etched using a mask of a photoresist, to form apertures 9a, 9b. Front surface portions of the source semiconductor portion 7 and the gate semiconductor portion 8 are exposed in the respective apertures 9a, 9b. These exposed parts serve as conducting portions one to the source electrode and the other to the gate electrode. After the apertures are formed, the resist mask is removed.

Figure 6B:
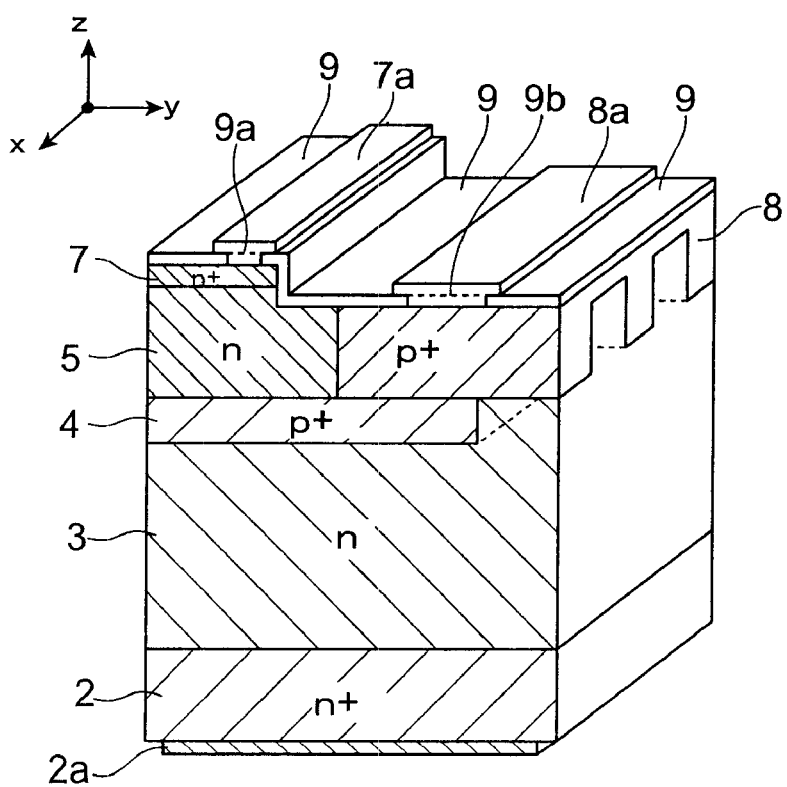
FIG. 6B is a perspective view in an electrode forming step.

(Electrode Forming Step) A step of forming electrodes will be described with reference to FIG. 6B. First, a metal film for ohmic contact electrodes, e.g., nickel (Ni) is deposited on the front surface of the vertical JFET 1a. Next, a mask of a photoresist is formed so as to leave Ni in the source-electrode aperture 9a and the gate-electrode aperture 9b only, the Ni metal film is etched, and the resist is removed. Subsequently, ohmic contacts are created by thermally treating the film in an inert gas atmosphere such as nitrogen or argon at a high temperature (e.g., about 1000° C. in the case of Ni). The material of the metal film for ohmic contact electrodes may be one of Ni, tungsten (W), and titanium (Ti), but the material is not limited to these.

Furthermore, a metal film for electrodes such as aluminum (Al) is deposited. A mask of a photoresist having a predetermined shape is formed. The metal film for electrodes is selectively etched using this mask. As a result, the parts of the metal film for electrodes covered by the resist pattern remain unetched, to obtain the source electrode 7a and gate electrode 8a. The material of the metal film for electrodes may be one of aluminum alloys, copper (Cu), and tungsten (W), but the material is not limited to these. After the electrodes are formed, the resist mask is removed.

The vertical JFET 1a described in the first embodiment is completed through the steps described above. In the structure of the vertical JFET 1a, the $p^+$ type buried semiconductor portion 4 and the $p^+$ type gate semiconductor portion 8 can be arranged on the n-type drift semiconductor portion 3. Therefore, a desired drain blocking voltage can be achieved by the thickness of the n-type drift semiconductor portion 3, without increasing the chip size. Accordingly, the breakdown voltage between the source and the drain can be improved. Carriers flow not only under the n-type channel semiconductor portion 5, but also in the n-type drift semiconductor portion 3 located below the $p^+$ type buried semiconductor portion 4. It is thus feasible to lower the on-state resistance while maintaining the breakdown voltage. Namely, this structure is suitable for high-breakdown-voltage JFETs.

In the vertical JFET 1a, the n-type channel semiconductor portion 5 is placed between the $p^+$ type buried semiconductor portion 4 and the $p^+$ type gate semiconductor portion 8 and the n-type channel semiconductor portion 5 is also placed between the projections of the $p^+$ type gate semiconductor portion 8. This structure increases the width of the controllable channel, as compared with a case where the channel is controlled from one side of the n-type channel semiconductor portion 5. Where the space A between the $p^+$ type buried semiconductor portion 4 and the $p^+$ type gate semiconductor portion 8 is wider than the space B between the projections of the $p^+$ type gate semiconductor portion 8, the threshold of the vertical JFET 1a is determined by the space B. Conversely, where the space A between the $p^+$ type buried semiconductor portion 4 and the $p^+$ type gate semiconductor portion 8 is narrower than the space B between the projections of the $p^+$ type gate semiconductor portion 8, the threshold of the vertical JFET 1a is determined by the space A.

In the present embodiment the semiconductor portions of the drain, source, and gate are made of SiC. SiC is superior in the following respects to such semiconductors as Si (silicon) and GaAs (gallium arsenide). Namely, since SiC has a high melting point and a large bandgap (forbidden band width), it facilitates operation at high temperatures of the device. Since SiC has a large breakdown electric field, it enables achievement of high breakdown voltage. Furthermore, it has the advantage of facilitating achievement of large electric current and low loss by virtue of its high thermal conductivity.

Third Embodiment

The present embodiment relates to a production method different from the second embodiment, in the $p^+$ type semiconductor layer forming step and the $p^+$ type semiconductor portion forming step of the vertical JFET 1a. Namely, the second embodiment involved the formation of the gate semiconductor portion 8 by ion implantation, whereas the present embodiment involves formation of the gate semiconductor portion 8 through the steps described below. The description and illustration will be omitted for the steps except for the $p^+$ type semiconductor layer forming step and the $p^+$ type semiconductor portion forming step. Constitutive portions similar to those in the second embodiment are denoted by the same reference symbols.

Figure 7A:
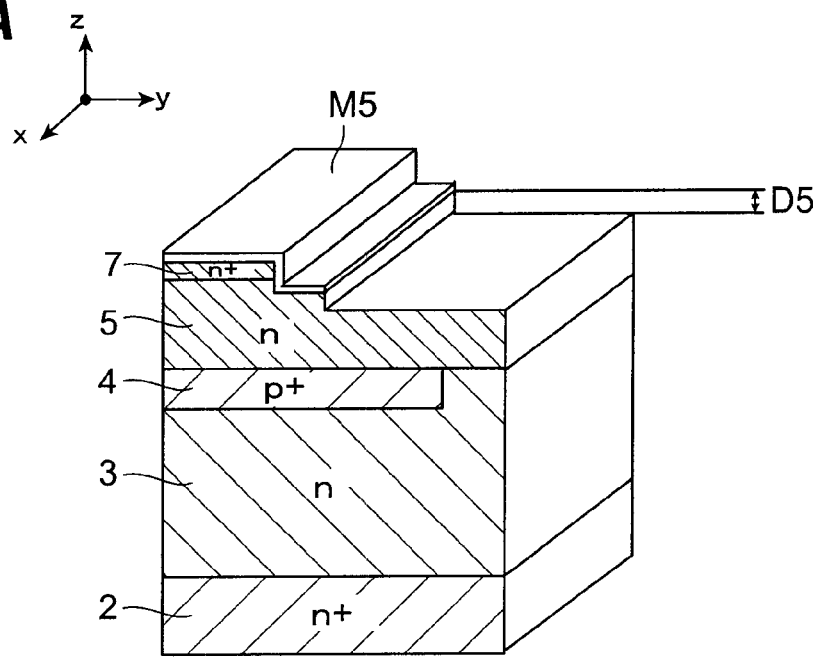
FIG. 7A is a perspective view in a shallow recess forming step.

(Shallow Recess Forming Step) A step of forming a shallow recess in the n-type semiconductor layer 5 will be described with reference to FIG. 7A. The shallow recess forming step is carried out in succession to the source semiconductor portion forming step of the second embodiment. A photoresist mask M5 having a pattern of a predetermined shape is formed. The n-type semiconductor layer 5 is selectively etched using the mask M5. The etching depth D5 is so large as not to reach the $p^+$ type buried semiconductor portion 4. As a result, the part of the n-type semiconductor layer 5 covered by the resist pattern remains unetched, to form a shallow recess. After the shallow recess is formed, the mask M5 is removed.

Figure 7B:
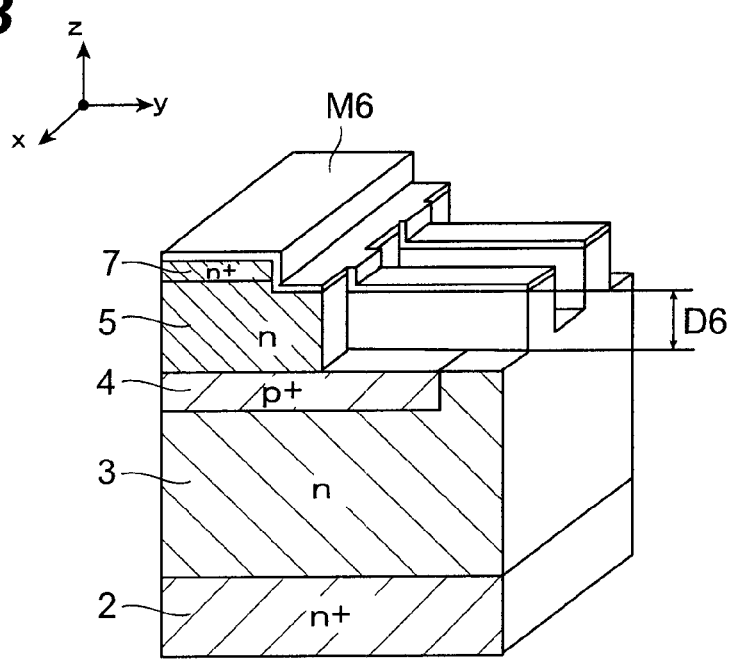
FIG. 7B is a perspective view in a deep recess forming step.

(Deep Recess Forming Step) A step of forming deep recesses in the n-type semiconductor layer 5 will be described with reference to FIG. 7B. A photoresist mask M6 having a pattern of a predetermined shape is formed. The n-type semiconductor layer 5 is selectively etched using the mask M6. The etching depth D6 is so large as to reach the $p^+$ type buried semiconductor portion 4. As a result, the part of the n-type semiconductor layer 5 covered by the resist pattern remains unetched, so as to form deep recesses of stripe shape extending in a predetermined axial direction (the y-axis direction in the drawing). After the deep recesses are formed, the mask M6 is removed.

Figure 8:
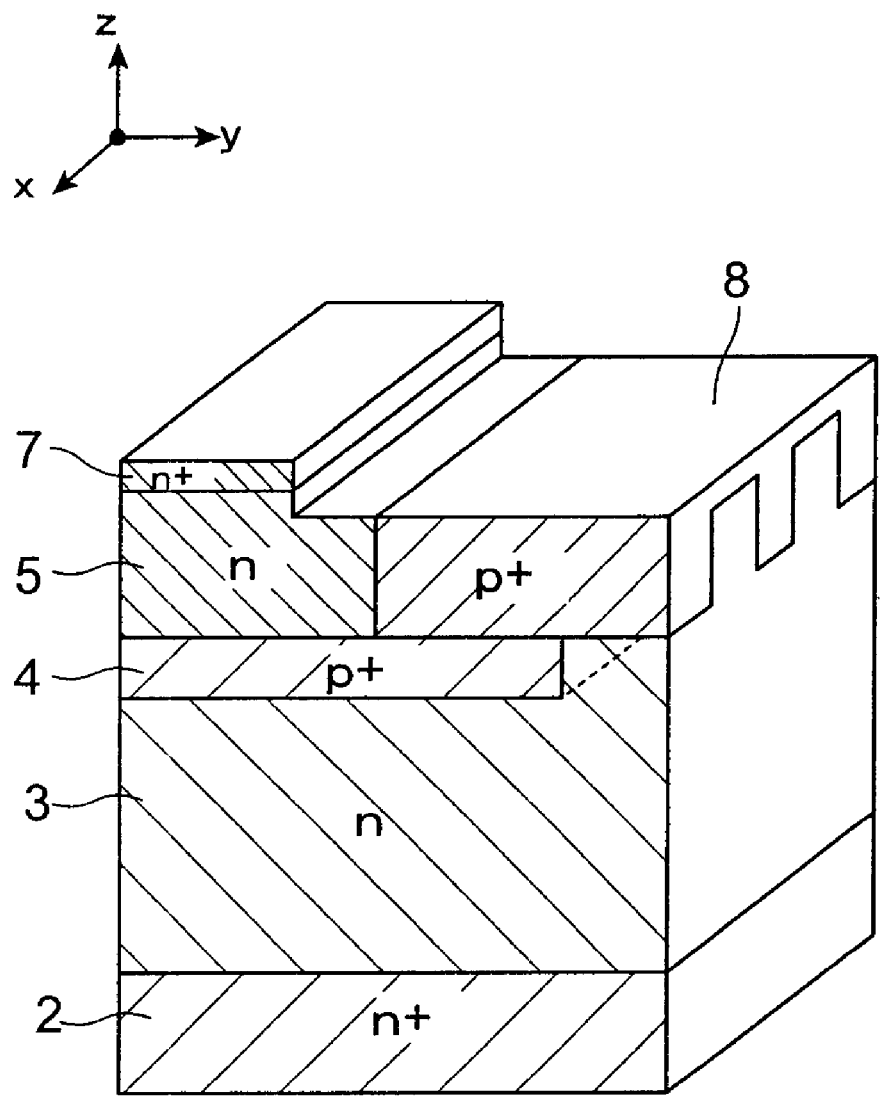
FIG. 8 is a perspective view in a gate semiconductor portion forming step.

(Gate Semiconductor Portion Forming Step) A step of forming a gate semiconductor portion will be described with reference to FIG. 8. Polysilicon is deposited on the front surfaces of the n-type drift semiconductor layer 3, the $p^+$ type buried semiconductor layer 4, and the n-type semiconductor layer 5 to form a polysilicon semiconductor portion 8 in the shallow recess and the deep recesses. The polysilicon film grows, for example, through thermal decomposition of $SiH_4$ (silane) by chemical vapor deposition. The conductivity type of the polysilicon semiconductor portion 8 is opposite to that of the drain semiconductor portion 2. The dopant concentration of the polysilicon semiconductor portion 8 is higher than that of the n-type semiconductor layer 5. The thermal oxidation step and subsequent steps are carried out in succession to the gate semiconductor portion forming step. According to the production method described in the third embodiment, the channel semiconductor portion and the gate semiconductor portion can be formed as a heterojunction.

Fourth Embodiment

Figure 9:
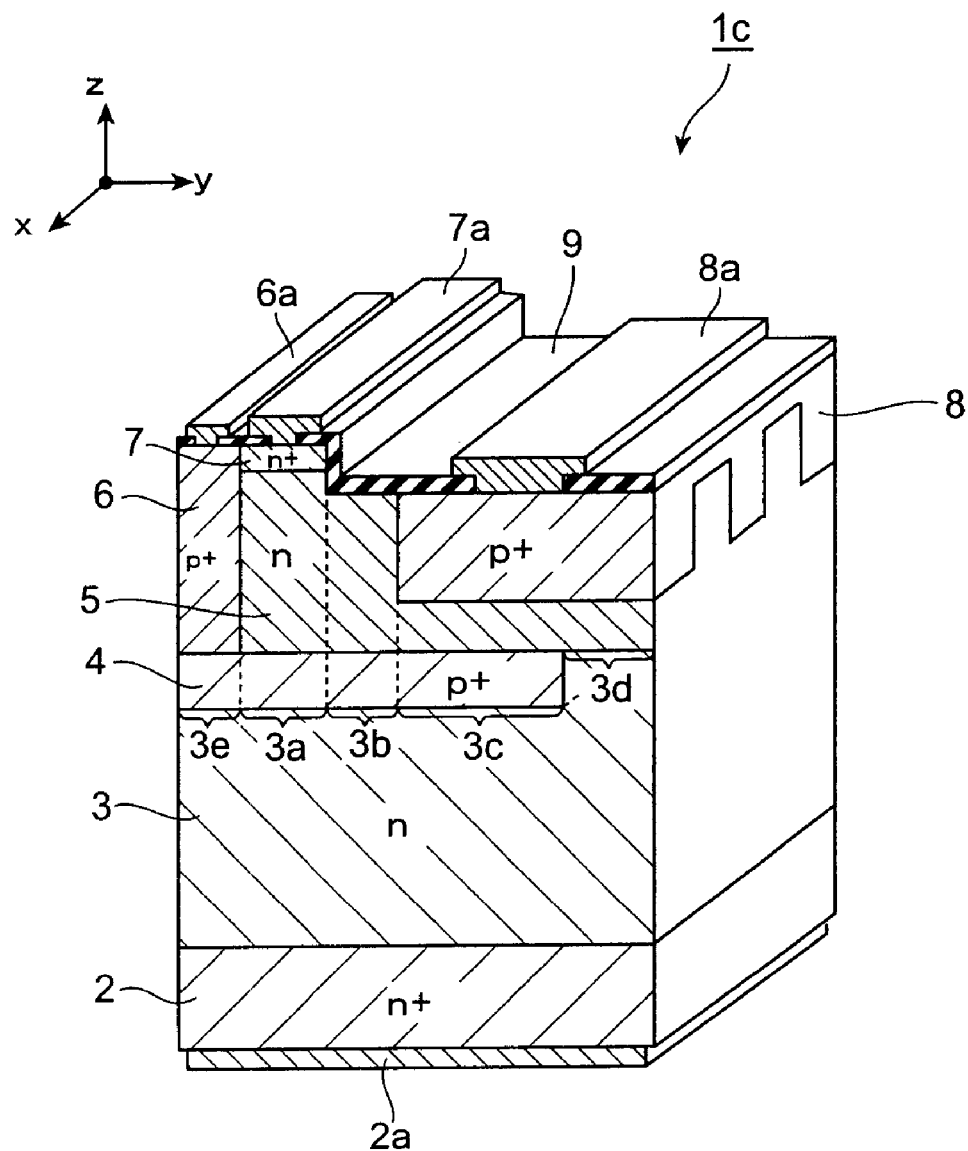
FIG. 9 is a perspective view of a vertical JFET in the fourth embodiment.

The vertical JFET 1a described in the first embodiment can have a modification form as shown in FIG. 9. FIG. 9 is a perspective view of a vertical JFET 1c in the fourth embodiment. Namely, the vertical JFET 1c in the fourth embodiment has a p+ type semiconductor portion 6 on the p+ type buried semiconductor portion 4 and fifth region 3e.

Figure 10:
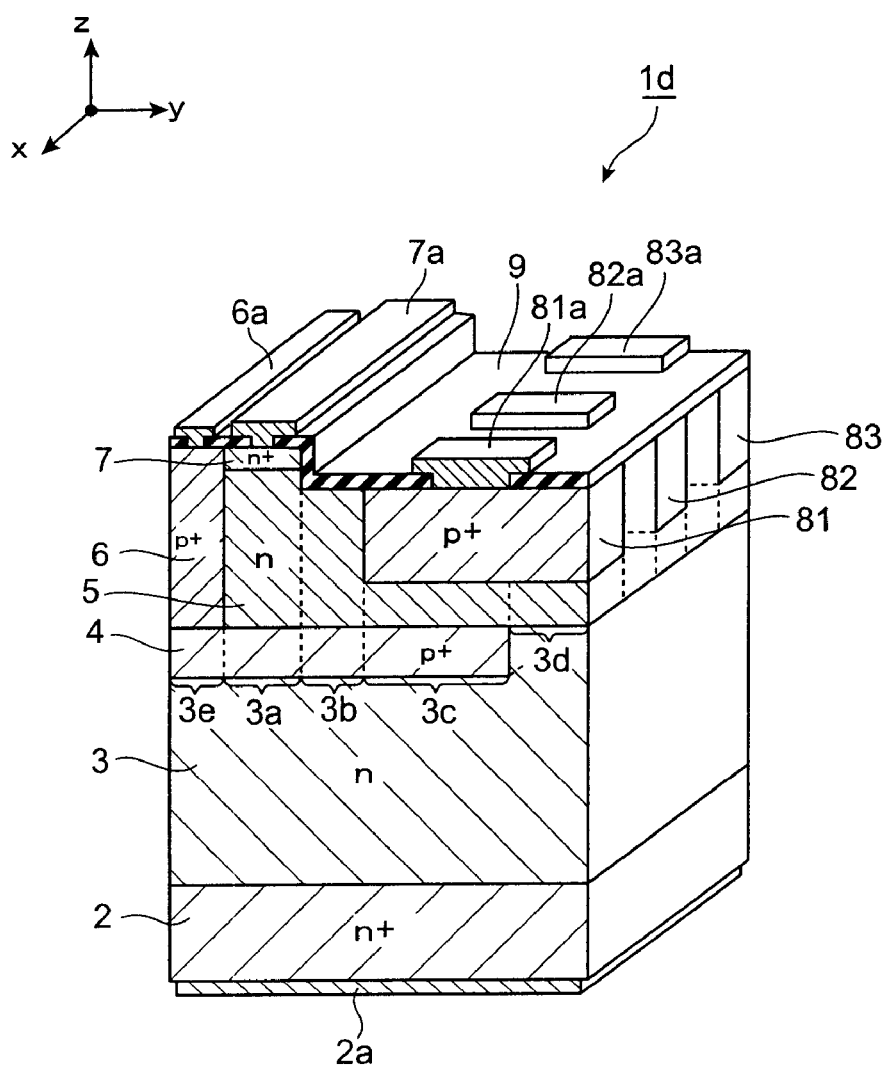
FIG. 10 is a perspective view of a vertical JFET in the fourth embodiment.

The vertical JFET 1b described in the first embodiment can also have a modification form as shown in FIG. 10. FIG. 10 is a perspective view of a vertical JFET 1d in the fourth embodiment. Namely, the vertical JFET id in still another embodiment has a p+ type semiconductor portion 6 on the p+ type buried semiconductor portion 4 and fifth region 3e.

In the vertical JFETs 1c, 1d, the n-type drift semiconductor portion 3 has first to fifth regions 3e, 3a, 3b, 3c, and 3d arranged in order in the y-axis direction, on its front surface. The p+ type semiconductor portion 6 is placed on the p+ type buried semiconductor portion 4 and fifth region 3e. The p+ type semiconductor portion 6 extends along the n-type channel semiconductor portion 5 (in the z-axis direction in the drawing). The conductivity type of the semiconductor portion 6 is opposite to that of the channel semiconductor portion 5. The p-type dopant concentration of the semiconductor portion 6 is higher than the n-type dopant concentration of the channel semiconductor portion 5. In a preferred example, the p+ type semiconductor portion 6 is made of SiC doped with a dopant.

In the vertical JFETs 1c, 1d in the fourth embodiment, the p+ type buried semiconductor portion 4 is electrically connected through the p+ type semiconductor portion 6 to an electrode 6a. When the electrode 6a is used as a gate electrode, a channel semiconductor portion is also formed between the p+ type semiconductor portion and the p+ type buried semiconductor portion. It thus becomes feasible to let the electric current flow more and to decrease loss.

In the vertical JFETs 1c, 1d in the present embodiment, it is also possible to adopt a structure wherein the p+ type buried semiconductor portion 4 and the source semiconductor portion 7 are electrically connected to the same source electrode 7a, by connecting the p+ type semiconductor portion 6 to the source electrode 7a, instead of the electrode 6a. This keeps the p+ type buried semiconductor portion 4 at the same potential as the source semiconductor portion 7. At this time, the capacitance between the p+ type buried semiconductor portion and the drain semiconductor portion turns from the gate-drain capacitance to the gate-source capacitance, so as to enable high-frequency operation.

Fifth Embodiment

Figure 11A:
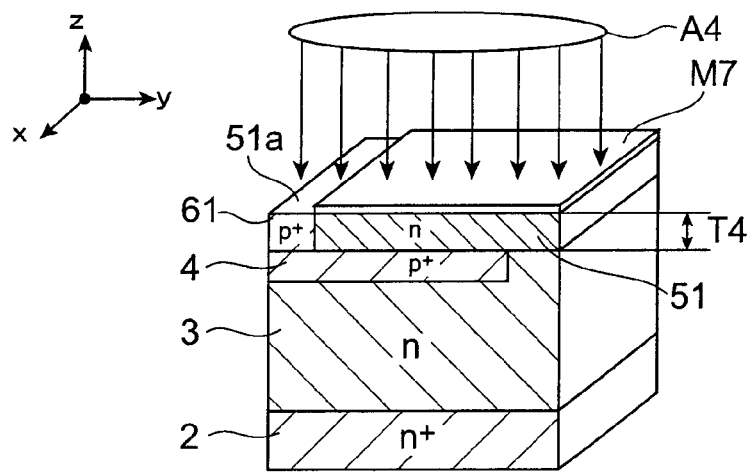
FIG. 11A is a perspective view in a p⁺ type semiconductor film forming step.

Next, the fifth embodiment, which is a modification of the second embodiment, will be described with reference to FIGS. 11A to 11C. For a production method of a vertical JFET in the fifth embodiment, constitutive elements similar to those in the production method of the vertical JFET 1a described in the second embodiment are denoted by the same reference symbols. The p+ type semiconductor film forming step and the steps subsequent thereto different from the second embodiment will be described below.

(p+ Type Semiconductor Film Forming Step) A step of forming a p+ type semiconductor film will be described with reference to FIG. 11A. The p+ type semiconductor film forming step is carried out in succession to the channel semiconductor film forming step. A mask M7 having a pattern of a predetermined shape is formed. Using the mask M7, a region 51a formed on an SiC film 51 is selectively ion-implanted with a dopant 4A to form a p+ type semiconductor layer 61. The thickness T4 of the SiC film 51 is one that permits a p+ type semiconductor layer 61 reaching the p+ type gate semiconductor portion 4, to be formed by ion implantation. The dopant concentration of the p+ type semiconductor layer 61 is approximately equal to that of the p+ type gate semiconductor portion 4. After the p+ type semiconductor layer 61 is formed, the mask M7 is removed. The channel semiconductor film forming step and the p+ type semiconductor film forming step are repeatedly carried out until the channel semiconductor film and the p+ type semiconductor film come to have a predetermined thickness.

Figure 11B:
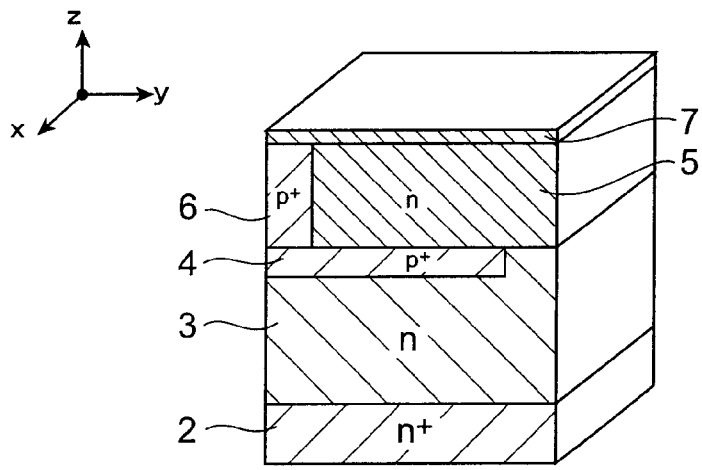
FIG. 11B is a perspective view in a source semiconductor film forming step.
Figure 11C:
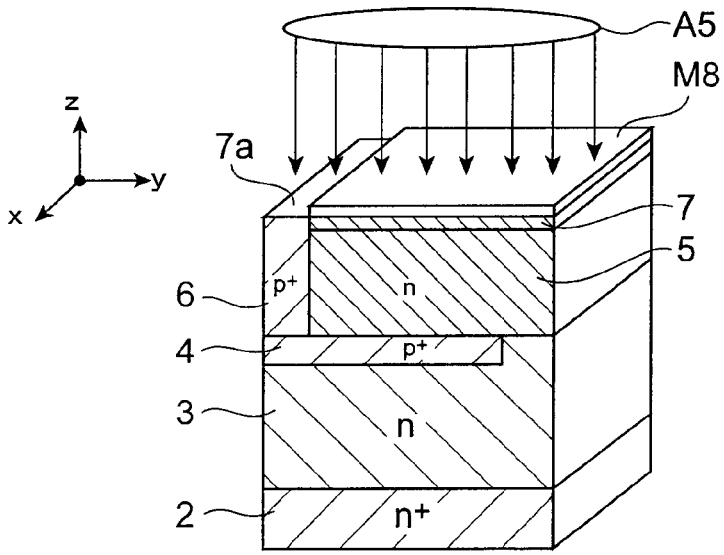
FIG. 11C is a perspective view in a p⁺ type semiconductor portion forming step.

(Source Semiconductor Film Forming Step) As shown in FIG. 11B, an SiC film 7 for the n+ type source layer is formed on the n-type semiconductor layer 5 and on the p+ type semiconductor layer 6 by epitaxial growth. The conductivity type of the SiC film 7 is the same as that of the n+ type drain semiconductor portion 2. The dopant concentration of the SiC film 7 is higher than that of the SiC film 5.

(p+ Type Semiconductor Portion Forming Step) A step of forming a p+ type semiconductor portion will be described with reference to FIG. 11C. A mask M8 having a pattern of a predetermined shape is formed. Using the mask M8, a region 7a formed on the SiC film 7 is selectively ion-implanted with a dopant A5 to form a p+ type semiconductor portion 6. After the p+ type semiconductor portion 6 is formed, the mask M8 is removed. The source semiconductor portion forming step is carried out in succession to the p+ type semiconductor portion forming step. The above described the p+ type semiconductor film forming step and the steps subsequent thereto, different from the second embodiment. The other steps are similar to those in the second embodiment, but are not limited to this.

Sixth Embodiment

Figure 12:
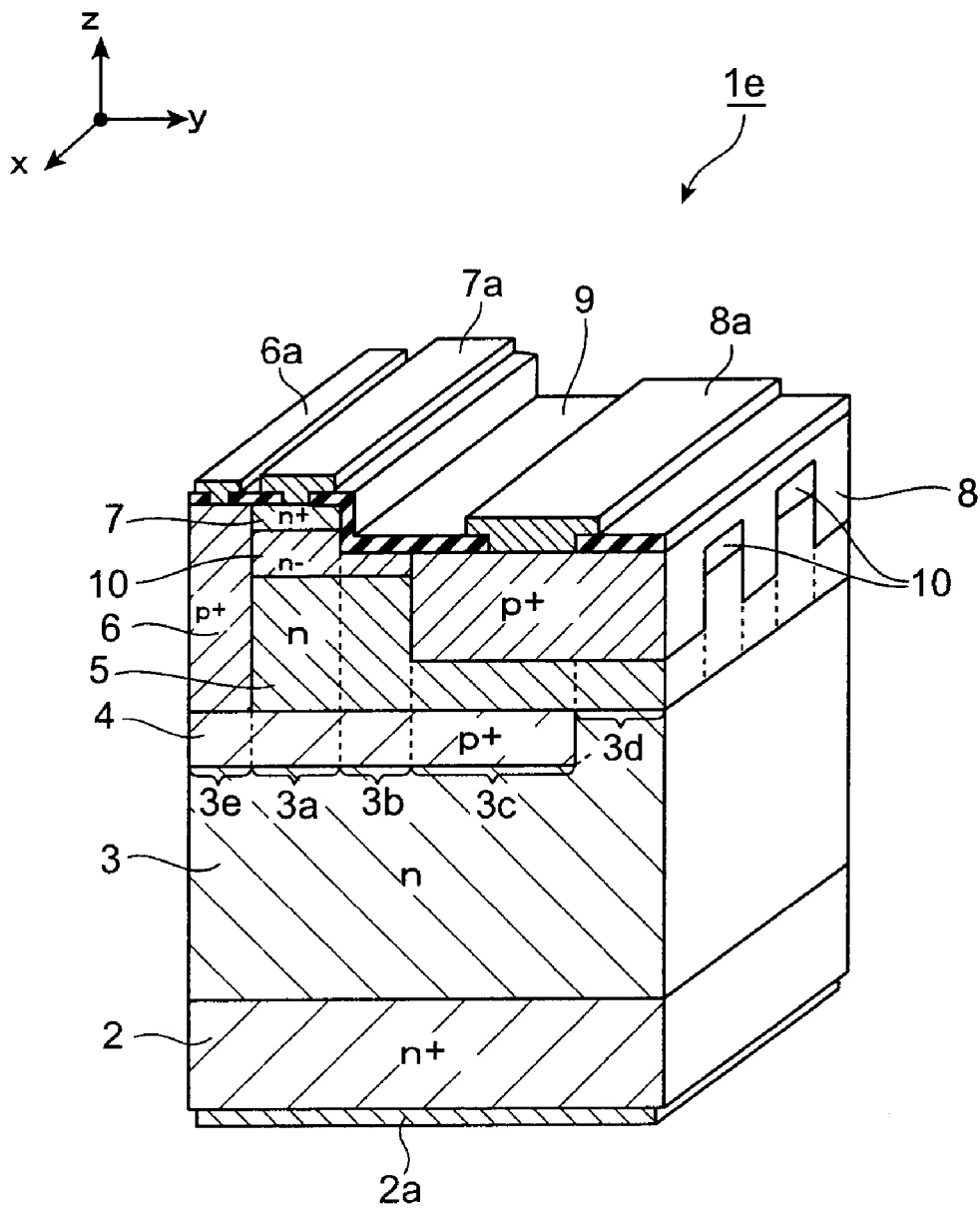
FIG. 12 is a perspective view of a vertical JFET in the sixth embodiment.

The vertical JFET 1a described in the fourth embodiment can also have a modification form as shown in FIG. 12. FIG. 12 is a perspective view of a vertical JFET 1e in the sixth embodiment. Namely, the fourth embodiment employed the configuration wherein the n-type channel semiconductor portion 5 was in contact with the n+ type source semiconductor portion 7 above the first region 3a. In contrast to it, the sixth embodiment employs a configuration wherein the vertical JFET 1e further has an n− type semiconductor portion 10 between the n-type channel semiconductor portion 5 and the n+ type source semiconductor portion 7. The present embodiment is particularly suitable for forms wherein the space between the p+ type gate semiconductor portion 4 and the n− type semiconductor portion 10 is smaller than the space between the projections of the p+ type gate semiconductor portion 8.

The n− type semiconductor portion 10 is placed on the n-type channel semiconductor portion 5 and the first to fourth regions 3a, 3b, 3c, 3d. The conductivity type of the semiconductor portion 10 is the same as that of the channel semiconductor portion 5. The n-type dopant concentration of the semiconductor portion 10 is lower than the n-type dopant concentration of the channel semiconductor portion 5. The dopant concentration of the n− type semiconductor portion 10 is, for example, approximately $1 \times 10^{16}/cm^3$. In a preferred example, the n− type semiconductor portion 10 is made of SiC (silicon carbide) doped with a dopant.

Since this structure keeps the n-type channel semiconductor portion 5 unetched, the thickness of the channel semiconductor portion is not affected by variations due to the etching step. Therefore, it is feasible to reduce individual differences in electrical characteristics among vertical JFETs 1e.

In the vertical JFET 1e in the present embodiment, it is also possible to adopt a structure wherein the p+ type buried semiconductor portion 4 and the source semiconductor portion 7 are electrically connected to the same source electrode 7a, by connecting the p+ type semiconductor portion 6 to the source electrode 7a, instead of the electrode 6a. This keeps the p+ type buried semiconductor portion 4 at the same potential as the source semiconductor portion 7, whereby the capacitance between the p+ type buried semiconductor portion and the drain semiconductor portion turns from the gate-drain capacitance to the gate-source capacitance, so as to enable high-frequency operation.

Seventh Embodiment

Next, the seventh embodiment, which is a modification of the first embodiment, will be described with reference to FIG. 13A. For a vertical JFET in the seventh embodiment, constitutive elements similar to those in the configuration of the vertical JFET 1a described in the first embodiment are denoted by the same reference symbols. A configuration of the channel semiconductor portion different from the first embodiment will be described below.

Figure 13A:
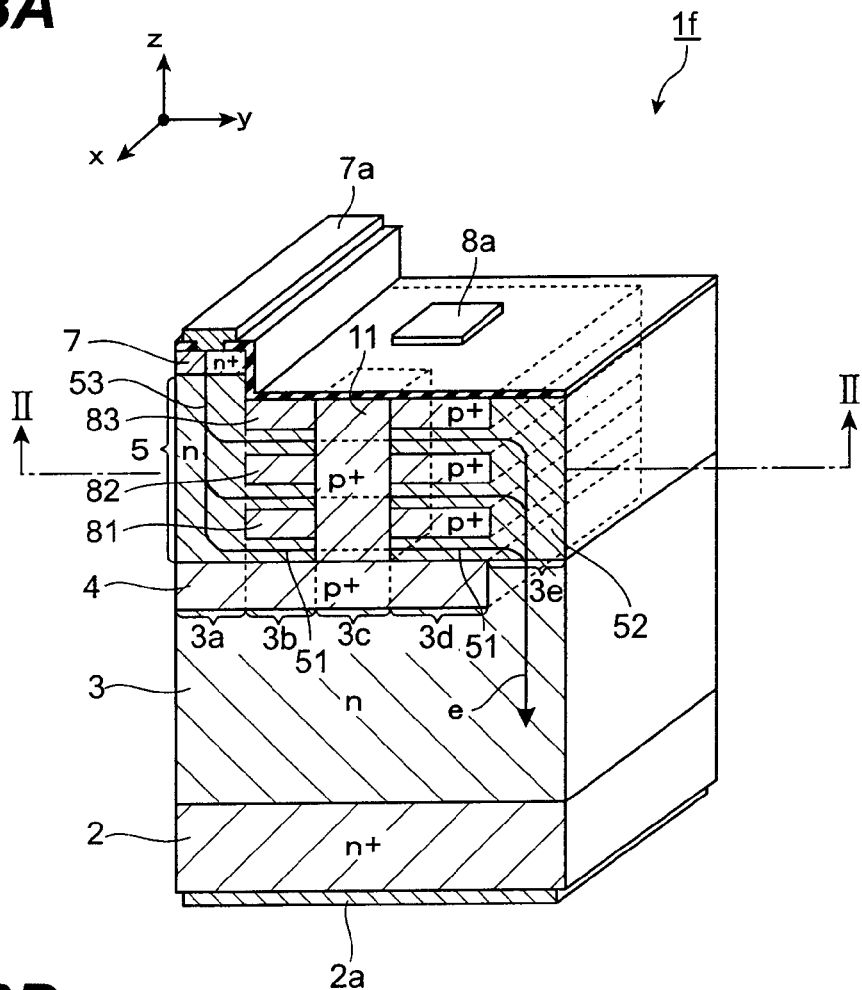
FIG. 13A is a perspective view of a vertical JFET in the seventh embodiment.

FIG. 13A is a perspective view of a vertical JFET 1f in the seventh embodiment. The seventh embodiment is different in the structure of the channel semiconductor portion from the first embodiment. As shown in FIG. 13A, the vertical JFET 1f has an n+ type drain semiconductor portion 2, an n-type drift semiconductor portion 3, a p+ type gate semiconductor portion 4, an n-type channel semiconductor portion 5, an n+ type source semiconductor portion 7, p+ type gate semiconductor portions 81, 82, and 83, and a p+ type connection semiconductor portion 11.

The n-type channel semiconductor portion 5 has n-type channel semiconductor regions 51, 52, and 53. The n-type channel semiconductor region 51 is placed on the p+ type gate semiconductor portion 4 and the second to fourth regions 3b, 3c, and 3d of the n-type drift semiconductor portion 3. The n-type channel semiconductor region 51 is provided between the p+ type gate semiconductor portion 4 and the p+ type gate semiconductor portion 81, between the p+ type gate semiconductor portions 81 and 82, and between the p+ type gate semiconductor portions 82 and 83. The n-type channel semiconductor region 52 is placed on the fifth region 3e of the n-type drift semiconductor portion 3 and is connected to the n-type drift semiconductor portion 3 in the fifth region 3e. The n-type channel semiconductor region 53 is placed above the first region 3a of the n-type drift semiconductor portion 3. The n-type channel semiconductor region 53 is connected through the n-type channel semiconductor region 51 to the n-type channel semiconductor region 52.

The dopant concentration of the n-type channel semiconductor portion 5 is lower than that of the n+ type drain semiconductor portion 2. In a preferred example, the n-type channel semiconductor portion 5 is made of SiC doped with a dopant.

The p+ type gate semiconductor portions 81, 82, and 83 are placed above the second to fourth regions 3b-3d. The n-type channel semiconductor region 51 is placed between the p+ type gate semiconductor portions 81, 82, 83. Since the conductivity type of the gate semiconductor portions 81, 82, 83 and the gate semiconductor portion 4 is opposite to that of the channel semiconductor region 51, a pn junction is created at each interface between the gate semiconductor portions 81, 82, 83, 4 and the channel semiconductor region 51. The drain current flowing in the n-type channel semiconductor region 51 is controlled by the p+ type gate semiconductor portions 81, 82, 83, 4. The p-type dopant concentration of the gate semiconductor portions 81, 82, 83, and 4 is higher than the n-type dopant concentration of the channel semiconductor region 51. In a preferred example, the p+ type gate semiconductor portions 81, 82, 83, and 4 are made of SiC doped with a dopant. A gate electrode 8a is placed on the front surface of the p+ type gate semiconductor portion 83. The gate electrode 8a is made of metal. An insulating film 9 such as a silicon oxide film is placed on the p+ type gate semiconductor portion 83, and the p+ type gate semiconductor portion 83 is connected through an aperture of the insulating film 9 to the gate electrode 8a.

Figure 13B:
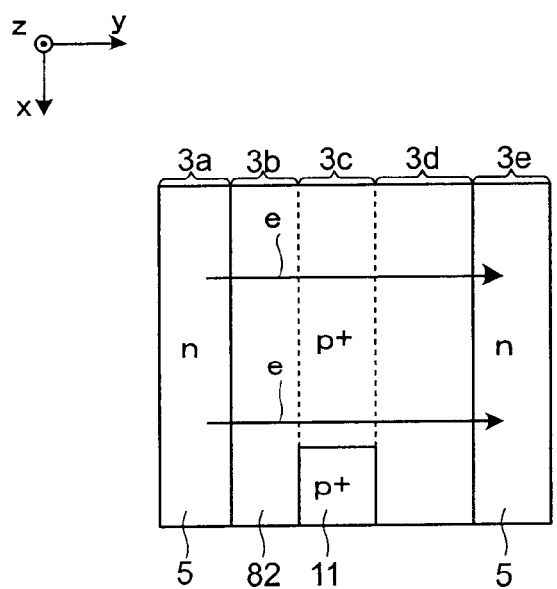
FIG. 13B is a sectional view along II-II line of the vertical JFET in the seventh embodiment.

The p+ type connection semiconductor portion 11, as shown in FIG. 13B, is placed above the third region 3c. The conductivity type of the connection semiconductor portion 11 is the same as that of the gate semiconductor portion 4. The p+ type connection semiconductor portion 11 extends in the vertical direction (the z-axis direction in the drawing) to connect the p+ type gate semiconductor portion 4 and the p+ type gate semiconductor portions 81, 82, 83. The p-type dopant concentration of the connection semiconductor portion 11 is higher than the n-type dopant concentration of the channel semiconductor region 51. In a preferred example, the p+ type connection semiconductor portion 11 is made of SiC doped with a dopant. Arrows e indicate paths of electric current flowing from the source semiconductor portion 7 to the drain semiconductor portion 2.

Eighth Embodiment

Next, the eighth embodiment, which is a modification of the second embodiment, will be described with reference to FIGS. 14A and 14B, FIGS. 15A and 15B, FIGS. 16A and 16B, FIGS. 17A and 17B, and FIGS. 18A and 18B. For a production method of a vertical JFET in the eighth embodiment, constitutive elements similar to those in the production method of the vertical JFET 1a described in the second embodiment are denoted by the same reference symbols. The channel semiconductor film forming step and the steps subsequent thereto, different from the second embodiment, will be described below.

Figure 14A:
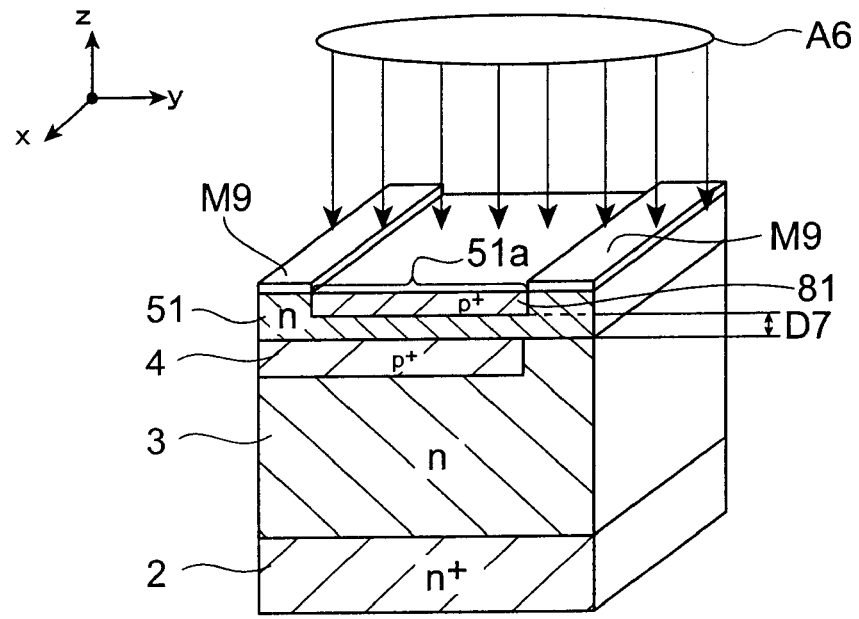
FIG. 14A is a perspective view in a p⁺ type semiconductor layer forming step.

(p+ Type Semiconductor Layer Forming Step) A step of forming a p+ type semiconductor layer will be described with reference to FIG. 14A. The p+ type semiconductor layer forming step is carried out in succession to the channel semiconductor film forming step. A mask M9 having a pattern extending in a predetermined direction (the x-axis direction in the drawing) is formed. Using the mask M9, a region 51a defined on the SiC film 51 is selectively ion-implanted with a dopant A6 to form a p+ type semiconductor layer 81. The depth D7 of ion implantation is determined according to the threshold of the vertical JFET. After the p+ type semiconductor layer is formed, the mask M9 is removed.

Figure 14B:
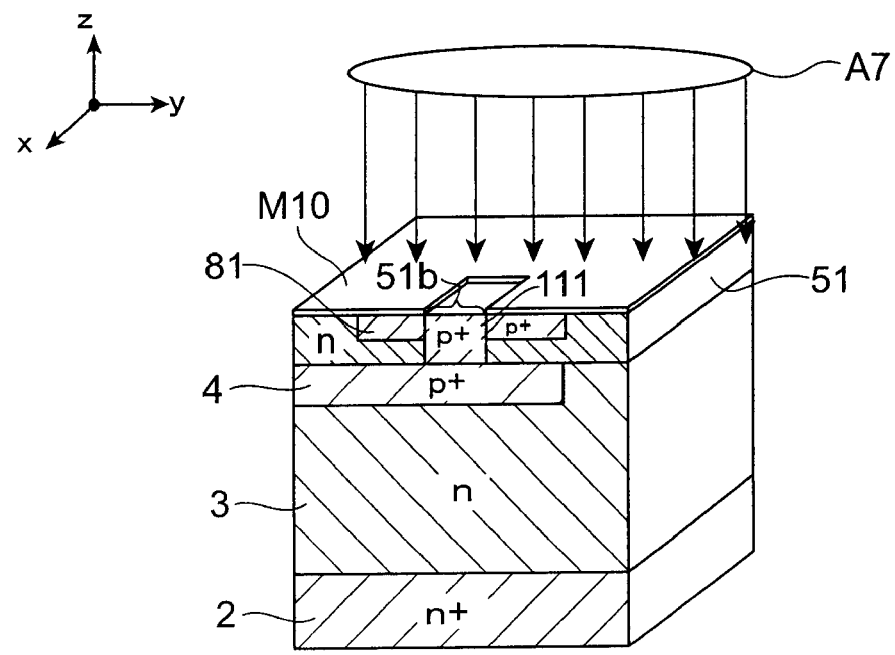
FIG. 14B is a perspective view in a p⁺ type connection semiconductor layer forming step.

(p+ Type Connection Semiconductor Layer Forming Step) A step of forming a p+ type connection semiconductor layer will be described with reference to FIG. 14B. A mask M10 having a pattern of a predetermined shape is formed. Using the mask M10, a region 51b defined on the SiC film 51 is selectively ion-implanted with a dopant A7 to form a p+ type connection semiconductor layer 111. The depth of ion implantation is so deep as to reach the p+ type gate semiconductor portion 4. The dopant concentration of the p+ type connection semiconductor layer 111 is approximately equal to that of the p+ type gate semiconductor portion 4. After the p+ type semiconductor layer is formed, the mask M10 is removed.

Figure 15A:
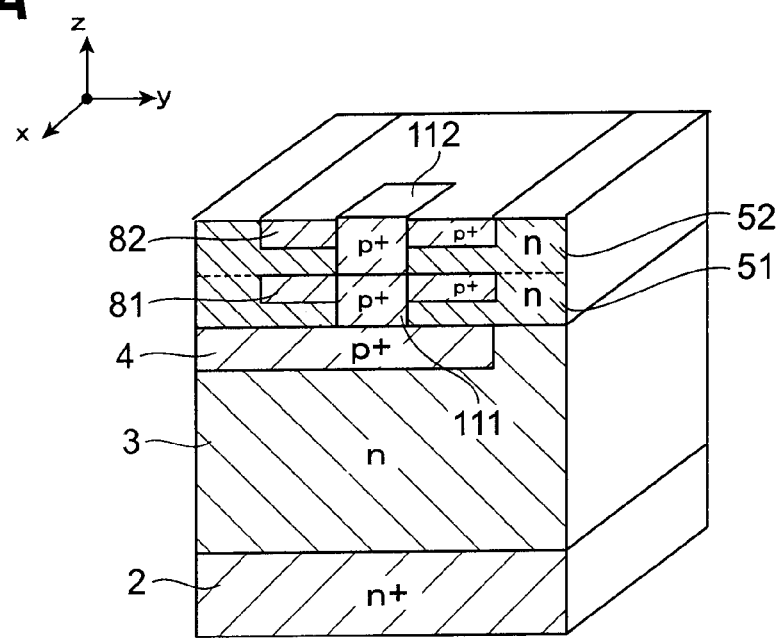
FIG. 15A is a perspective view in a p⁺ type gate semiconductor portion forming step.
Figure 15B:
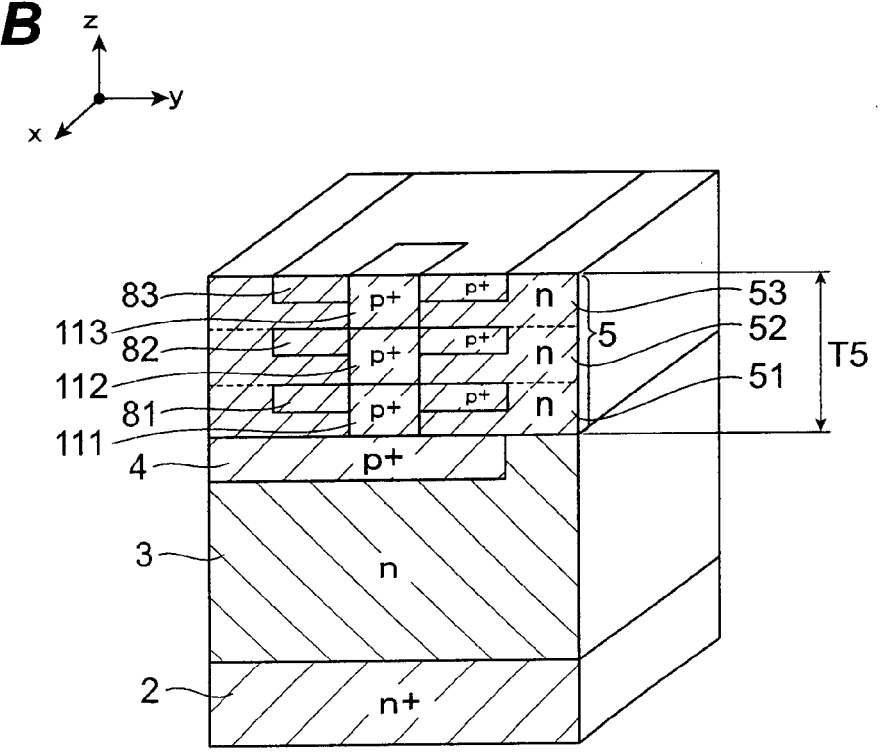
FIG. 15B is a perspective view in a p⁺ type gate semiconductor portion forming step.

(p+ Type Gate Semiconductor Portion Forming Step) A step of forming a p+ type gate semiconductor portion will be described with reference to FIGS. 15A and 15B. This step involves repetitions of the channel semiconductor film forming step, the p+ type semiconductor layer forming step, and the p+ type connection semiconductor layer forming step to deposit the semiconductor layers having the p+ type semiconductor layer and the p+ type connection semiconductor layer on the n-type drift semiconductor portion 3, thereby forming a stack type channel portion. As a result, the semiconductor layer 5 is formed in a predetermined thickness T5 (in the z-axis direction in the drawing).

Figure 16A:
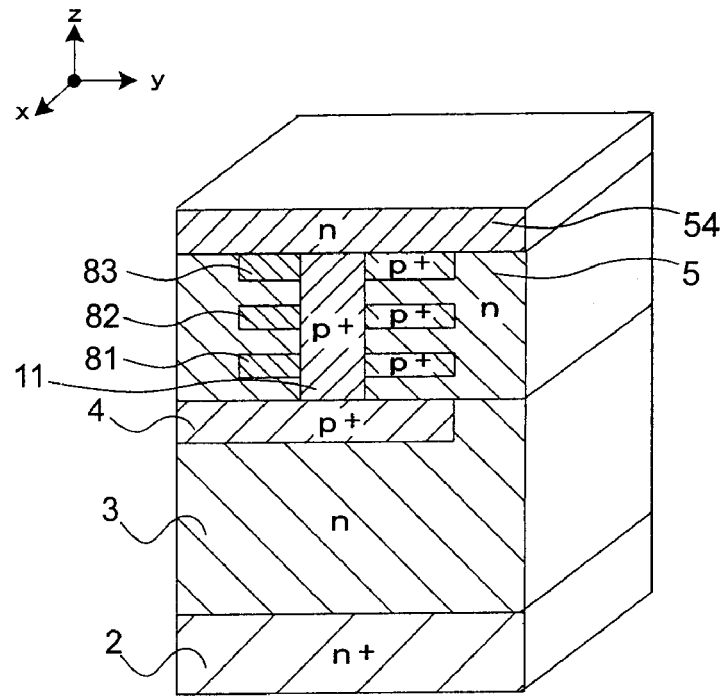
FIG. 16A is a perspective view in a channel semiconductor film forming step.

(Channel Semiconductor Film Forming Step) A step of forming an n-type channel semiconductor film will be described with reference to FIG. 16A. As shown in FIG. 16A, an SiC film 54 is grown on the SiC film 5 by epitaxial growth. The conductivity type of the SiC film 54 is the same as that of the n+ type drain semiconductor portion 2. The dopant concentration of the SiC film 54 is lower than that of the drain semiconductor portion 2.

Figure 16B:
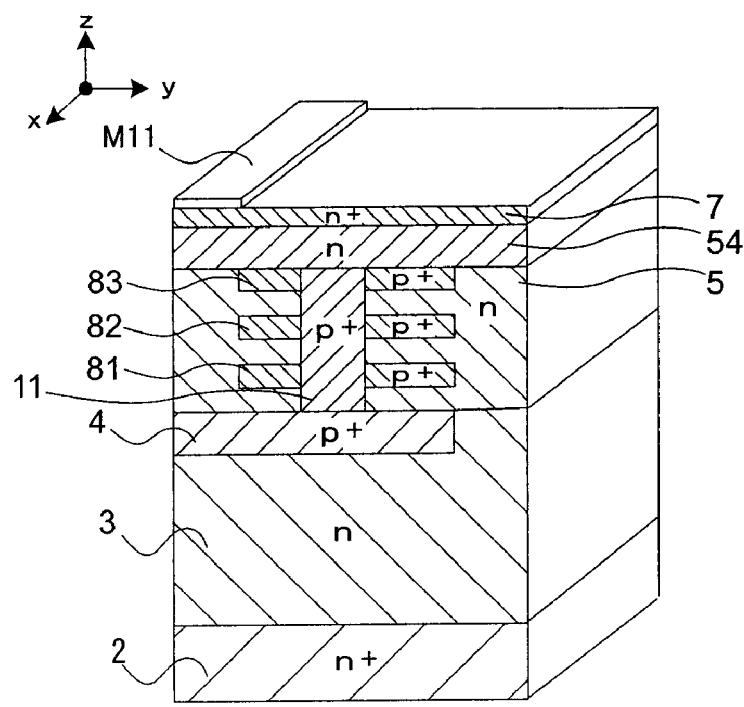
FIG. 16B is a perspective view in a source semiconductor film forming step.

(Source Semiconductor Film Forming Step) As shown in FIG. 16B, an SiC film 7 for the n+ type source layer is formed on the front surface of the SiC film 54 by epitaxial growth. The conductivity type of the SiC film 7 is the same as that of the drain semiconductor portion 2. The dopant concentration of the SiC film 7 is higher than that of the SiC film 54.

Figure 17A:
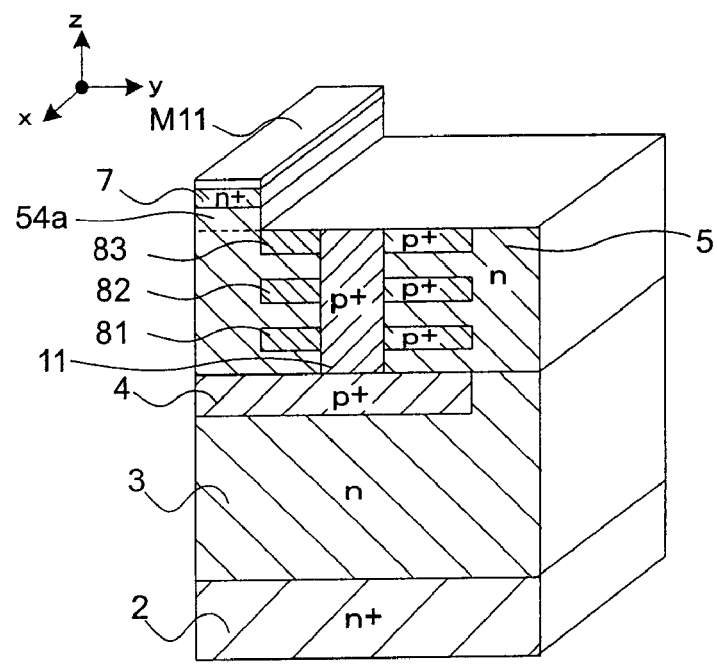
FIG. 17A is a perspective view in a source semiconductor portion forming step.

(Source Semiconductor Portion Forming Step) A step of forming a source semiconductor portion will be described with reference to FIG. 17A. A mask Mil having a pattern extending in a predetermined axial direction (the x-axis direction in the drawing) is formed. The n+ type source layer 7 and the SiC film 54 are selectively etched using the mask M11. As a result, part 54a of the n+ type source layer 7 and SiC film 54 covered by the resist pattern remains unetched, so as to form an n+ type source semiconductor portion 7. After the source semiconductor portion is formed, the mask M11 is removed.

Figure 17B:
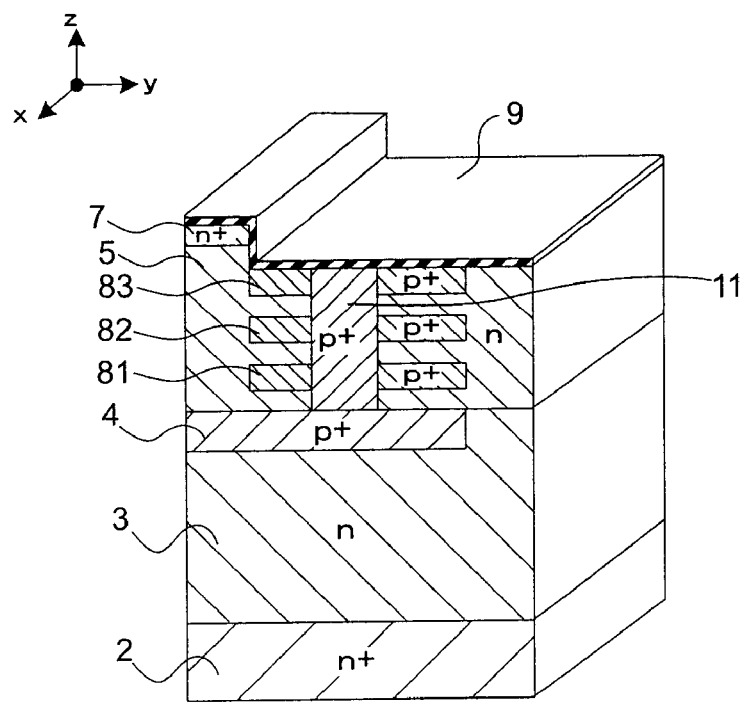
FIG. 17B is a perspective view in a thermal oxidation step.

(Thermal Oxidation Step) A step of thermally oxidizing the vertical JFET 1f will be described with reference to FIG. 17B. The vertical JFET 1f is subjected to a thermal oxidation treatment. The thermal oxidation treatment is a treatment of exposing SiC to an oxidizing atmosphere at a high temperature (e.g., about 1200° C.) to bring about chemical reaction of silicon in each semiconductor portion with oxygen to form a silicon oxide film ($SiO_2$). This results in covering the front surface of each semiconductor portion by the oxide film 9.

Figure 18A:
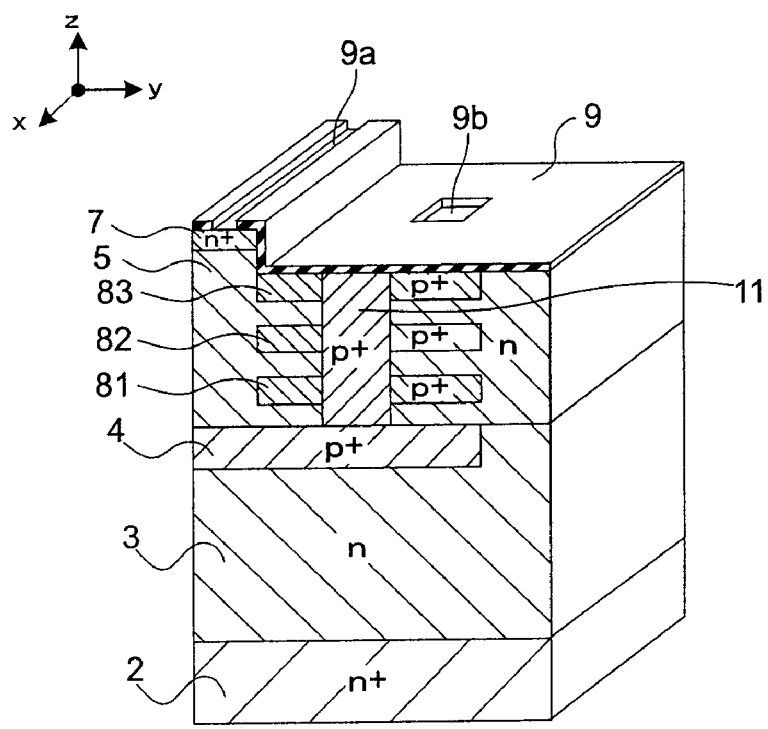
FIG. 18A is a perspective view in an aperture forming step.

(Aperture Forming Step) A step of forming apertures for formation of the source electrode and gate electrode will be described with reference to FIG. 18A. The oxide film 9 is selectively etched using a mask of a photoresist, to form apertures 9a, 9b. The front surface parts of the source semiconductor portion 7 and the gate semiconductor portion 8 are exposed in the respective apertures 9a, 9b. The exposed portions become conducting portions to the source electrode and to the gate electrode. After the apertures are formed, the resist mask is removed.

Figure 18B:
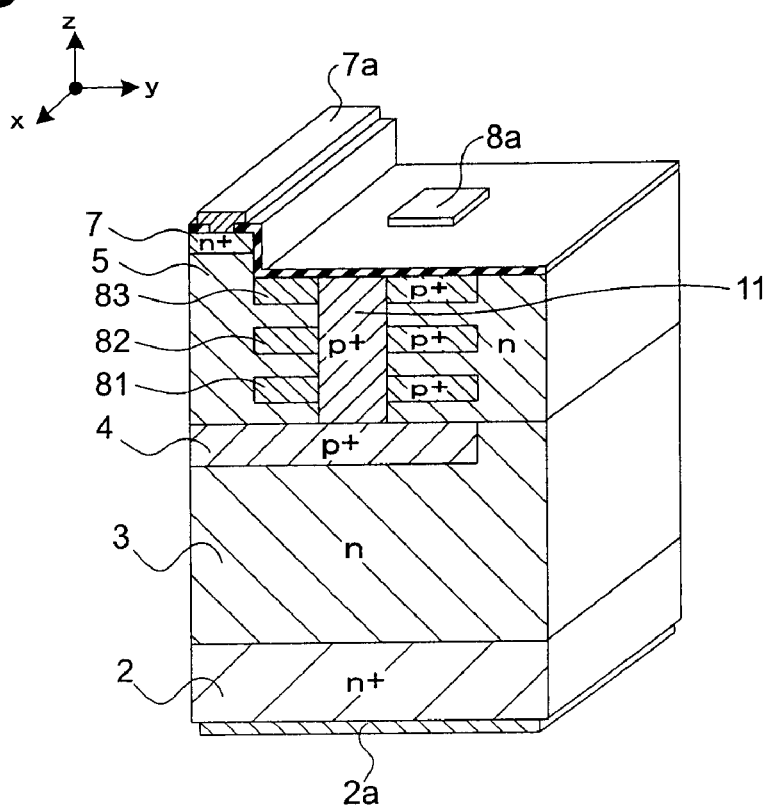
FIG. 18B is a perspective view in an electrode forming step.

(Electrode Forming Step) A step of forming electrodes will be described with reference to FIG. 18B. First, a metal film for ohmic contact electrodes, e.g., nickel (Ni) is deposited on the front surface of the vertical JFET 1f. Next, a mask of a photoresist is formed so as to leave Ni in the source-electrode aperture 9a and the gate-electrode aperture 9b only, the Ni metal film is etched, and the resist is removed. Subsequently, the surface is thermally treated in an inert gas atmosphere such as nitrogen or argon at a high temperature (e.g., about 1000° C. in the case of Ni), to form ohmic contacts. The material of the metal film for ohmic contact electrodes may be one of Ni, tungsten (W), and titanium (Ti), but is not limited to these.

Furthermore, a metal film for electrodes such as aluminum (Al) is deposited. A mask of a photoresist having a predetermined shape is formed. The metal film for electrodes is selectively etched using this mask. As a result, the part of the metal film for electrodes covered by the resist pattern remains unetched, to form a source electrode 7a and a gate electrode 8a. The material of the metal film for electrodes may be one of aluminum alloys, copper (Cu), and tungsten (W), but is not limited to these. After the electrodes are formed, the resist mask is removed.

The vertical JFET 1f in the seventh embodiment is completed through the steps described above. In the structure of the vertical JFET 1f the p+ type gate semiconductor portions 81, 82, and 83 are connected through the p+ type connection semiconductor portion 11 to the p+ type gate semiconductor portion 4. This permits the p+ type connection semiconductor portion 11 and the p+ type gate semiconductor portions 81, 82, 83 to be used as a gate. It also permits the gate electrode 8a to be connected to the buried gate semiconductor portion. Therefore, the channel region is created between the p+ type gate semiconductor portions 4, 81, 82, 83. Accordingly, it is feasible to increase the channel region that can be controlled by the gate semiconductor portions, and to decrease the on-state resistance.

Ninth Embodiment

Figure 19A:
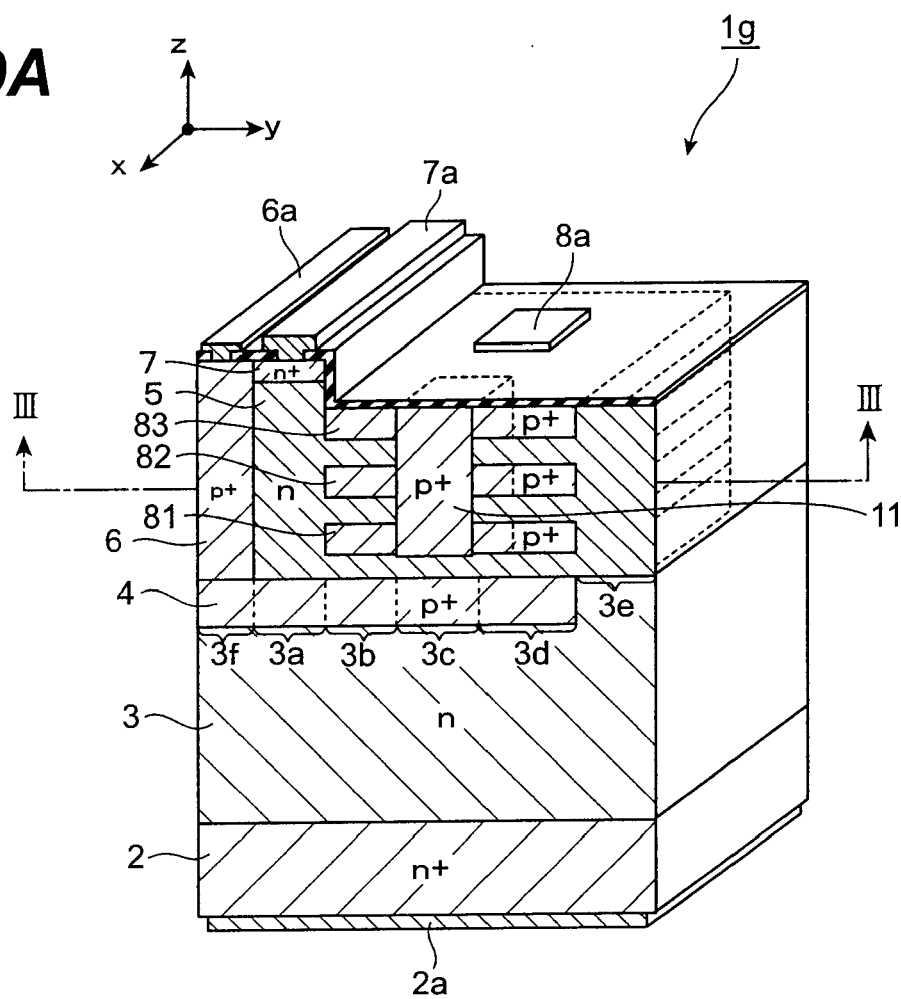
FIG. 19A is a perspective view of a vertical JFET in the ninth embodiment.
Figure 19B:
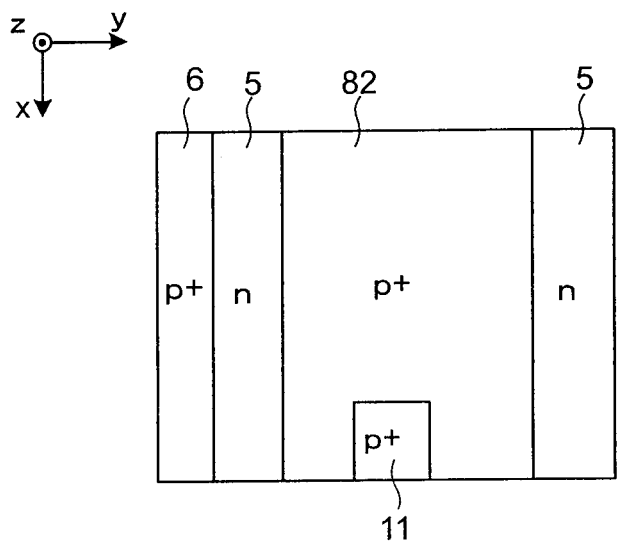
FIG. 19B is a sectional view along III-III line of the vertical JFET in the ninth embodiment.

The vertical JFET 1f described in the seventh embodiment can also have a modification form as shown in FIG. 19A. FIG. 19A is a perspective view of a vertical JFET 1g in the ninth embodiment. Namely, the vertical JFET 1g in the ninth embodiment is different from the vertical JFET 1f in that a p+ type semiconductor portion 6 is provided on the p+ type buried semiconductor portion 4 and the sixth region 3f.

In the vertical JFET 1g, the n-type drift semiconductor portion 3 has first to sixth regions 3f, 3a, 3b, 3c, 3d, and 3e arranged in order in the y-axis direction, on its front surface. The p+ type semiconductor portion 6 is placed on the p+ type buried semiconductor portion 4 and the sixth region 3f. The p+ type semiconductor portion 6 extends along the n+ type source semiconductor portion 7 (in the x-axis direction in the drawing). The conductivity type of the p+ type semiconductor portion 6 is opposite to that of the n-type channel semiconductor portion 5. The p-type dopant concentration of the semiconductor portion 6 is higher than the n-type dopant concentration of the channel semiconductor portion 5. In a preferred example, the p+ type semiconductor portion 6 is made of SiC doped with a dopant.

In the vertical JFET 1g in the ninth embodiment, the p+ type buried semiconductor portion 4 is electrically connected through the p+ type semiconductor portion 6 to the electrode 6a. The electrode 6a can also be used as a gate electrode, and no connection semiconductor portion 11 exists in the channel semiconductor portion between the p+ type gate semiconductor portion 81 and the p+ type buried semiconductor portion 4. Therefore, the current paths are greater and the on-state resistance is smaller by that degree.

In the vertical JFET 1g in the present embodiment, it is also possible to adopt a structure wherein the p+ type buried semiconductor portion 4 and the source semiconductor portion 7 are electrically connected to the same source electrode 7a, by connecting the p+ type semiconductor portion 6 to the source electrode 7a, instead of the electrode 6a. This keeps the p+ type buried semiconductor portion 4 at the same potential as the source semiconductor portion 7, and the capacitance between the p+ type buried semiconductor portion and the drain semiconductor portion turns from the gate-drain capacitance to the gate-source capacitance, so as to enable high-frequency operation.

Tenth Embodiment

Figure 20A:
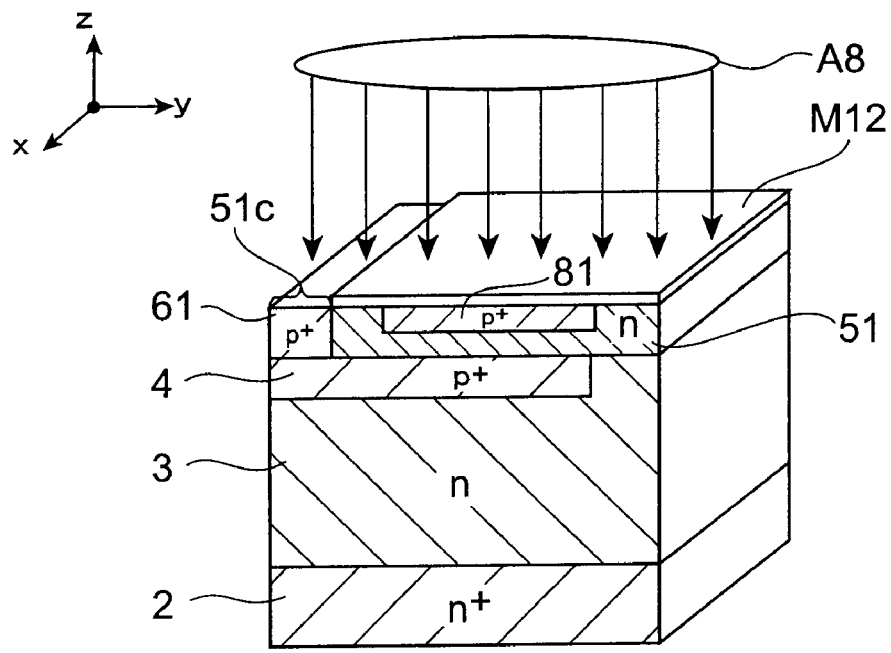
FIG. 20A is a perspective view in a second p⁺ type semiconductor layer forming step.
Figure 20B:
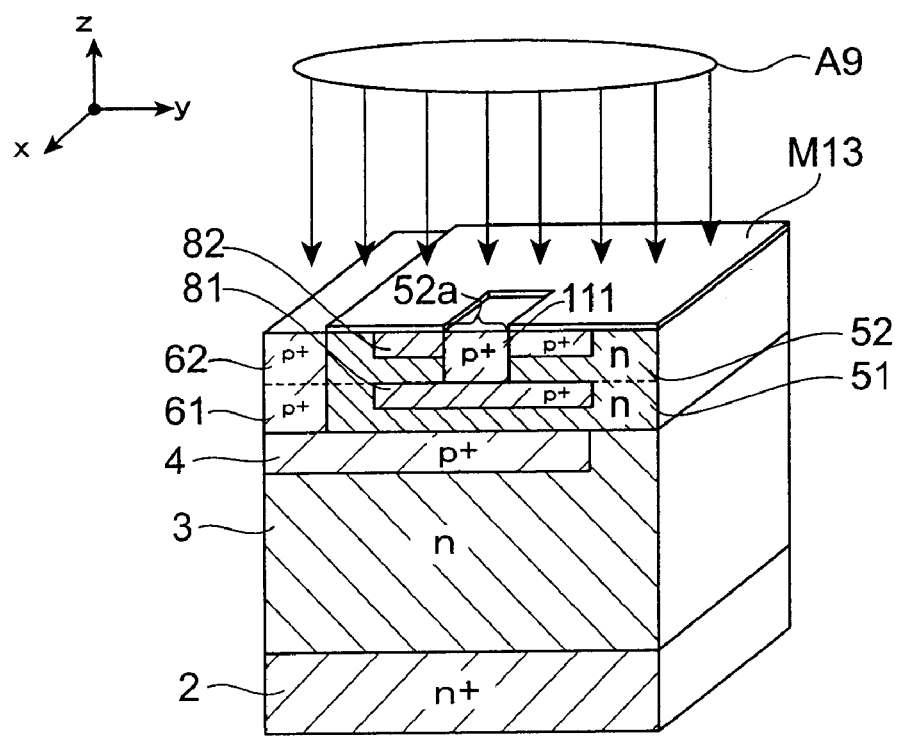
FIG. 20B is a perspective view in a p⁺ type connection semiconductor layer forming step.

The tenth embodiment, which is a modification of the eighth embodiment, will be described with reference to FIGS. 20A and 20B. For a production method of a vertical JFET in the tenth embodiment, constitutive elements similar to those in the production method of the vertical JFET 1f described in the eighth embodiment are denoted by the same reference symbols. A p⁺ type semiconductor portion forming step different from the eighth embodiment will be described below.

(Second p⁺ Type Semiconductor Layer Forming Step) A step of forming a p⁺ type semiconductor layer will be described with reference to FIG. 20A. The second p⁺ type semiconductor layer forming step is carried out in succession to the p⁺ type semiconductor layer forming step. A mask M12 having a pattern of a predetermined shape is formed. Using the mask M12, a region 51c defined on the SiC film 51 is selectively ion-implanted with a dopant A8 to form a p⁺ type semiconductor layer 61. The depth of ion implantation is so deep as to reach the p⁺ type buried semiconductor portion 4. The dopant concentration of the p⁺ type semiconductor layer 61 is approximately equal to that of the p⁺ type buried semiconductor portion 4. After the p⁺ type semiconductor layer is formed, the mask M12 is removed.

(p⁺ Type Connection Semiconductor Layer Forming Step) A step of forming a p⁺ type connection semiconductor layer will be described with reference to FIG. 20B. The n-type semiconductor film 52, p⁺ type semiconductor portion 82, and p⁺ type semiconductor portion 62 are formed prior to the formation of the p⁺ type connection semiconductor layer. A mask M13 having a pattern of a predetermined shape is formed. A region 52a defined on the n-type semiconductor film 52 by the mask M13 is selectively ion-implanted with a dopant A9 to form a p⁺ type connection semiconductor portion layer 111. The depth of ion implantation is so deep as to reach the p⁺ type gate semiconductor portion 81. The dopant concentration of the p⁺ type connection semiconductor layer 111 is approximately equal to that of the p⁺ type semiconductor layer 61. After the p⁺ type connection semiconductor layer 111 is formed, the mask M13 is removed.

A channel semiconductor film forming step is carried out in succession to the p⁺ type connection semiconductor layer forming step. The channel semiconductor film forming step, p⁺ type semiconductor layer forming step, second p⁺ type semiconductor layer forming step, and p⁺ type connection semiconductor layer forming step are repeatedly carried out to form a stacked channel portion on the n-type drift semiconductor portion 3. The above described the second p⁺ type semiconductor layer forming step and the steps subsequent thereto, different from the eighth embodiment. The other steps are similar to those in the eighth embodiment, but are not limited to this.

Eleventh Embodiment

Next, the eleventh embodiment, which is a modification of the first embodiment, will be described with reference to FIGS. 21A and 21B. For a vertical JFET in the eleventh embodiment, constitutive elements similar to those in the configuration of the vertical JFET 1a described in the first embodiment are denoted by the same reference symbols. Differences from the first embodiment will be described below.

Figure 21A:
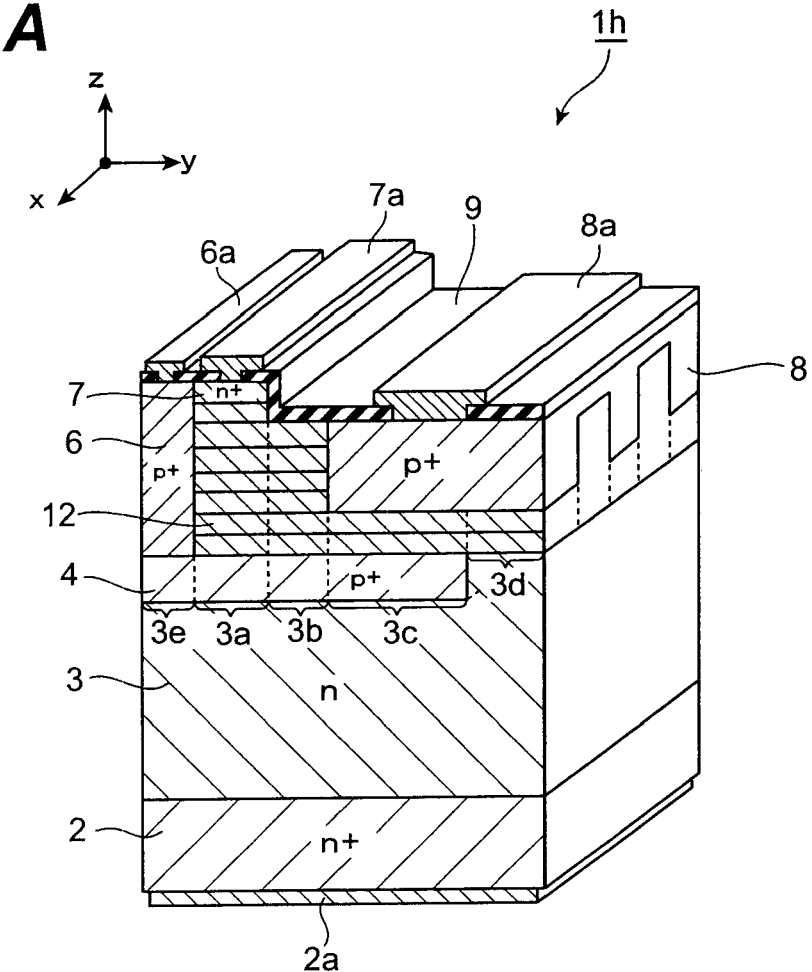
FIG. 21A is a perspective view of a vertical JFET in the eleventh embodiment.

FIG. 21A is a perspective view of a vertical JFET 1h in the eleventh embodiment. The eleventh embodiment is different in the structure of the channel semiconductor portion from the first embodiment. Namely, the eleventh embodiment has the channel semiconductor portion of pulse-doped structure.

Figure 21B:
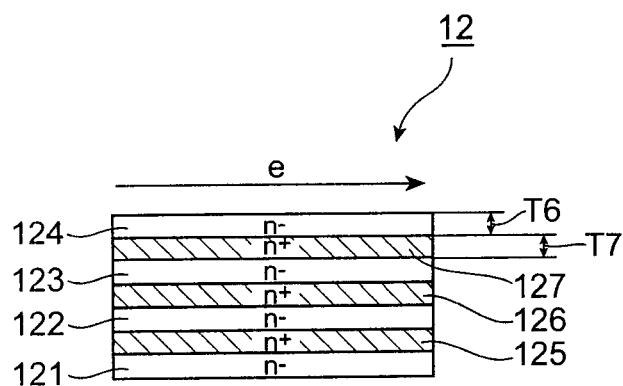
FIG. 21B is a perspective view of a pulse-doped semiconductor portion of the vertical JFET in the eleventh embodiment.

As shown in FIG. 21B, the pulse-doped semiconductor portion 12 is comprised of an alternate stack of n⁻ type SiC layers 121-124 and n⁺ type SiC layers 125-127. The n-type dopant concentration of the SiC layers 121-124 is lower than the n-type dopant concentration of the SiC layers 125-127. The dopant concentration of the n⁻ type SiC layers 121 to 124 is, for example, approximately $1\times10^{16}/cm^3$. The thickness T6 of the n⁻ type SiC layers 121-124 is, for example, about 10 nm. The dopant concentration of the n⁺ type SiC layers 125-127 is $1\times10^{17}/cm^3$ to $1\times10^{18}/cm^3$. The thickness T7 of the n⁺ type SiC layers 125 to 127 is, for example, about 10 nm. In such structure, carriers migrate in the low-concentration layers with the greater carrier mobility than in the high-concentration layers, so as to increase the electric current flowing in the channel region. As a result, the on-state resistance can be reduced.

Figure 22A:
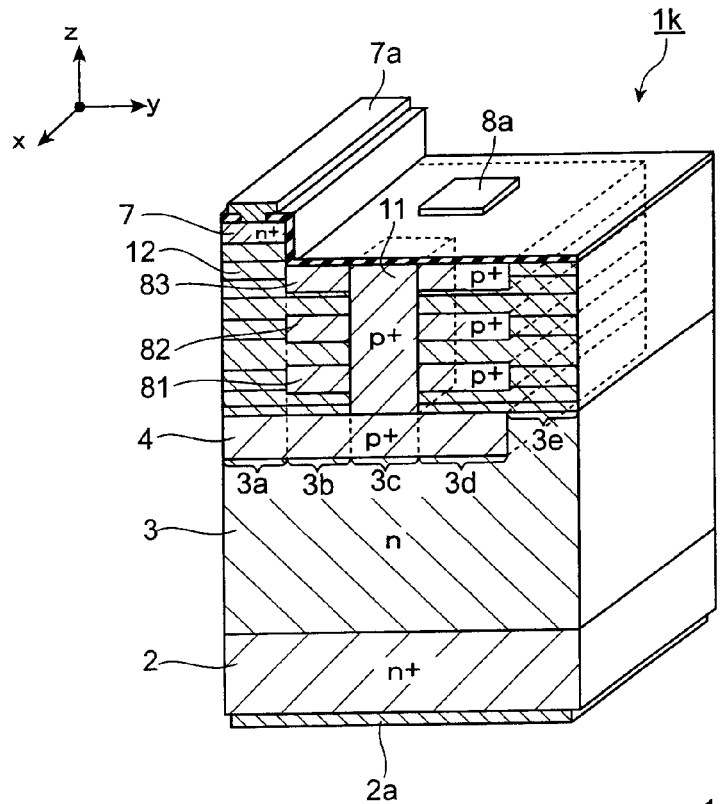
FIG. 22A is a perspective view of a vertical JFET showing another form having the pulse-doped structure.
Figure 22B:
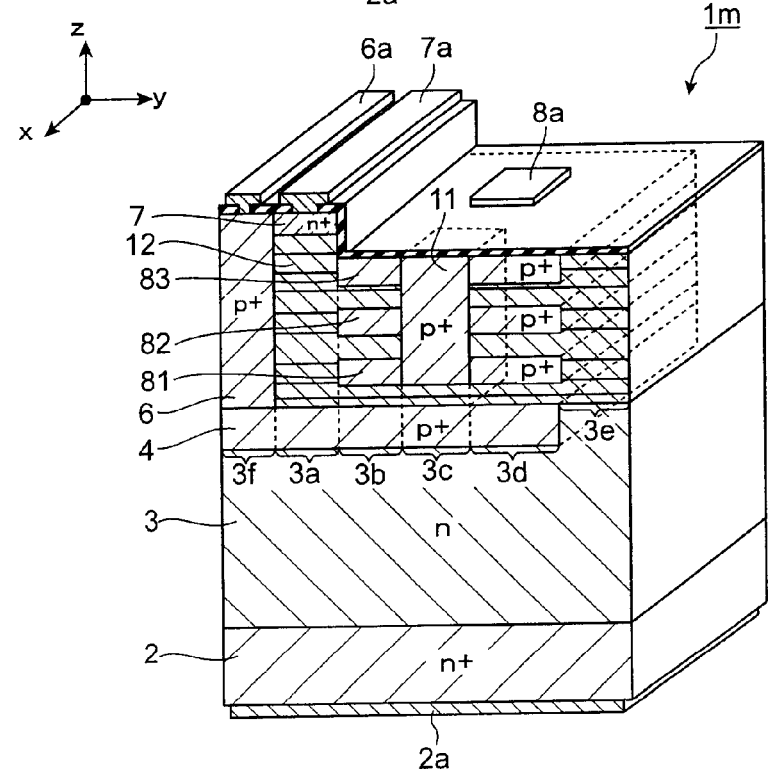
FIG. 22B is a perspective view of a vertical JFET showing still another form having the pulse-doped structure.

The pulse-doped structure is also applicable to the channel semiconductor portion of the vertical JFET 1f described in the seventh embodiment, as shown in FIG. 22A. The pulse-doped structure is also applicable to the channel semiconductor portion of the vertical JFET 1g described in the ninth embodiment, as shown in FIG. 22B.

In the vertical JFETs 1h, 1k in the present embodiment, it is also possible to adopt the structure wherein the p⁺ type buried semiconductor portion 4 and the source semiconductor portion 7 are electrically connected to the same source electrode 7a, by connecting the p⁺ type semiconductor portion 6 to the source electrode 7a, instead of the electrode 6a. This keeps the p⁺ type buried semiconductor portion 4 at the same potential as the source semiconductor portion 7, and the capacitance between the p⁺ type buried semiconductor portion and the drain semiconductor portion turns from the gate-drain capacitance to the source-drain capacitance, so as to enable high-frequency operation.

Twelfth Embodiment

Next, the twelfth embodiment, which is a modification of the first embodiment, will be described with reference to FIG. 23. For a vertical JFET in the twelfth embodiment, constitutive elements similar to those in the configuration of the vertical JFET 1a described in the first embodiment are denoted by the same reference symbols. Differences from the first embodiment will be described below.

Figure 23:
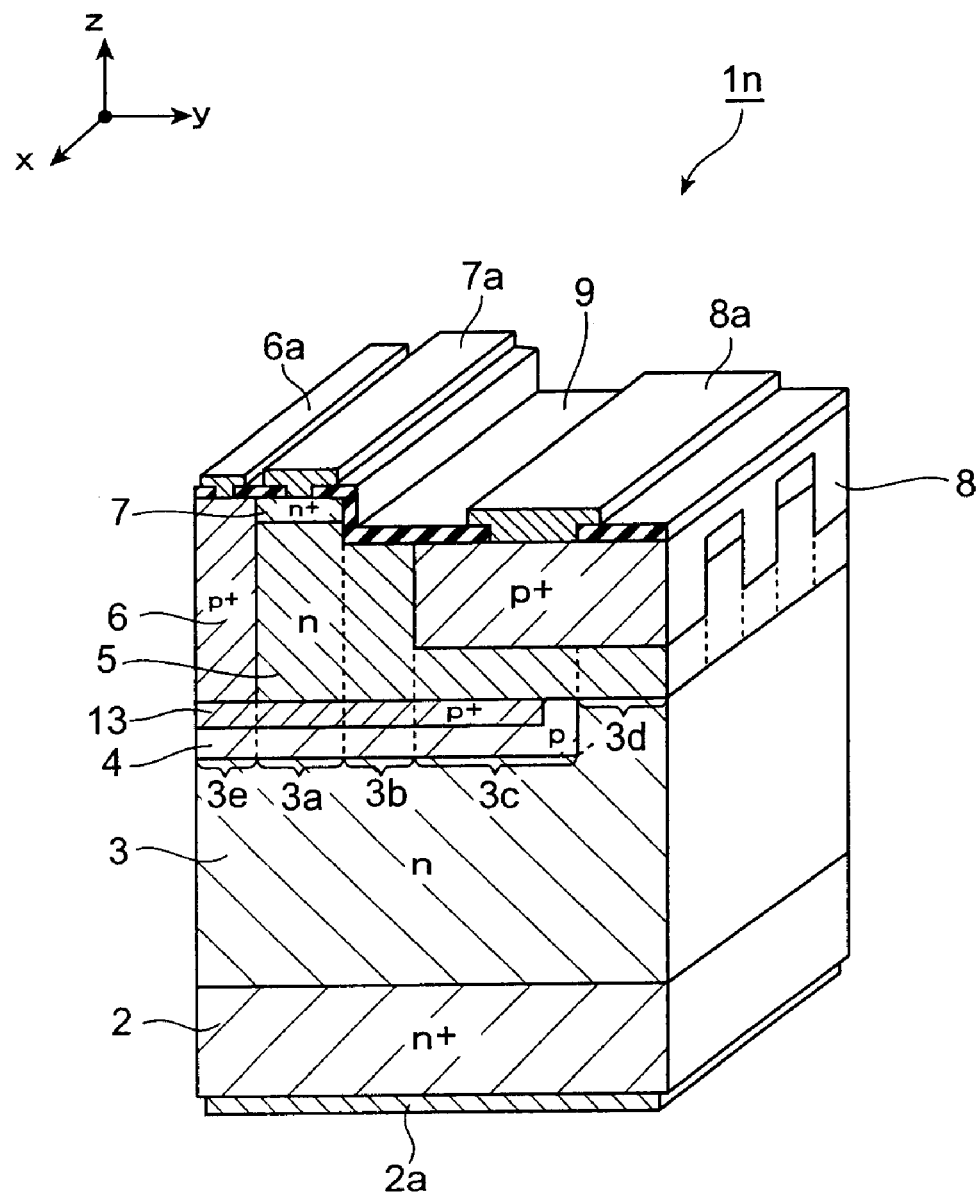
FIG. 23 is a perspective view of a vertical JFET in the twelfth embodiment.

FIG. 23 is a perspective view of a vertical JFET 1n in the twelfth embodiment. The twelfth embodiment is different in the structure of the gate semiconductor portion from the first embodiment. Namely, the twelfth embodiment is directed to a configuration wherein the vertical JFET 1n has a p⁺ type semiconductor portion 13 in the gate semiconductor portion 4. The p⁺ type semiconductor portion 13 is formed between the buried semiconductor portion 4 and the channel semiconductor portion 5 or the p⁺ type semiconductor portion 6. The p⁺ type semiconductor portion 13 is made of SiC doped with Al (aluminum) as a dopant. The gate semiconductor portion 4 is made of SiC doped with B (boron) as a dopant. Since the range of B is larger than that of Al, the gate semiconductor portion 4 is formed between the p⁺ type semiconductor portion 13 and the drift semiconductor portion 3. The dopant concentration of the gate semiconductor portion 4 is smaller than that of the p⁺ type semiconductor portion 13. In this structure the depletion layer also lengthens into the gate semiconductor portion 4, which can make the potential gradient gentler between the gate semiconductor portion and the drift semiconductor portion, so as to alleviate concentration of the electric field. It results in improving the breakdown voltage of the vertical JFET.

Figure 24A:
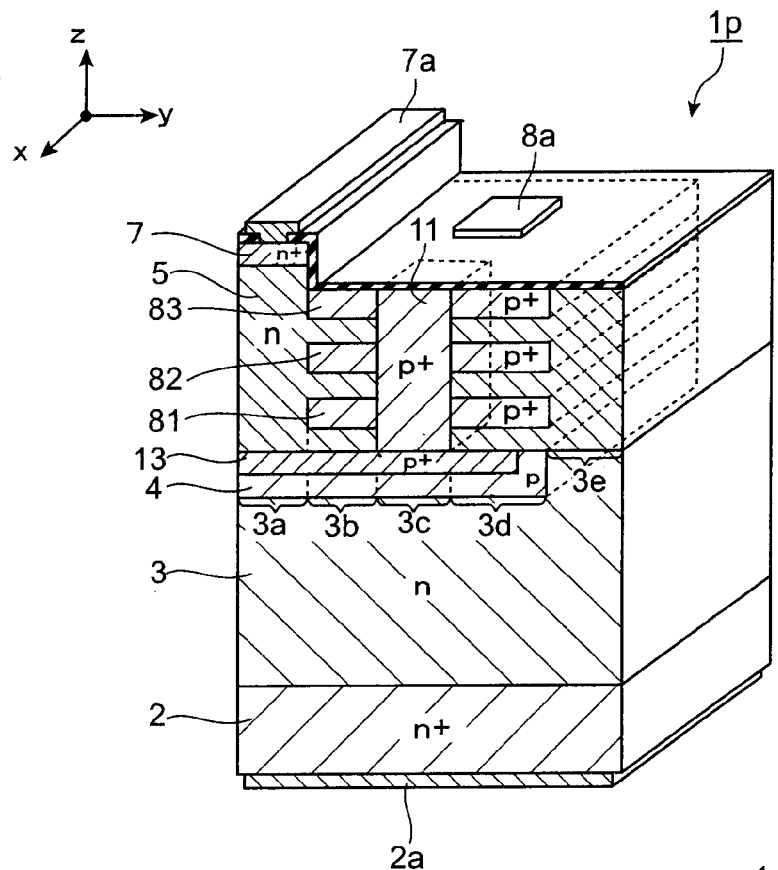
FIG. 24A is a perspective view of a vertical JFET in the twelfth embodiment.
Figure 24B:
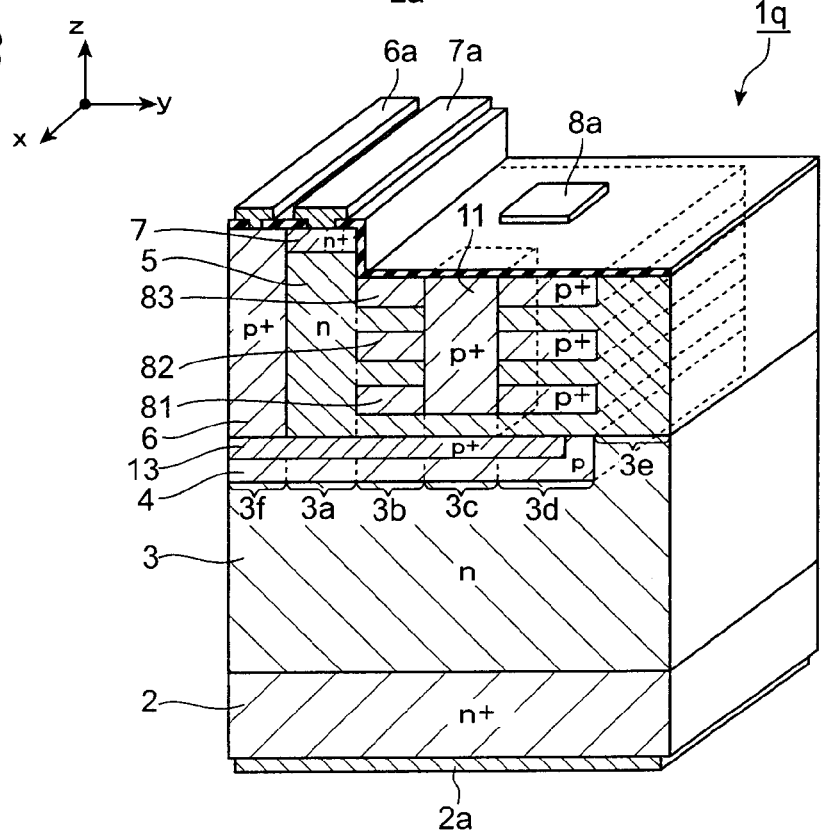
FIG. 24B is a perspective view of a vertical JFET in the twelfth embodiment.

This structure is also applicable to the gate semiconductor portion of the vertical JFET 1*f* described in the seventh embodiment, as shown in FIG. 24A. The pulse-doped structure is also applicable to the gate semiconductor portion of the vertical JFET 1*g* described in the ninth embodiment, as shown in FIG. 24B.

This structure can make the dopant concentration of the gate semiconductor portion 4 smaller than that of the p$^+$ type semiconductor portion 13. In this structure the depletion layer also lengthens into the gate semiconductor portion 4, which can make the potential gradient gentler between the gate semiconductor portion and the drift semiconductor portion, so as to alleviate concentration of the electric field. This results in improving the breakdown voltage of the vertical JFET.

In the vertical JFETs 1*n*, 1*q* in the present embodiment, it is also possible to adopt the structure wherein the p$^+$ type buried semiconductor portion 4 and the source semiconductor portion 7 are electrically connected to the same source electrode 7*a*, by connecting the p$^+$ type semiconductor portion 6 to the source electrode 7*a*, instead of the electrode 6*a*. This keeps the p$^+$ type buried semiconductor portion 4 at the same potential as the source semiconductor portion 7 and the capacitance between the p$^+$ type buried semiconductor portion and the drain semiconductor portion turns from the gate-drain capacitance to the source-drain capacitance, so as to enable high-frequency operation.

Thirteenth Embodiment

Next, the thirteenth embodiment, which is a modification of the first embodiment, will be described with reference to FIG. 25. For a vertical JFET in the thirteenth embodiment, constitutive elements similar to those in the configuration of the vertical JFET 1*a* described in the first embodiment are denoted by the same reference symbols. The structure of the drift semiconductor portion different from the first embodiment will be described below.

FIG. 25 is a sectional view of a vertical JFET 1*r* in the thirteenth embodiment. The thirteenth embodiment is different in the structure of the drift semiconductor portion from the first embodiment. Namely, the first embodiment was directed to the configuration wherein the drift semiconductor portion had the same conductivity type as the n$^+$ type drain semiconductor portion 2, whereas the thirteenth embodiment is directed to a configuration wherein the drift semiconductor portion has a Super Junction (SJ) structure composed of semiconductor regions of different conductivity types.

With reference to FIG. 25, the drift semiconductor portion is placed on a principal surface of the n$^+$ type drain semiconductor portion 2. The drift semiconductor portion has p-type semiconductor regions 31, 33 and an n-type semiconductor region 32 extending along a reference plane intersecting with the principal surface of the n$^+$ type drain semiconductor portion 2. The p-type semiconductor regions 31, 33 are arranged so as to place the n-type semiconductor region 32 in between. Junctions between the p-type semiconductor regions and the n-type semiconductor region are located between p$^+$ type gate semiconductor portions 41, 42 and the n$^+$ type drain semiconductor portion 2.

The p-type semiconductor regions 31, 33 are located between the p$^+$ type gate semiconductor portions 41, 42 and the n$^+$ type drain semiconductor portion 2 and extend along the p$^+$ type gate semiconductor portions 41, 42 (in the x-axis direction in the drawing).

The n-type semiconductor region 32 is located between the n$^+$ type drain semiconductor portion 2 and the n-type channel semiconductor portion 5 existing between the p$^+$ type gate semiconductor portion 41 and the p$^+$ type gate semiconductor portion 42 and extends along the p$^+$ type gate semiconductor portions 41, 42 (in the x-axis direction in the drawing). The n-type semiconductor region 32 has the same conductivity type as the conductivity type of the drain semiconductor portion 2.

Figure 26:
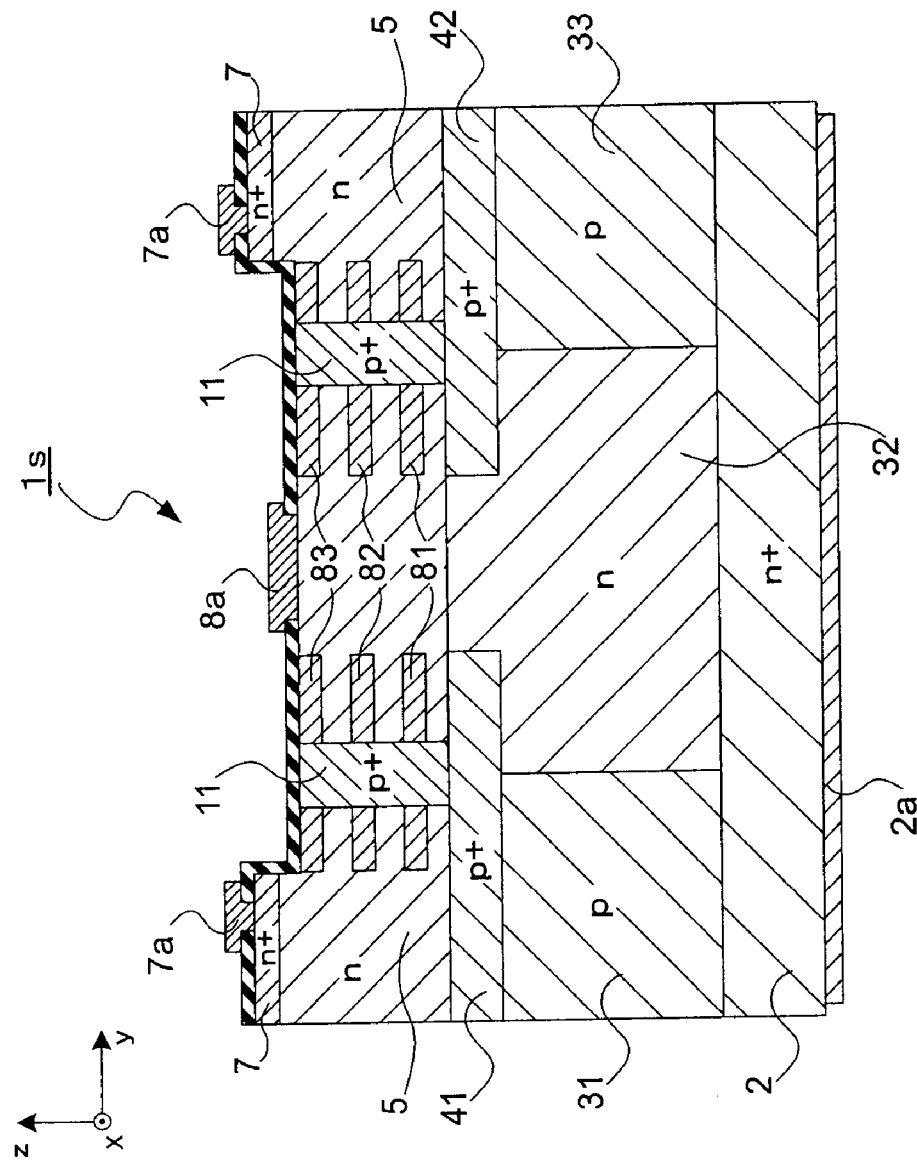
FIG. 26 is a sectional view of a vertical JFET showing another form having the super junction structure.
Figure 27:
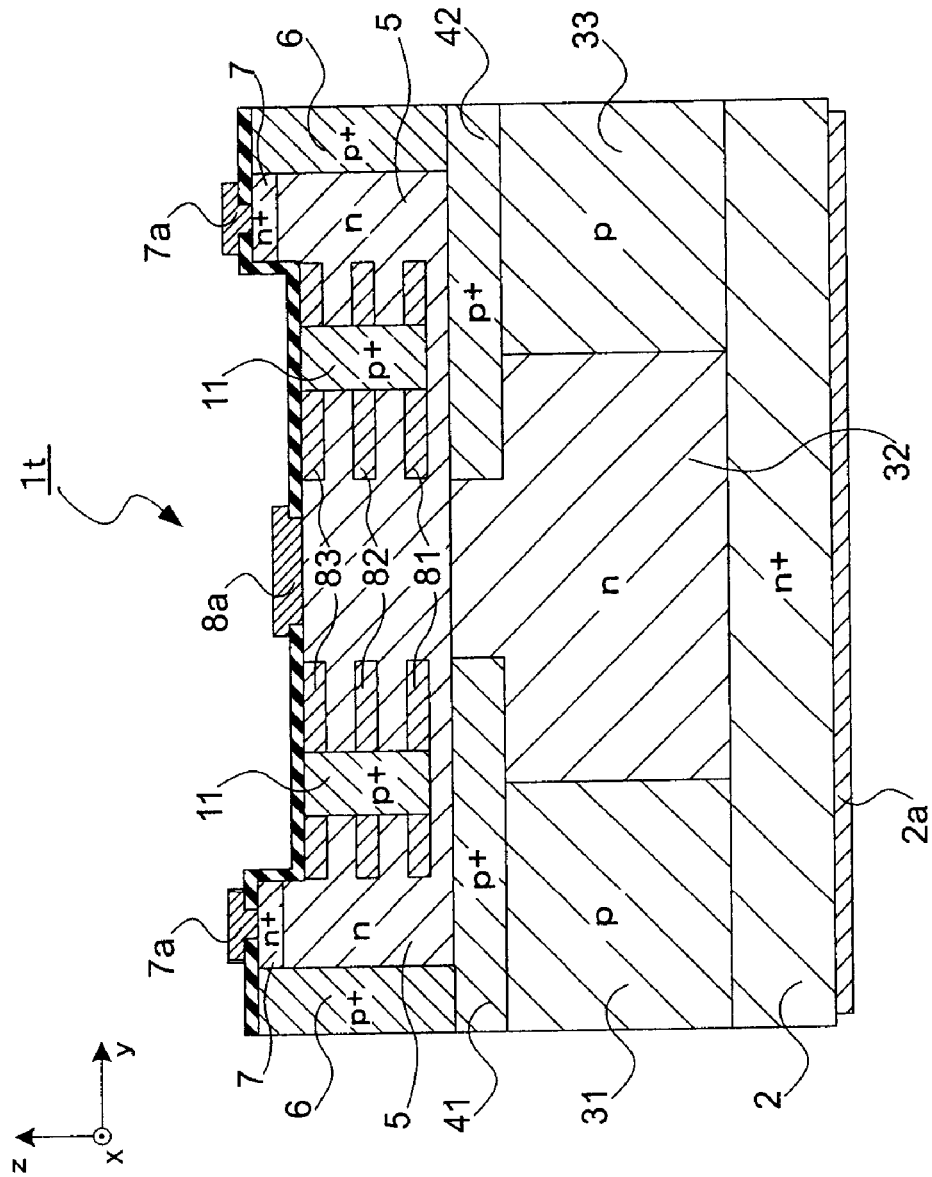
FIG. 27 is a sectional view of a vertical JFET showing still another form having the super junction structure.

FIG. 26 is a sectional view of a vertical JFET 1*s* showing another form having the super junction structure. The super junction structure is also applicable to the drift semiconductor portion of the vertical JFET 1*f* described in the seventh embodiment, as shown in FIG. 26. FIG. 27 is a sectional view of a vertical JFET 1*t* showing still another form having the super junction structure. As shown in FIG. 27, the super junction structure is also applicable to the drift semiconductor portion of the vertical JFET 1*g* described in the ninth embodiment. The super junction structure is also applicable to the vertical JFETs described in the other embodiments.

In the vertical JFETs 1*r*, 1*s*, and 1*t* in the present embodiment, the drift semiconductor portion is comprised of a plurality of semiconductor regions of different conductivity types. When the drift semiconductor portion has the structure as described above, the whole of the drift semiconductor portion is fully depleted at a high drain voltage. This results in decreasing the maximum of the electric field in the drift semiconductor portion. Therefore, the thickness of the drift semiconductor portion can be decreased. For this reason, the on-state resistance becomes lower.

The dopant concentration of the p-type semiconductor regions 31, 33 is preferably approximately equal to that of the n-type semiconductor region 32. In a preferred example where the breakdown voltage of 500 V is assumed, the dopant concentrations of the p-type semiconductor regions 31, 33 and the n-type semiconductor region 32 are approximately $2.7 \times 10^{17}$ cm$^{-3}$. In another preferred example where the breakdown voltage of 500 V is assumed, the widths (in the y-axis direction in the drawing) of the p-type semiconductor regions 31, 33 and the n-type semiconductor region 32 are approximately 0.5 μm. In this structure the depletion layer lengthens into the whole of the p-type semiconductor regions and into the whole of the n-type semiconductor region. Since the depletion layer lengthens into the both semiconductor regions in this manner, the concentration of the electric field in the drift semiconductor portion is alleviated.

Fourteenth Embodiment

Figure 28A:
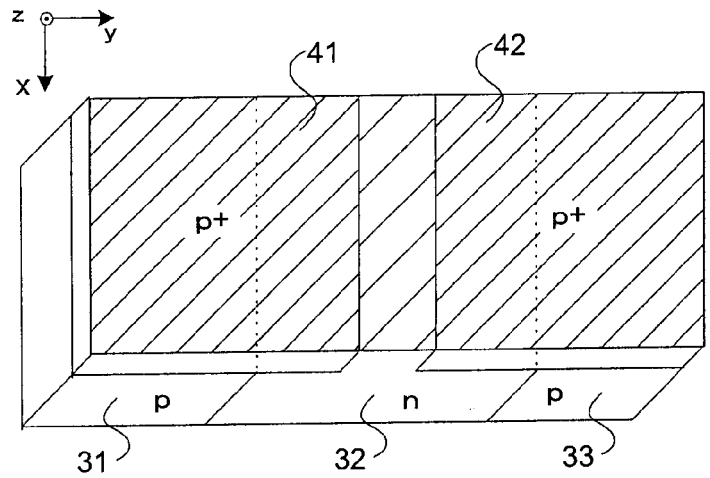
FIG. 28A is a schematic view showing a positional relation between semiconductor regions and gate semiconductor portions of a vertical JFET in the fourteenth embodiment.

The positional relation of the n-type semiconductor region and p-type semiconductor regions with the gate semiconductor portions is not limited to those described in the embodiments heretofore. FIG. 28A is a schematic diagram showing a positional relation between each of semiconductor regions and gate semiconductor portions in the fourteenth embodiment. The p-type semiconductor regions 31, 33 and the n-type semiconductor region 32 all extend in a predetermined axial direction (the x-axis direction in the drawing). The p-type semiconductor regions 31, 33 are arranged so as to place the n-type semiconductor region 32 in between. Junctions between the p-type semiconductor regions and the n-type semiconductor region are located under the p$^+$ type gate semiconductor portions 41, 42.

Figure 28B:
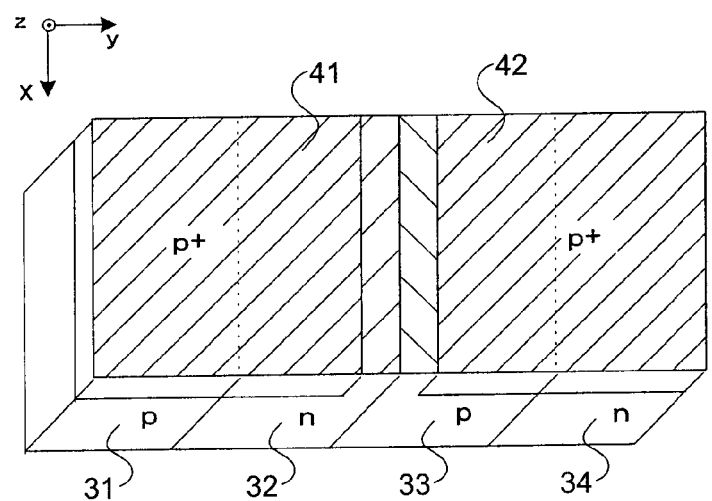
FIG. 28B is a schematic view showing a vertical JFET in the thirteenth embodiment.

In contrast to it, FIG. 28B is a schematic diagram showing another positional relation between each of semiconductor regions and gate semiconductor portions in the fourteenth embodiment. P-type semiconductor regions 31, 33 and n-type semiconductor regions 32, 34 all extend in a predetermined axial direction (the x-axis direction in the drawing). The p-type semiconductor regions 31, 33 and the n-type semiconductor regions 32, 34 are alternately arranged. Junctions between the p-type semiconductor regions and the n-type semiconductor regions are located, not only under the p+ type gate semiconductor portions 41, 42, but also between the gate semiconductor portions.

Figure 28C:
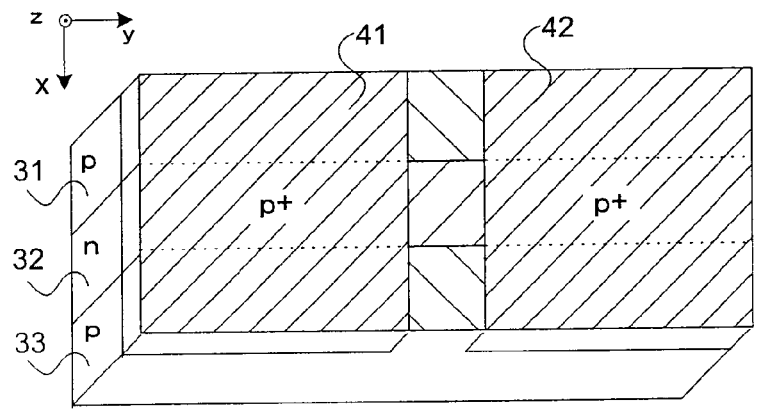
FIG. 28C is a schematic view showing a vertical JFET in still another form.

FIG. 28C is a schematic diagram showing a positional relation between each of semiconductor regions and gate semiconductor portions in still another form. P-type semiconductor regions 31, 33 and n-type semiconductor region 32 all extend in a predetermined axial direction (the y-axis direction in the drawing). The p-type semiconductor regions 31, 33 are arranged so as to place the n-type semiconductor region 32 in between. The n-type semiconductor region may consist of a plurality of regions.

Fifteenth Embodiment

The following will describe a method of forming n-type semiconductor regions and p-type semiconductor regions constituting the super junction structure, in a production method of a vertical JFET having the super junction structure.

Figure 29A:
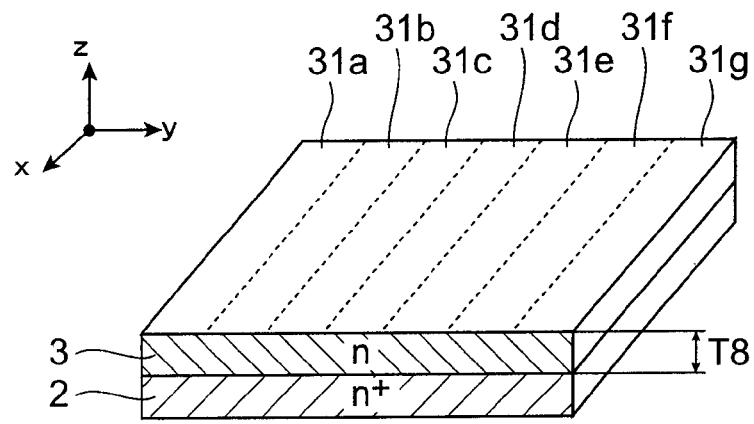
FIG. 29A is a perspective view of a vertical JFET in a drift region forming step.

(n-Type Semiconductor Layer Forming Step) First, an n+ type SiC semiconductor substrate is prepared. The n-type impurity concentration of the substrate is as high as this substrate can be used as a drain semiconductor portion. As shown in FIG. 29A, an SiC film 3 is grown on the front surface of the n+ type drain semiconductor portion 2 by epitaxial growth. In a preferred example where the breakdown voltage of 500 V is assumed, the thickness T8 of the SiC film 3 is not less than 2.0 μm nor more than 3.0 μm. The conductivity type of the SiC film 3 is the same as that of the drain semiconductor portion 2. The dopant concentration of the SiC film 3 is lower than that of the n+ type drain semiconductor portion 2. N-type semiconductor layers 32, 34, and 36 are formed from this SiC film 3.

Figure 29B:
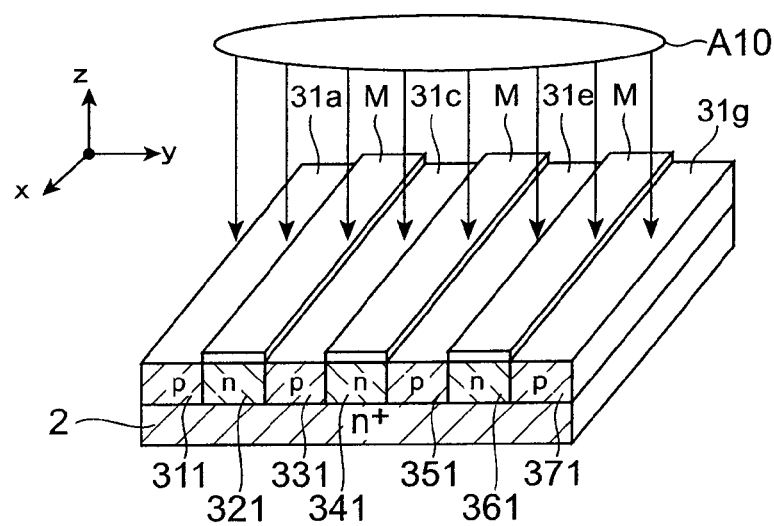
FIG. 29B is a perspective view of a vertical JFET in a p⁺ type semiconductor region forming step.

(p-Type Semiconductor Layer Forming Step) A step of forming p-type semiconductor layers will be described with reference to FIG. 29B. Using a predetermined mask M, regions 31a, 31c, 31e, and 31g formed on the n-type semiconductor layer 3 are selectively ion-implanted with a dopant A10 to form p-type semiconductor layers 311, 331, 351, and 371 having a predetermined depth. After the p-type semiconductor layers are formed, the mask M is removed.

Figure 29C:
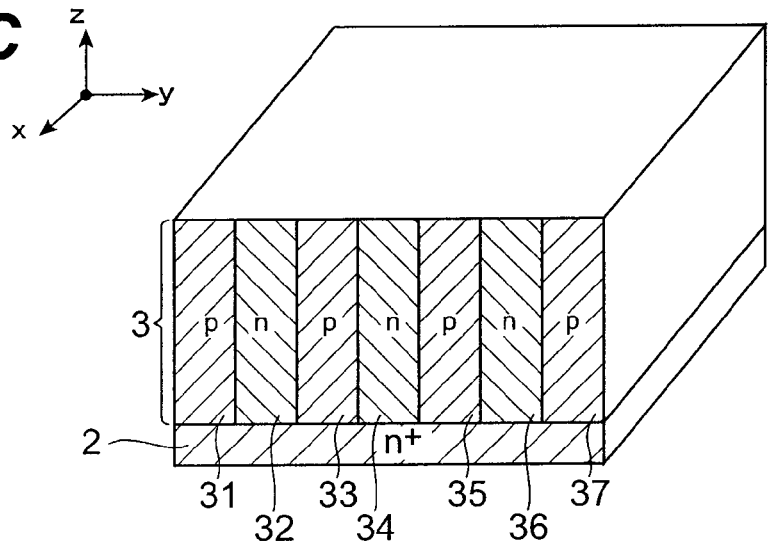
FIG. 29C is a perspective view of a vertical JFET in a source region forming step.

(Drift Semiconductor Portion Forming Step) A step of forming a drift semiconductor portion in a desired thickness will be described with reference to FIG. 29C. Namely, the n-type semiconductor layer forming step and the p-type semiconductor layer forming step are alternately repeated to form the drift semiconductor portion having the super junction structure on the n+ type drain semiconductor portion 2. As a result, the semiconductor layer 3 having a predetermined thickness (in the z-axis direction in the drawing) is formed. The above described the method of forming the drift semiconductor portion having the n-type semiconductor regions and the p-type semiconductor regions. The other steps are similar to those in the second, sixth, and eighth embodiments, but are not limited to these.

Sixteenth Embodiment

Figure 30:
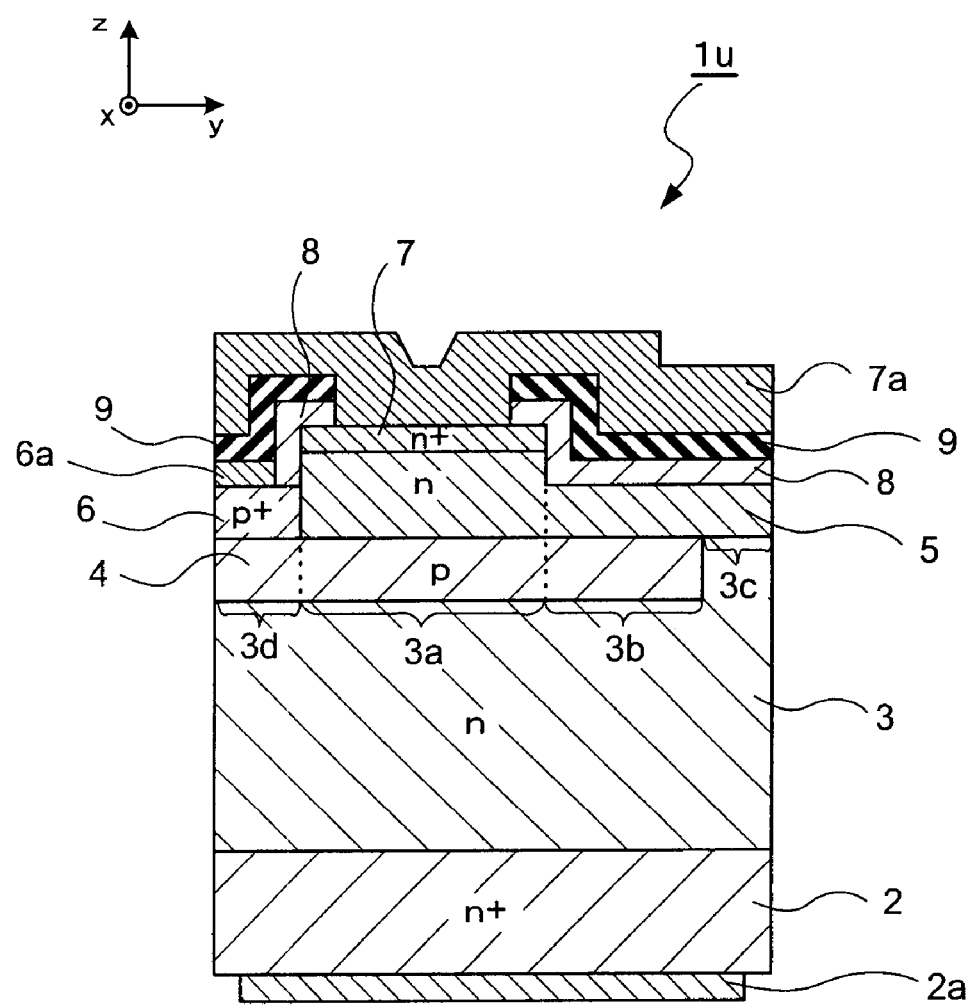
FIG. 30 is a sectional view of a vertical JFET in the sixteenth embodiment.

FIG. 30 is a sectional view of a vertical JFET 1u in the sixteenth embodiment. As shown in FIG. 30, the vertical JFET 1u has an n+ type drain semiconductor portion 2, an n-type drift semiconductor portion 3, a p-type buried semiconductor portion 4, an n-type channel semiconductor portion 5, a p+ type gate semiconductor portion 6, and an n+ type source semiconductor portion 7.

The vertical JFET 1u has a vertical structure in which the majority carriers migrate in the direction from one surface toward the other surface of this device (hereinafter referred to as a "current direction"). FIG. 30 shows a coordinate system. This coordinate system is defined so that the current direction of the JFET channel portion is aligned with the y-axis.

The n+ type drain semiconductor portion 2 has a pair of opposed surfaces. The n+ type drain semiconductor portion 2 can be a substrate doped with a dopant and, in a preferred example, this substrate is made of SiC (silicon carbide). The dopant to be added to SiC can be one of donor impurities such as N (nitrogen), P (phosphorus), and As (arsenic) which are elements of Group 5 in the periodic table. The n+ type drain semiconductor portion 2 has a drain electrode 2a on one (back surface) of the pair of surfaces. The drain electrode 2a is made of metal.

The n-type drift semiconductor portion 3 is placed on the other (front surface) of the pair of surfaces of the n+ type drain semiconductor portion 2. The n-type drift semiconductor portion 3 has first to fourth regions 3a, 3b, 3c, and 3d arranged in order in the y-axis direction, on its front surface. The first to fourth regions 3a, 3b, 3c, and 3d extend in a predetermined axial direction (the x-axis direction in FIG. 30) and, in a preferred example, they are rectangular. The p-type buried semiconductor portion 4 is placed on the first, second, and fourth regions 3a, 3b, and 3d. The channel semiconductor portion 5 is placed on the first to third regions 3a, 3b, and 3c. The conductivity type of the drift semiconductor portion 3 is the same as that of the drain semiconductor portion 2, and the dopant concentration of the drift semiconductor portion 3 is lower than the dopant concentration of the drain semiconductor portion 2. In a preferred example, the drift semiconductor portion 3 is made of SiC (silicon carbide) doped with a dopant.

The p-type buried semiconductor portion 4 is placed on the first, second, and fourth regions 3a, 3b, and 3d. The conductivity type of the buried semiconductor portion 4 is opposite to that of the drift semiconductor portion 3. In a preferred example, the p-type buried semiconductor portion 4 is made of SiC (silicon carbide) doped with a dopant. This dopant can be one of acceptor impurities such as B (boron) and Al (aluminum) which are elements of Group 3 in the periodic table.

The n-type channel semiconductor portion 5 is placed on the first to third regions 3a, 3b, and 3c. The n-type channel semiconductor portion 5 extends in a predetermined axial direction (the y-axis direction in FIG. 30) along the p-type buried semiconductor portion 4. The n-type channel semiconductor portion 5 is electrically connected to the n-type drift semiconductor portion 3 in the third region 3c. Since the conductivity type of the channel semiconductor portion 5 is opposite to that of the buried semiconductor portion 4, a pn junction is created at the interface between the buried semiconductor portion 4 and the channel semiconductor portion 5. The drain current flowing in the n-type channel semiconductor portion 5 is controlled by the p-type buried semiconductor portion 4. The dopant concentration of the n-type channel semiconductor portion 5 is lower than that of the n$^+$ type drain semiconductor portion 2. In a preferred example the n-type channel semiconductor portion 5 is made of SiC doped with a dopant. In a preferred example the channel length (in the y-axis direction in the drawing) is greater than ten times the channel thickness (in the z-axis direction in the drawing).

The p$^+$ type gate semiconductor portion 6 is placed on the p-type buried semiconductor portion 4 and fourth region 3$d$. The p$^+$ type gate semiconductor portion 6 extends in the vertical direction (the x-axis direction in FIG. 30). A gate electrode 6$a$ is placed on the front surface of the p$^+$ type gate semiconductor portion 6. The gate electrode 6$a$ is made of metal. The p$^+$ type gate semiconductor portion 6 connects the p-type buried semiconductor portion 4 to the gate electrode 6$a$.

The n$^+$ type source semiconductor portion 7 is placed on the n-type channel semiconductor portion 5 and first region 3$a$. The source semiconductor portion 7 has the same conductivity type as the conductivity type of the drain semiconductor portion 2. The source semiconductor portion 7 is connected through the channel semiconductor portion 5 to the drift semiconductor portion 3. A source electrode 7$a$ is placed on the n$^+$ type source semiconductor portion 7. The source electrode 7$a$ is made of metal. The n-type channel semiconductor portion 5 is isolated from the source electrode 7$a$ by insulating films 8, 9 such as silicon oxide films.

Seventeenth Embodiment

Next, a production method of the vertical JFET 1$u$ will be described. FIGS. 31A to 31C, FIGS. 32A to 32C, FIGS. 33A to 33C, FIGS. 34A to 34C, and FIG. 35 are sectional views showing production steps of the vertical JFET 1$u$ in the seventeenth embodiment.

Figure 31A:
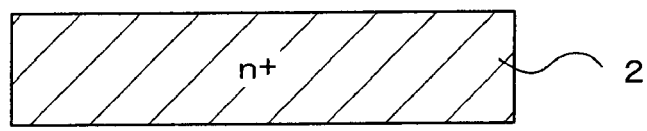
FIG. 31A is a sectional view in a drain semiconductor film forming step.

(Drain Semiconductor Film Forming Step) First, a substrate is prepared as shown in FIG. 31A. An example of the substrate is an n$^+$ type SiC semiconductor substrate. The dopant concentration of the substrate is as high as the substrate can be used as the drain semiconductor portion 2.

Figure 31B:
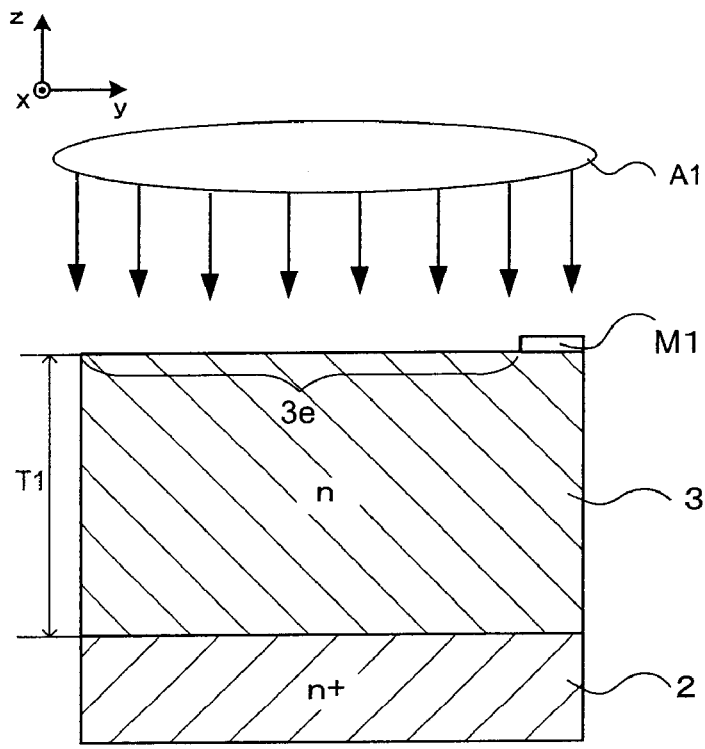
FIG. 31B is a sectional view in a drift semiconductor film forming step.

(Drift Semiconductor Film Forming Step) As shown in FIG. 31B, an SiC film 3 is grown on the front surface of the n$^+$ type drain semiconductor portion 2 by epitaxial growth. The thickness T1 of the SiC film 3 is, for example, 10 μm. The conductivity type of the SiC film 3 is the same as that of the n$^+$ type drain semiconductor portion 2. The dopant concentration of the SiC film 3 is lower than that of the n$^+$ type drain semiconductor portion 2. The dopant concentration of the SiC film 3 is, for example, approximately $1\times10^{16}$/cm$^3$. The n-type drift semiconductor portion is formed from this SiC film 3.

Figure 31C:
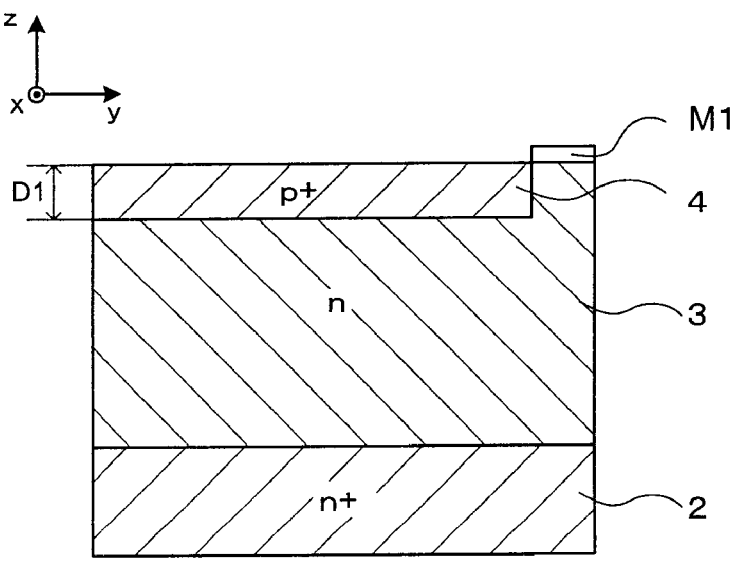
FIG. 31C is a sectional view in a gate semiconductor portion forming step.

(Buried Semiconductor Portion Forming Step) A step of forming a buried semiconductor portion will be described with reference to FIG. 31C. A mask M1 having a pattern extending in a predetermined axial direction (the x-axis direction in the drawing) is formed. Using this mask M1, a region 3$e$ formed on the SiC film 3 is selectively ion-implanted with a dopant A1 to form a p-type buried semiconductor portion 4 having a predetermined depth. The depth D1 of the p-type buried semiconductor portion 4 is, for example, about 1.2 μm. The dopant concentration of the p-type buried semiconductor portion 4 is, for example, about $1\times10^{18}$/cm$^3$. After the buried semiconductor portion is formed, the mask M1 is removed.

Figure 32A:
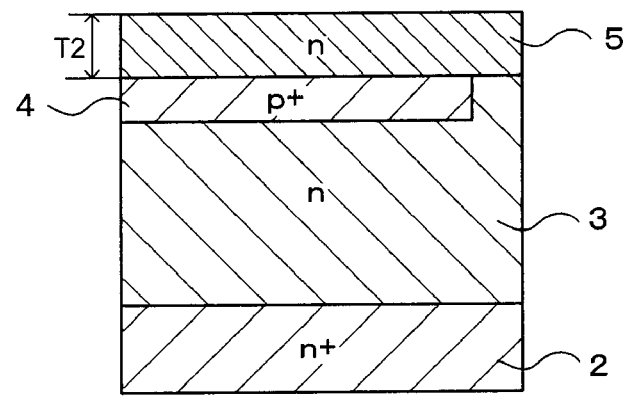
FIG. 32A is a sectional view in a channel semiconductor film forming step.

(Channel Semiconductor Film Forming Step) As shown in FIG. 32A, an SiC film 5 is grown on the front surface of the p-type buried semiconductor portion 4 and on the SiC film 3 by epitaxial growth. The thickness T2 of the SiC film 5 is, for example, approximately 0.3 μm. The conductivity type of the SiC film 5 is the same as that of the n$^+$ type drain semiconductor portion 2. The dopant concentration of the SiC film 5 is lower than the dopant concentration of the n$^+$ type drain semiconductor portion 2. The dopant concentration of the SiC film 5 is, for example, approximately $1\times10^{17}$/cm$^3$. The n-type channel semiconductor portion is formed from this SiC film 5. In the present embodiment a single SiC film was formed for each of the n-type drift semiconductor portion and the n-type channel semiconductor portion, but the production method may include a plurality of film forming steps of repeatedly forming SiC films for each of the drift semiconductor portion and the channel semiconductor portion. It is also possible to adopt a desired dopant concentration profile for the SiC film, so as to make the SiC film 3 serve as the drift semiconductor portion and the channel semiconductor portion.

Figure 32B:
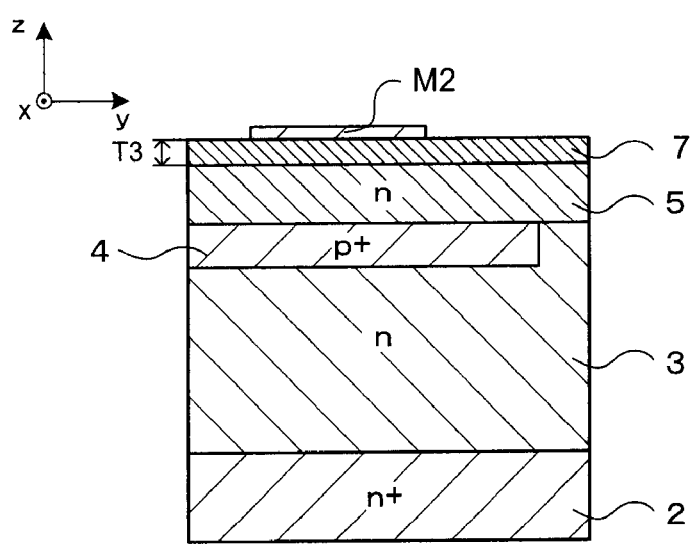
FIG. 32B is a sectional view in a source semiconductor film forming step.

(Source Semiconductor Film Forming Step) As shown in FIG. 32B, an SiC film 7 for n$^+$ type source layer is grown on the front surface of the SiC film 5 by epitaxial growth. The thickness T3 of the SiC film 7 is, for example, approximately 0.2 μm. The conductivity type of the SiC film 7 is the same as that of the n$^+$ type drain semiconductor portion 2. The dopant concentration of the SiC film 7 is higher than the dopant concentration of the SiC film 5. A mask M2 having a pattern extending in a predetermined axial direction (the x-axis direction in the drawing) is formed.

Figure 32C:
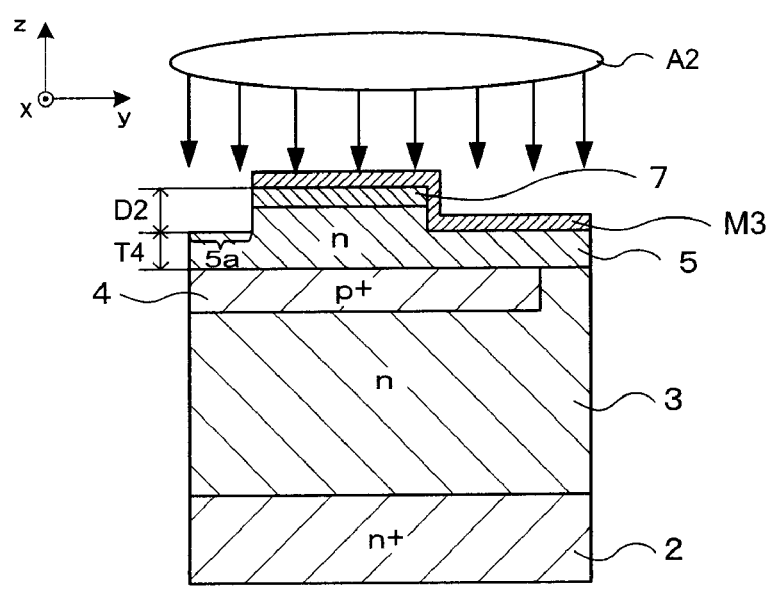
FIG. 32C is a sectional view in a source semiconductor portion forming step.

(Source and Channel Semiconductor Portion Forming Step) A step of forming a source semiconductor portion will be described with reference to FIG. 32C. Using the mask M2, the n$^+$ type source layer 7, and the SiC film 5 and SiC film 3 are selectively etched up to a depth D2. As a result, the part of the n$^+$ type source layer 7 and SiC film 5 covered by the mask M2 remains unetched, so as to form an n$^+$ type source semiconductor portion. The thickness T4 of the SiC film 5 on the front surface of the p-type buried semiconductor portion in the regions not covered by the mask largely affects the characteristics of JFET (intrinsic channel semiconductor portion). The etching depth D2 is, for example, approximately 0.4 μm, and the thickness T4 of the etched SiC film 5 is, for example, approximately 0.1 μm. After the source semiconductor portion is formed, the mask M2 is removed. A mask M3 having a pattern extending in a predetermined axial direction (the x-axis direction in the drawing) is formed.

Figure 33A:
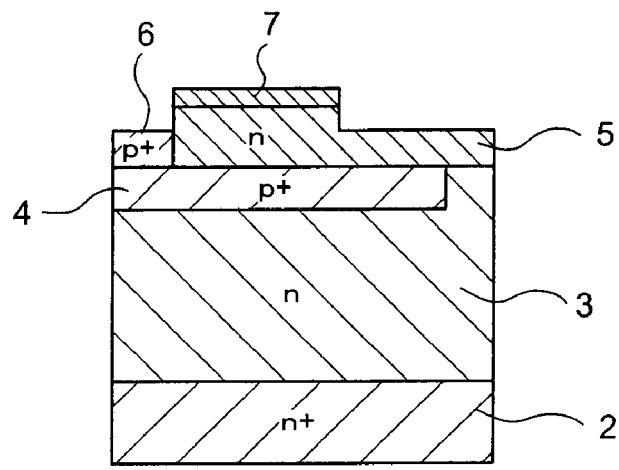
FIG. 33A is a sectional view in a p⁺ type gate semiconductor portion forming step.

(p$^+$ Type Semiconductor Portion Forming Step) A step of forming a p$^+$ type gate semiconductor portion will be described with reference to FIG. 32C. Using the mask M3, a region 5$a$ formed on the SiC film 5 is selectively ion-implanted with a dopant A2 to form a p$^+$ type gate semiconductor portion 6. With reference to FIG. 33A, the p$^+$ type gate semiconductor portion 6 reaching the p-type buried semiconductor portion 4 is formed in the semiconductor portion 5. After the p$^+$ type semiconductor portion is formed, the mask M3 is removed.

Figure 33B:
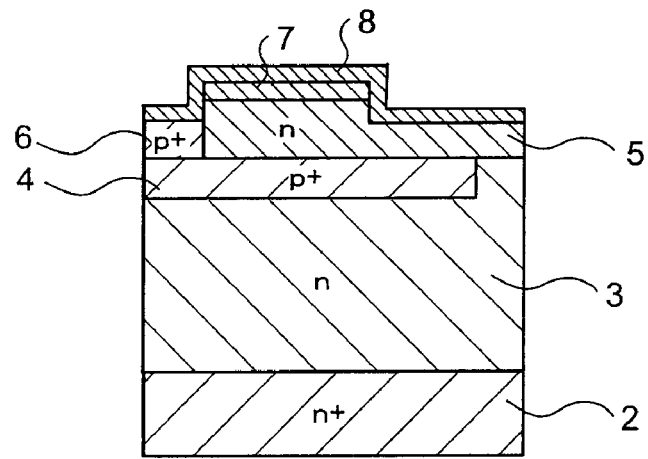
FIG. 33B is a sectional view in a thermal oxidation step.

(Thermal Oxidation Step) A step of thermally oxidizing the vertical JFET 1$u$ will be described with reference to FIG. 33B. The vertical JFET 1$u$ is subjected to a thermal oxidation treatment. The thermal oxidation treatment is a treatment of exposing SiC to an oxidizing atmosphere at a high temperature (e.g., about 1200° C.), to bring about chemical reaction of silicon in each semiconductor portion with oxygen to form a silicon oxide film (SiO$_2$). As a result, the front surface of each semiconductor portion is covered by an oxide film 8.

Figure 33C:
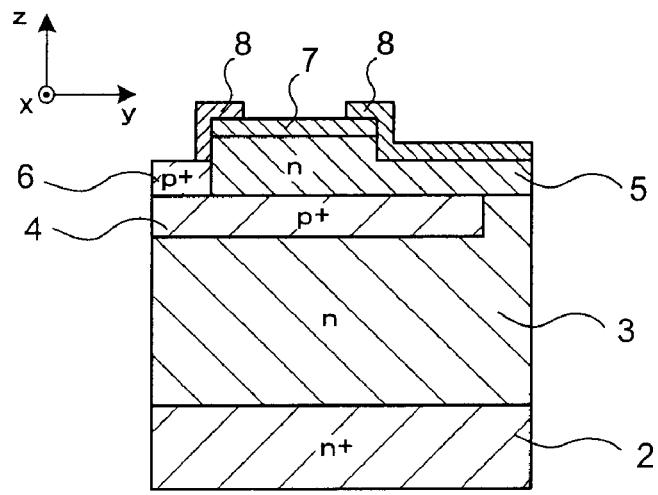
FIG. 33C is a sectional view in an aperture forming step.

(Aperture Forming Step) A step of forming apertures for formation of gate electrodes will be described with reference to FIG. 33C. Using a mask of a photoresist, the oxide film 8 is selectively etched to form apertures. Front surface parts of the p$^+$ type gate semiconductor portion 6 and the n$^+$ type source semiconductor portion 7 are exposed in the respective apertures. The exposed portions become conducting portions one to the gate electrode and the other to the source electrode. After the apertures are formed, the resist mask is removed.

Figure 34A:
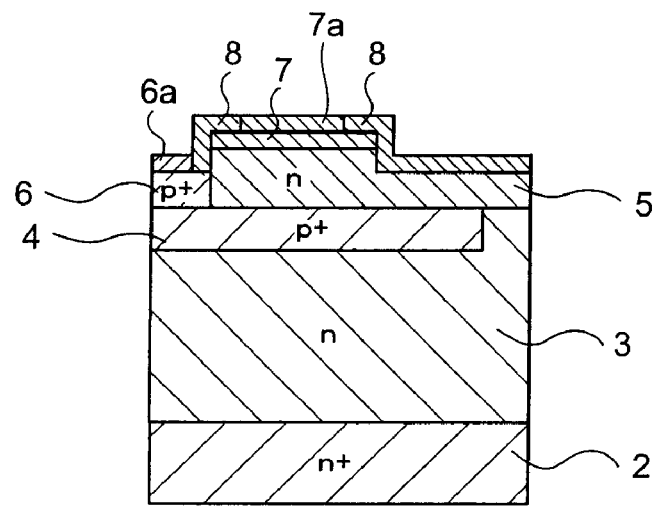
FIG. 34A is a sectional view in a gate electrode forming step.

(Electrode Forming Step) A step of forming electrodes will be described with reference to FIG. 34A. A metal film for electrodes, for example, Ni is deposited on the front surface of the vertical JFET 1u. Next, a mask of a photoresist having a predetermined shape is formed. Using this mask, the metal film for electrodes is selectively etched. As a result, the part of the metal film for electrodes covered by the resist pattern remains unetched, to form a gate electrode 6a and a source ohmic electrode 7a. After the electrodes are formed, the resist mask is removed.

It is also possible to adopt a method of directly depositing the metal film for the electrode material including the area on the photoresist, without removing the photoresist pattern in the aperture forming step, and thereafter removing the metal film on the photoresist simultaneously with the removal of the photoresist. After the electrodes are formed on the front surface, the entire front surface is covered by a resist, a metal film for an electrode material is deposited over the entire front surface, and the resist on the front surface is removed. Then a thermal treatment is carried out in an inert gas atmosphere such as argon at a high temperature (e.g., 1050° C.), thereby forming ohmic connections between each electrode (source, drain, or gate) and each semiconductor portion.

Figure 34B:
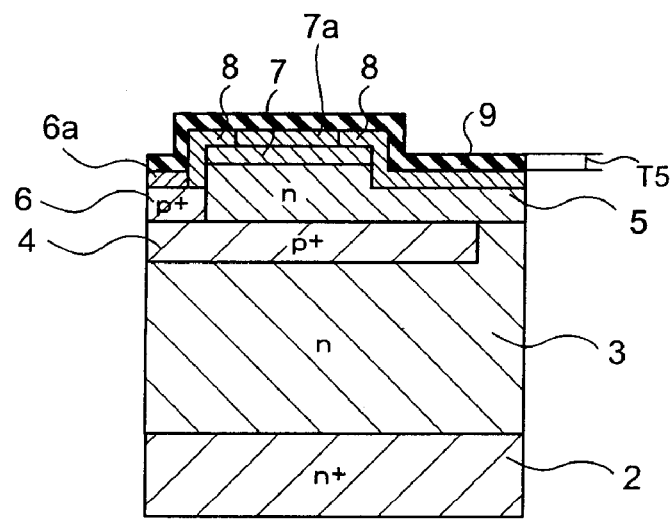
FIG. 34B is a sectional view in an insulating film forming step.

(Insulating Film Forming Step) A step of forming an insulating film will be described with reference to FIG. 34B. An insulating film 9 of $SiO_2$ or SiON is formed over the entire front surface of the vertical JFET 1u by CVD (Chemical Vapor Deposition) or the like.

Figure 34C:
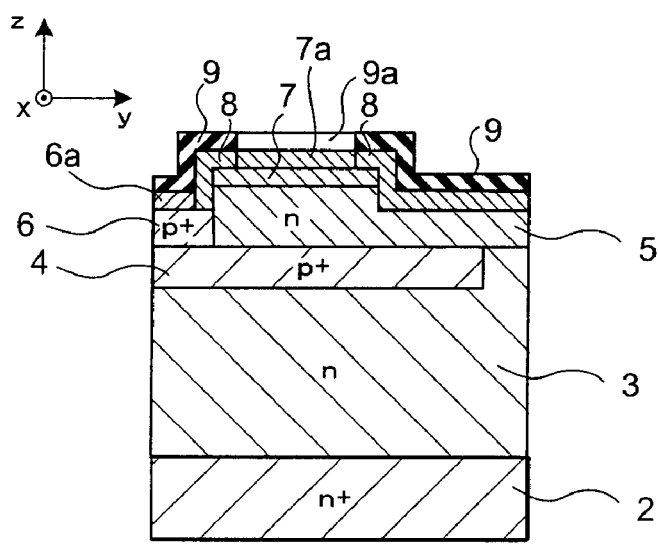
FIG. 34C is a sectional view in an aperture forming step.

(Aperture Forming Step) A step of forming an aperture for formation of the source electrode will be described with reference to FIG. 34C. Using a mask of a photoresist, the oxide film 8 and insulating film 9 are selectively etched to form a contact hole 9a. The front surface part of the source ohmic electrode 7a is exposed in the aperture. The exposed portion becomes a conducting part to the source electrode. The contact hole 9a is formed so as to reach the source ohmic electrode 7a. After the contact hole 9a is formed, the resist mask is removed.

Figure 35:
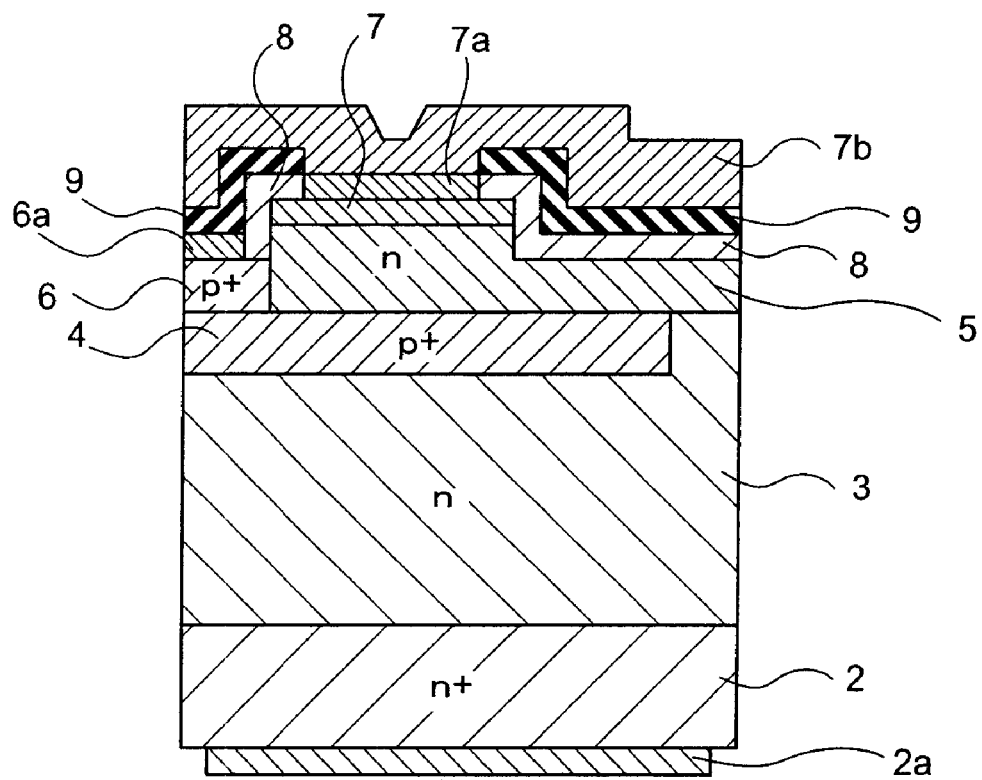
FIG. 35 is a sectional view in a source electrode forming step.

(Electrode Forming Step) Next, a step of forming a source electrode will be described with reference to FIG. 35. The source electrode 7b is formed so as to be in contact with the front surface of the source semiconductor portion 7. The source electrode 7b is in contact with the source semiconductor portion 7 through the contact hole 9a shown in FIG. 34C. The material of the wiring metal film can be suitably selected from aluminum (Al) and Al alloys in terms of low resistance, easiness of microprocessing, and adhesion, but may be copper (Cu) or tungsten (W). However, the material is not limited to these.

The vertical JFET 1u in the sixteenth embodiment is completed through the steps described above. In the structure of the vertical JFET 1u, the p-type buried semiconductor portion 4 and the n-type channel semiconductor portion 5 can be arranged on the n-type drift semiconductor portion 3. Therefore, a desired drain blocking voltage can be acquired by the thickness of the n-type drift semiconductor portion 3, without increasing the chip size. Consequently, the breakdown voltage between the source and the drain can be improved. Carriers flow not only under the n-type channel semiconductor portion 5, but also in the n-type drift semiconductor portion 3 located under the p-type buried semiconductor portion 4. Accordingly, the on-state resistance can be lowered while maintaining the breakdown voltage. Namely, the present structure is suitable for high-breakdown-voltage JFETs.

In the present embodiment the semiconductor portions of the drain, source, and gate are made of SiC. SiC is superior in the following respects to such semiconductors as Si (silicon) and GaAs (gallium arsenide). Namely, since SiC has a high melting point and a large bandgap (forbidden band width), it facilitates operation at high temperatures of the device. Since SiC has a large breakdown electric field, it enables achievement of high breakdown voltage and low loss. Furthermore, it has high thermal conductivity and thus presents the advantage of facilitating heat liberation.

Eighteenth Embodiment

Next, the eighteenth embodiment, which is a modification of the sixteenth embodiment, will be described with reference to FIG. 36. For a vertical JFET in the eighteenth embodiment, constitutive elements similar to those in the configuration of the vertical JFET 1u described in the sixteenth embodiment are denoted by the same reference symbols. A configuration of the channel semiconductor portion different from the sixteenth embodiment will be described below.

Figure 36:
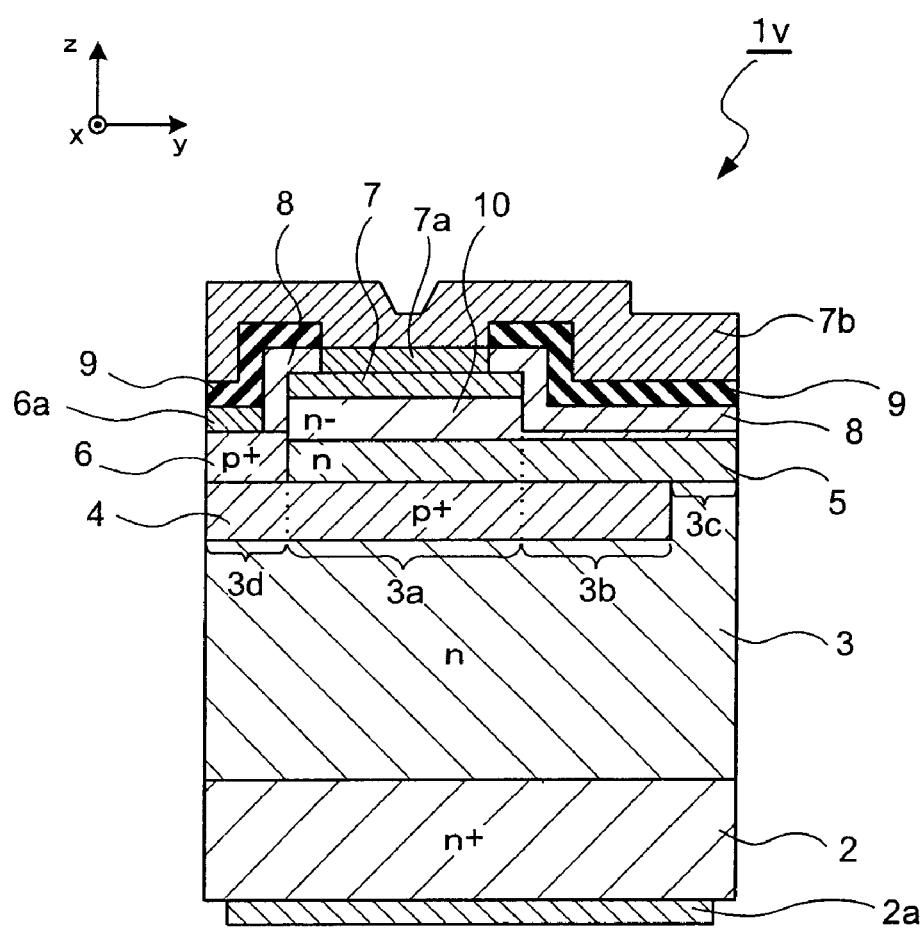
FIG. 36 is a sectional view of a vertical JFET in the eighteenth embodiment.

FIG. 36 is a sectional view of a vertical JFET 1v in the eighteenth embodiment. The eighteenth embodiment is different in the structure of the channel region from the sixteenth embodiment. Specifically, the sixteenth embodiment was directed to the configuration wherein the n-type channel semiconductor portion 5 was in contact with the $n^+$ type source semiconductor portion 7 above the first region 3a, whereas the eighteenth embodiment is directed to a configuration wherein the vertical JFET 1v further has an $n^-$ type semiconductor portion 10 between the n-type channel semiconductor portion 5 and the $n^+$ type source semiconductor portion 7. In this structure the n-type channel semiconductor portion 5 is not subjected to etching, so that the thickness of the channel semiconductor portion is not affected by variations due to the etching step. Therefore, it is feasible to decrease the individual differences in electrical characteristics among vertical JFETs 1v.

The $n^-$ type semiconductor portion 10 is placed on the n-type channel semiconductor portion 5 and the first to third regions 3a, 3b, and 3c. The conductivity type of the semiconductor portion 10 is the same as that of the channel semiconductor portion 5. The dopant concentration of the $n^-$ type semiconductor portion 10 is lower than that of the n-type channel semiconductor portion 5. The dopant concentration of the $n^-$ type semiconductor portion 10 is, for example, approximately $1 \times 10^{16}/cm^3$. In a preferred example, the $n^-$ type semiconductor portion 10 is made of SiC (silicon carbide) doped with a dopant.

The channel structure consisting of the n-type semiconductor portion and the $n^-$ type semiconductor portion described in the present embodiment is applicable not only to the sixteenth embodiment, but also to all the embodiments described hereinafter (the twentieth to twenty eighth embodiments).

Nineteenth Embodiment

Figure 37A:
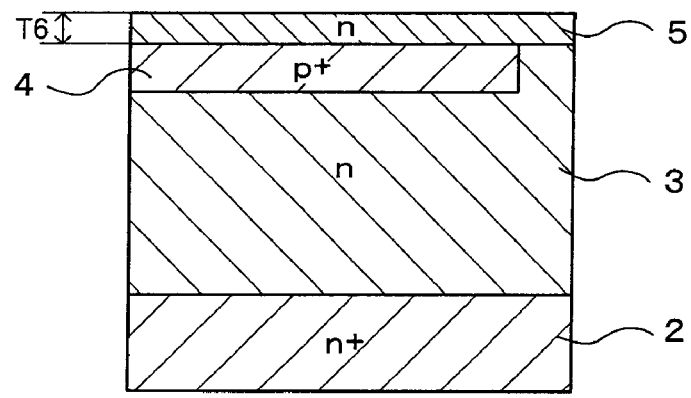
FIG. 37A is a sectional view in a channel semiconductor film forming step.

Next, the nineteenth embodiment, which is a modification of the seventeenth embodiment, will be described with reference to FIGS. 37A to 37C. For a production method of a vertical JFET in the nineteenth embodiment, constitutive elements similar to those in the production method of the vertical JFET 1u described in the seventeenth embodiment are denoted by the same reference symbols. The following will describe a channel semiconductor film forming step, an $n^-$ type semiconductor film forming step, and a source semiconductor portion forming step different from the seventeenth embodiment.

(Channel Semiconductor Film Forming Step) The channel semiconductor film forming step is carried out in succession to the gate semiconductor portion forming step. As shown in FIG. 37A, an SiC film 5 is grown on the front surface of the p$^+$ type gate semiconductor portion 4 and on the SiC film 3 by epitaxial growth. The thickness T6 of the SiC film 5 is, for example, approximately 0.1 μm. The conductivity type of the SiC film 5 is the same as that of the n$^+$ type drain semiconductor portion 2. The dopant concentration of the SiC film 5 is lower than that of the n$^+$ type drain semiconductor portion 2. The dopant concentration of the SiC film 5 is, for example, approximately $1\times10^{17}/cm^3$. The n-type channel semiconductor portion is formed from this SiC film 5.

Figure 37B:
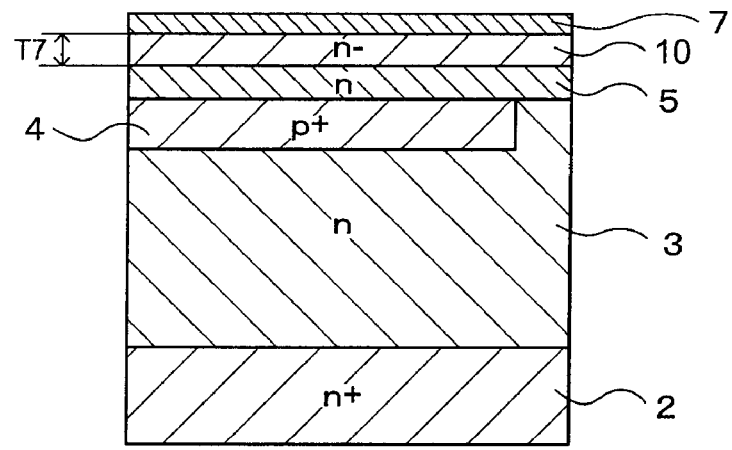
FIG. 37B is a sectional view in an n⁻ type semiconductor film forming step.
Figure 37C:
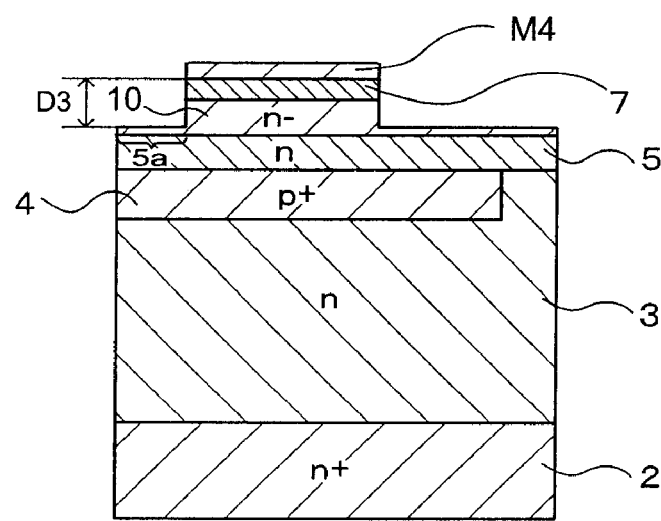
FIG. 37C is a sectional view in a source semiconductor portion forming step.

(n$^-$ Type Semiconductor Film Forming Step) As shown in FIG. 37B, an SiC film 10 is grown on the front surface of the SiC film 5 by epitaxial growth. The thickness T7 of the SiC film 10 is, for example, approximately 0.2 μm. The conductivity type of the SiC film 10 is the same as that of the SiC film 5. The dopant concentration of the SiC film 10 is lower than that of the SiC film 5. The dopant concentration of the SiC film 10 is, for example, approximately $1\times10^{16}/cm^3$. The n$^-$ type semiconductor portion is formed from this SiC film 10.

(Source Semiconductor Film Forming Step) Subsequently, a step of forming a source semiconductor film will be described with reference to FIG. 37B. An SiC film 7 for n$^+$ type source layer is formed on the front surface of the SiC film 10 by epitaxial growth. The thickness of the SiC film 7 is, for example, approximately 0.2 μm. The conductivity type of the SiC film 7 is the same as that of the n$^+$ type drain semiconductor portion 2. The dopant concentration of the SiC film 7 is higher than that of the SiC film 10 and is, for example, approximately $1\times10^{19}/cm^3$.

(Source Semiconductor Portion Forming Step) A step of forming a source semiconductor portion will be described with reference to FIG. 37C. A mask M4 having a pattern covering a predetermined region is formed. Using the mask M4, the n$^+$ type source layer 7 and the n$^-$ type semiconductor layer 10 are selectively etched. As a result, the n$^+$ type source layer 7 and n$^-$ type semiconductor layer 10 covered by the resist pattern remain unetched in part, so as to become an n$^+$ type source semiconductor portion. The etching depth D3 is so deep as not to reach the semiconductor layer 5. After the source semiconductor portion is formed, the mask M4 is removed.

The above described the channel semiconductor film forming step, n$^-$ type semiconductor film forming step, and source semiconductor portion forming step different from the seventeenth embodiment. The p$^+$ type semiconductor portion forming step is carried out in succession to the source semiconductor portion forming step. The other steps are similar to those in the seventeenth embodiment. According to the production method of the vertical JFET in the present embodiment, the SiC film 5 is not etched in the source semiconductor portion forming step. Therefore, the thickness of the channel semiconductor portion is not affected by variations due to the etching step. Therefore, it is feasible to decrease individual differences in electrical characteristics among transistors.

Twentieth Embodiment

Figure 38:
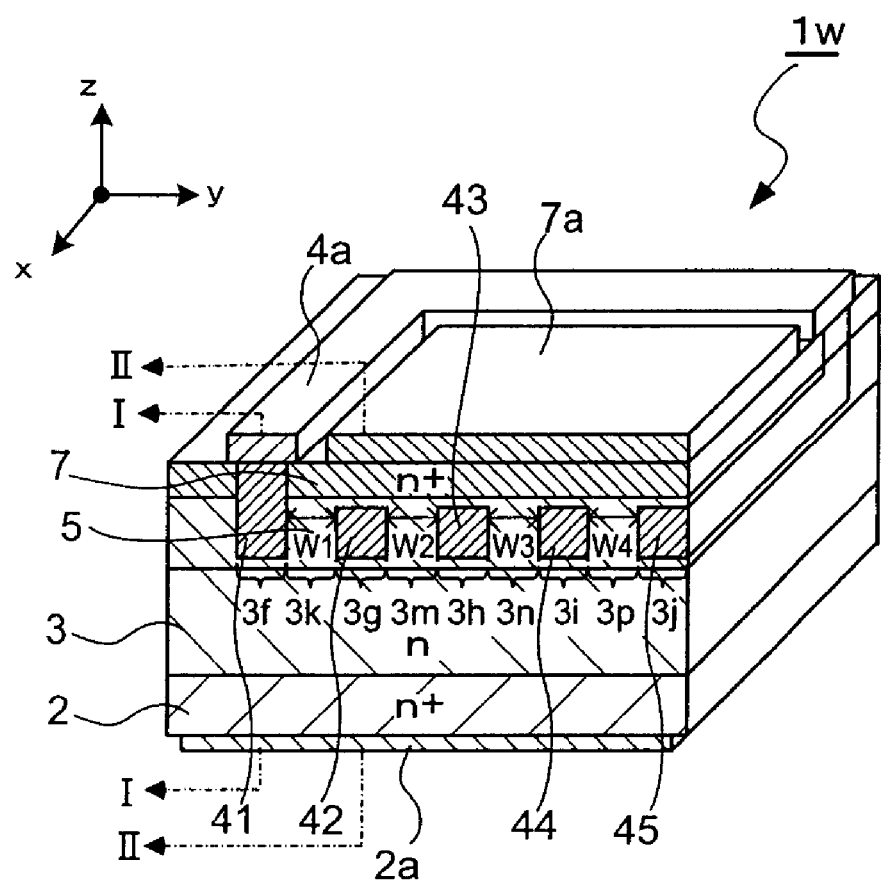
FIG. 38 is a perspective view of a vertical JFET in the twentieth embodiment.

A vertical JFET 1w in the twentieth embodiment will be described. FIG. 38 is a perspective view of the vertical JFET 1w. As shown in FIG. 38, the vertical JFET 1w has an n$^+$ type drain semiconductor portion 2, an n-type drift semiconductor portion 3, p$^+$ type gate diffused semiconductor portions 41, 42, 43, 44, and 45, an n-type channel semiconductor portion 5, and an n$^+$ type source semiconductor portion 7 having a mass source electrode 7a on its front surface.

The p$^+$ type gate diffused semiconductor portions 41 to 45 function as gate wiring for external connections provided in the peripheral part of a primitive cell or a semiconductor chip of transistors and as a gate for controlling the channel width. Namely, the p$^+$ type gate diffused semiconductor portions 41 to 45 are formed as buried inside the n-type channel semiconductor portion 5, at predetermined intervals in the y-axis direction. Each of the p$^+$ type gate diffused semiconductor portions 41 to 45 extends in a predetermined axial direction (the x-axis direction in FIG. 38). In a preferred example, the p$^+$ type gate diffused semiconductor portions 41 to 45 are made of SiC (silicon carbide) doped with a dopant. A gate electrode 4a is placed so as to surround the mass source electrode 7a described hereinafter.

The n$^+$ type source semiconductor portion 7 is placed on the n-type channel semiconductor portion 5. The source semiconductor portion 7 has the same conductivity type as the conductivity type of the drain semiconductor portion 2. The n$^+$ type source semiconductor portion 7 is connected through the n-type channel semiconductor portion 5 to the n-type drift semiconductor portion 3. The mass source electrode 7a is placed on the front surface of the n$^+$ type source semiconductor portion 7. The mass source electrode 7a is made of metal. The p$^+$ type gate diffused semiconductor portion 41 and n$^+$ type source semiconductor portion 7 are electrically connected by the mass source electrode 7a.

The structure of the vertical JFET 1w in the present embodiment obviates the need for gate wiring on the front surface because the gate wiring is buried inside the semiconductor. Therefore, the wiring on the front surface of a chip is simplified from the viewpoint of the entire semiconductor chip comprised of a plurality of transistors. It is also feasible to decrease the surface area of the chip.

Twenty First Embodiment

Next, the twenty first embodiment, which is a modification of the sixteenth embodiment, will be described with reference to FIG. 39. For a vertical JFET in the twenty first embodiment, constitutive elements similar to those in the configuration of the vertical JFET 1u described in the sixteenth embodiment are denoted by the same reference symbols. Differences from the sixteenth embodiment will be described below.

Figure 39:
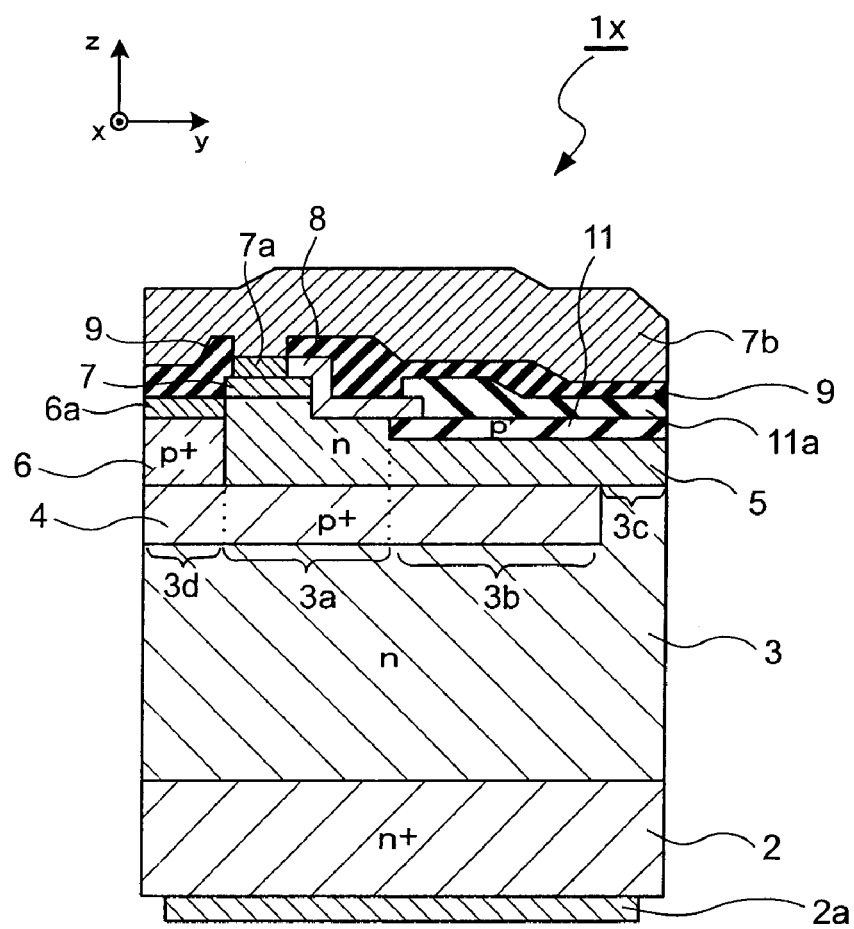
FIG. 39 is a sectional view of a vertical JFET in the twenty first embodiment.

FIG. 39 is a sectional view of a vertical JFET 1x in the twenty first embodiment. The twenty first embodiment is different in the structure of the gate semiconductor portion from the sixteenth embodiment. Namely, the twenty first embodiment is directed to a configuration wherein a p$^+$ type gate semiconductor portion 11 is placed on the n-type channel semiconductor portion 5 and the second and third regions 3b, 3c.

The conductivity type of the gate semiconductor portion 11 is opposite to that of the channel semiconductor portion 5. The p-type dopant concentration of the gate semiconductor portion 11 is higher than the n-type dopant concentration of the channel semiconductor portion 5, so that the depletion layer lengthens in the channel semiconductor portion. The dopant concentration of the p$^+$ type gate semiconductor portion 11 is, for example, approximately $1\times10^{18}/cm^3$. In a preferred example, the p-type gate semiconductor portion 11 is made of SiC doped with a dopant. The thickness of the p-type gate semiconductor portion is, for example, approximately 0.3 µm. Since the vertical JFET 1x has the n-type channel semiconductor portion 5 between the p-type buried semiconductor portion 4 and the p-type gate semiconductor portion 11, the channel can be controlled from both sides of the n-type channel semiconductor portion 5. This structure increases the controllable channel width, in comparison with a case where the channel is controlled from one side of the n-type channel semiconductor portion 5. This substantializes the structure for easy implementation of the normally-off transistor.

Twenty Second Embodiment

Figure 40A:
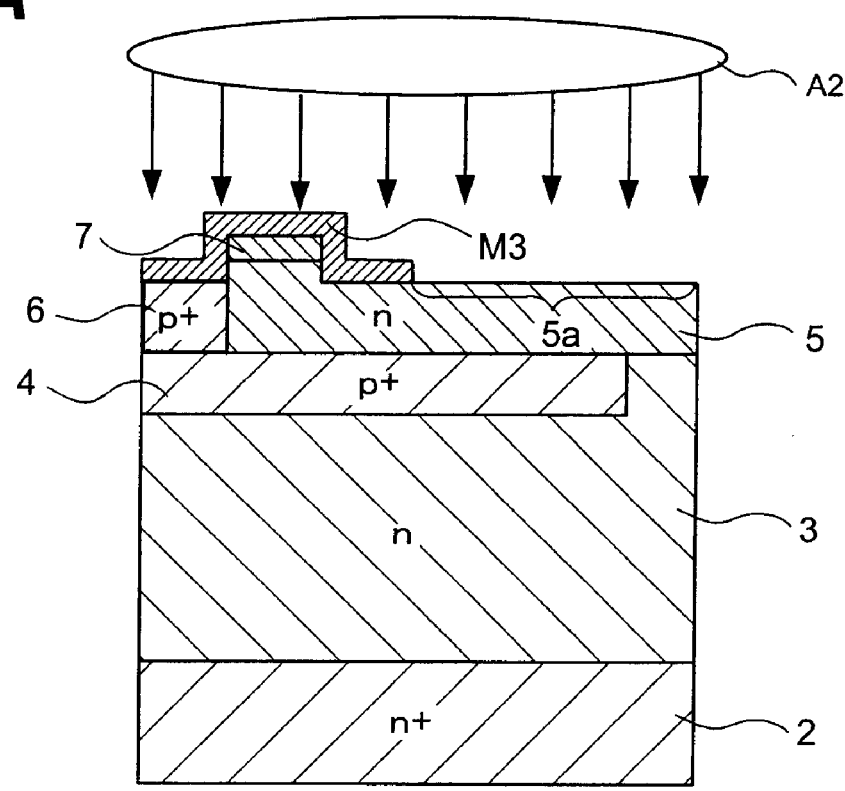
FIG. 40A is a sectional view in a p⁺ type gate semiconductor portion forming step.
Figure 40B:
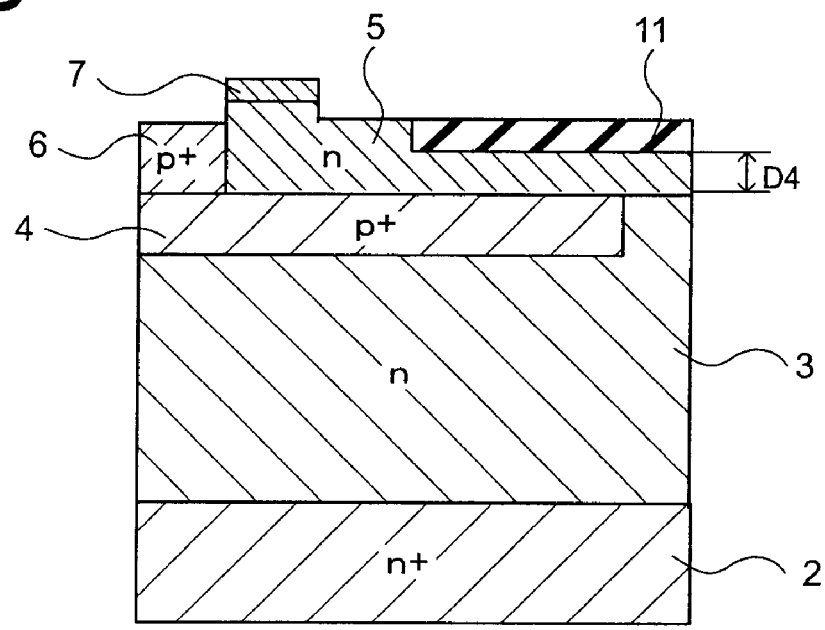
FIG. 40B is a sectional view after formation of a p⁺ type gate semiconductor portion.

Next, the twenty second embodiment, which is a modification of the seventeenth embodiment, will be described with reference to FIGS. 40A and 40B. For a production method of a vertical JFET in the twenty second embodiment, constitutive elements similar to those in the production method of the vertical JFET 1u described in the seventeenth embodiment are denoted by the same reference symbols. The following will describe a $p^+$ type gate semiconductor portion forming step different from the seventeenth embodiment.

($p^+$ Type Gate Semiconductor Portion Forming Step) The $p^+$ type gate semiconductor portion forming step is carried out in succession to the $p^+$ type semiconductor portion forming step. A step of forming a $p^+$ type gate semiconductor portion will be described with reference to FIG. 40A. Using a mask M3 having a predetermined shape, a region 5a on the SiC film 5 is selectively ion-implanted with a dopant A2 to form a $p^+$ type gate semiconductor portion 11 having a predetermined depth. The depth D4 of the channel layer defined through the formation of the $p^+$ type gate semiconductor portion 11 is determined according to the threshold of the vertical JFET. For example, D4 is approximately 0.2 µm. After the gate semiconductor portion is formed, the mask M3 is removed. As a result, the vertical JFET as shown in FIG. 40B is obtained. The above described the $p^+$ type gate semiconductor portion forming step different from the seventeenth embodiment. A thermal oxidation step is carried out in succession to the $p^+$ type gate semiconductor portion forming step. The other steps are similar to those in the seventeenth embodiment, but are not limited to it.

Twenty Third Embodiment

The twenty third embodiment, which is a modification of the twenty first embodiment, will be described with reference to FIG. 41. For a vertical JFET in the twenty third embodiment, constitutive elements similar to those in the configuration of the vertical JFET 1x described in the twenty first embodiment are denoted by the same reference symbols. The following will describe the structure of the gate semiconductor portion different from the twenty first embodiment.

Figure 41:
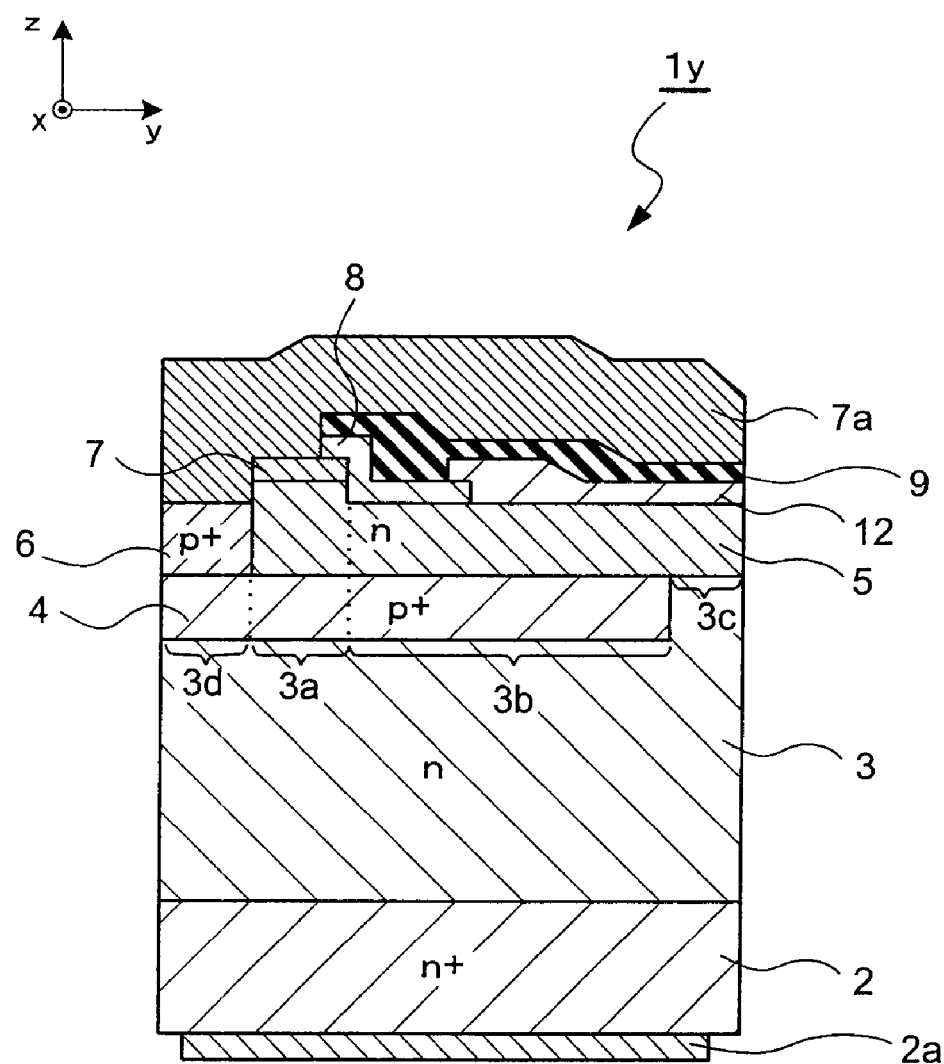
FIG. 41 is a sectional view of a vertical JFET in the twenty third embodiment.

FIG. 41 is a sectional view of a vertical JFET 1y in the twenty third embodiment. The twenty third embodiment is different in the structure of the gate semiconductor portion from the twenty first embodiment. Namely, the twenty third embodiment is directed to a configuration wherein the vertical JFET 1y has a $p^+$ type gate semiconductor portion 12. The pn junction between the n-type channel semiconductor portion 5 and the $p^+$ type gate semiconductor portion 12 is a heterojunction. The n-type channel semiconductor portion 5 is made of SiC. The $p^+$ type gate semiconductor portion 12 is made of polysilicon. This obviates the need for the epitaxial growth step of SiC for formation of the $p^+$ type gate semiconductor portion 11 described in the twenty first embodiment, and thus enables easy construction of the vertical JFET 1y.

Twenty Fourth Embodiment

Next, the twenty fourth embodiment, which is a modification of the twenty first embodiment, will be described with reference to FIGS. 42A and 42B. For a vertical JFET in the twenty fourth embodiment, constitutive elements similar to those in the configuration of the vertical JFET 1x described in the twenty first embodiment are denoted by the same reference symbols. Differences from the twenty first embodiment will be described below.

Figure 42A:
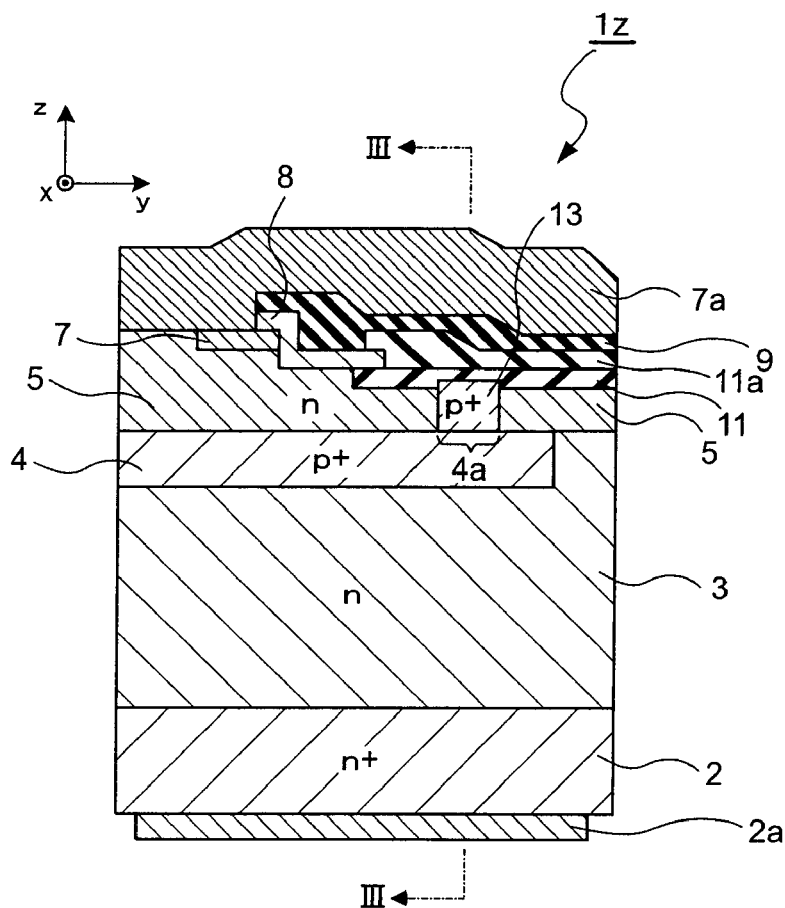
FIG. 42A is a sectional view of a vertical JFET in the twenty fourth embodiment.

FIG. 42A is a sectional view of a vertical JFET 1z in the twenty fourth embodiment. The twenty fourth embodiment is different in the structure of the gate semiconductor portion from the twenty first embodiment. Namely, the twenty fourth embodiment is directed to a configuration wherein the channel region is located between the $p^+$ type gate semiconductor portion 4 and the $p^+$ type gate semiconductor portion 11. The vertical JFET 1z further has $p^+$ type semiconductor portions 13 placed in the channel region of the n-type channel semiconductor portion 5. The $p^+$ type semiconductor portions 13 are placed on a region 4a of the $p^+$ type gate semiconductor portion 4. The $p^+$ type semiconductor portions 13 are placed so as to partially penetrate the n-type channel semiconductor portion 5.

Figure 42B:
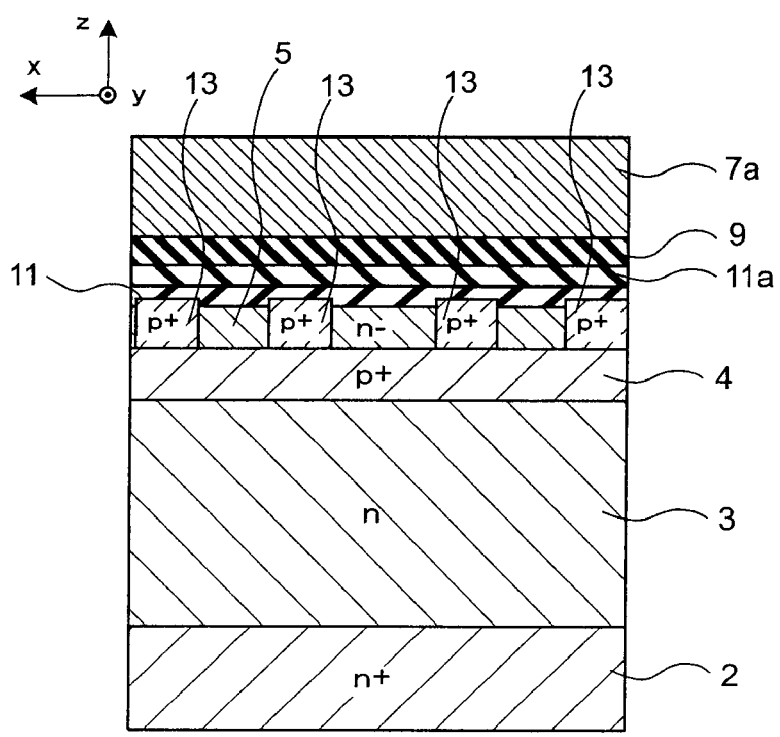
FIG. 42B is a sectional view along III-III line of the vertical JFET in the twenty fourth embodiment.

FIG. 42B is a sectional view along III-III line of the vertical JFET 1z. As shown in FIG. 42B, the $p^+$ type semiconductor portions 13 are arranged at predetermined intervals in the x-axis direction inside the n-type channel semiconductor portion 5. The dopant concentration of the $p^+$ type semiconductor portions 13 is higher than that of the n-type channel semiconductor portion 5. For this reason, the depletion layer lengthens mainly in the n-type channel semiconductor portion 5. In a preferred example, the $p^+$ type semiconductor portions 13 are made of SiC doped with a dopant. In the vertical JFET 1z, the $p^+$ type gate semiconductor portion 4 is electrically connected through the $p^+$ type semiconductor portions 13 to the $p^+$ type gate semiconductor portion 11. This keeps the $p^+$ type gate semiconductor portion 4 at the same potential as the $p^+$ type gate semiconductor portion 11, and it is thus feasible to increase the thickness of the channel layer.

Twenty Fifth Embodiment

Next, the twenty fifth embodiment, which is a modification of the sixteenth embodiment, will be described with reference to FIGS. 43A and 43B. For a vertical JFET in the twenty fifth embodiment, constitutive elements similar to those in the configuration of the vertical JFET 1u described in the sixteenth embodiment are denoted by the same reference symbols. Differences from the sixteenth embodiment will be described below.

Figure 43A:
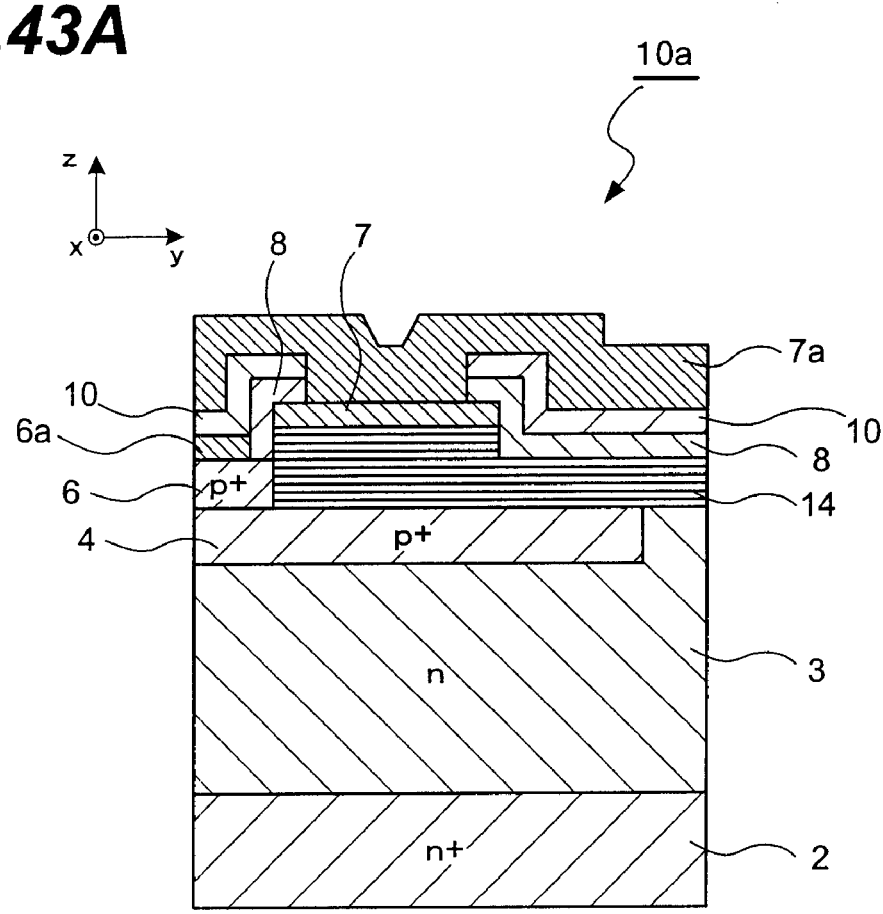
FIG. 43A is a sectional view of a vertical JFET in the twenty fifth embodiment.

FIG. 43A is a sectional view of a vertical JFET 10a in the twenty fifth embodiment. The twenty fifth embodiment is different in the structure of the channel semiconductor portion from the sixteenth embodiment. Namely, the twenty fifth embodiment is directed to a configuration wherein the channel semiconductor portion has the pulse-doped structure.

Figure 43B:
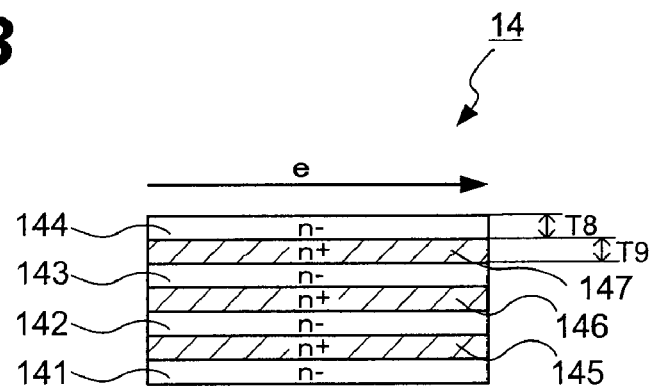
FIG. 43B is a sectional view of a pulse-doped semiconductor portion of the vertical JFET in the twenty fifth embodiment.

As shown in FIG. 43B, the pulse-doped semiconductor portion 14 is comprised of an alternate stack of $n^-$ type SiC layers 141 to 144 and $n^+$ type SiC layers 145 to 147. The dopant concentration of the $n^-$ type SiC layers 141 to 144 is lower than that of the $n^+$ type SiC layers 145 to 147. The dopant concentration of the $n^-$ type SiC layers 141 to 144 is, for example, approximately $1\times10^{16}$/cm$^3$. The thickness T8 of the $n^-$ type SiC layers 141 to 144 is, for example, about 10 nm. The dopant concentration of the $n^+$ type SiC layers 145 to 147 is $1\times10^{17}$/cm$^3$ to $1\times10^{18}$/cm$^3$. The thickness T9 of the $n^+$ type SiC layers 145 to 147 is, for example, about 10 nm. In such structure, carriers migrate in the low-concentration layers with larger carrier mobility than in the high-concentration layers, so as to increase the electric current flowing in the channel region. As a result, the on-state resistance can be reduced.

Twenty Sixth Embodiment

Next, the twenty sixth embodiment, which is a modification of the sixteenth embodiment, will be described with reference to FIG. 44. For a vertical JFET in the twenty sixth embodiment, constitutive elements similar to those in the configuration of the vertical JFET 1u described in the sixteenth embodiment are denoted by the same reference symbols. The following will describe the structure of the drift semiconductor portion different from the sixteenth embodiment.

Figure 44:
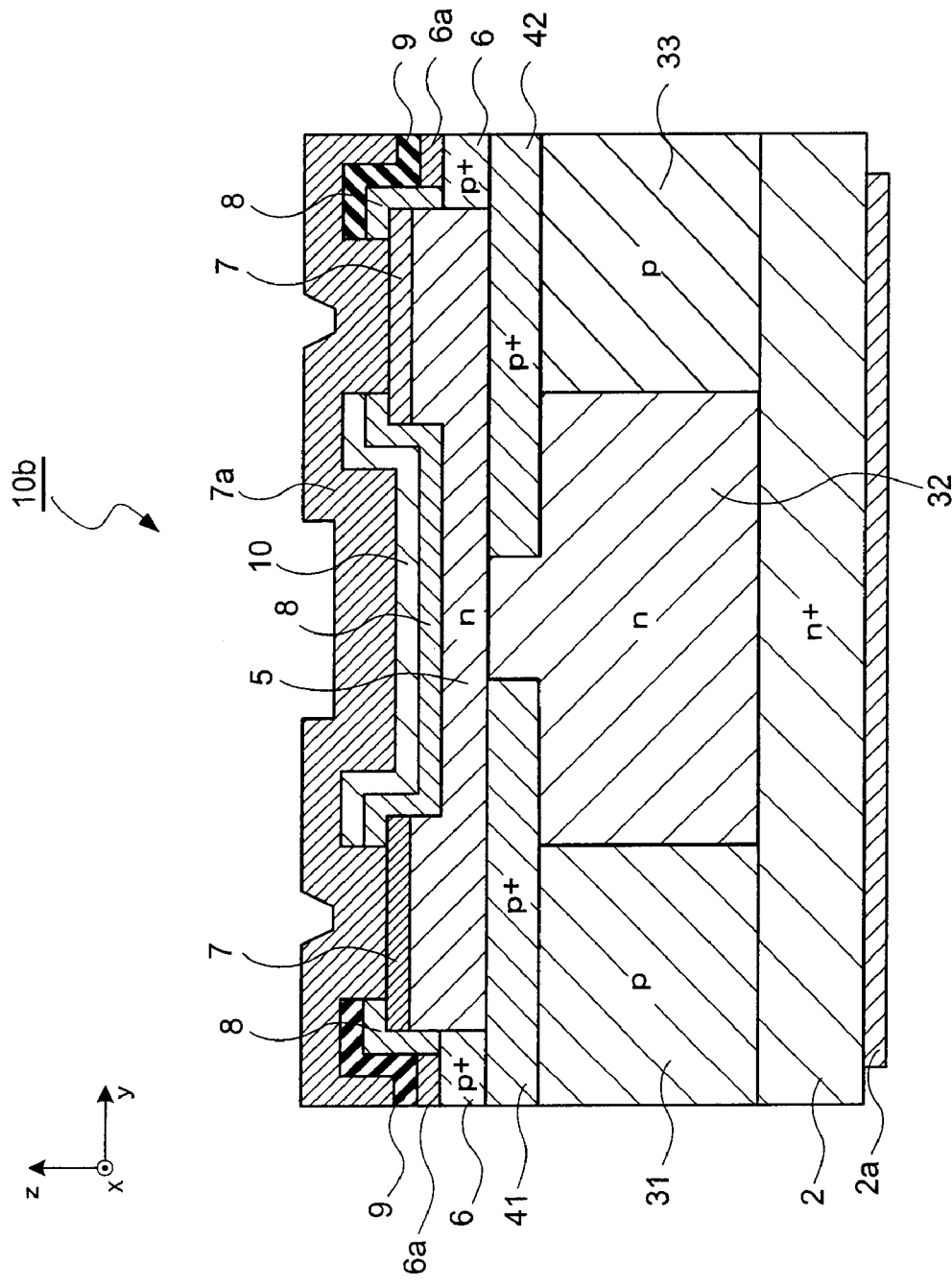
FIG. 44 is a sectional view of a vertical JFET in the twenty sixth embodiment.

FIG. 44 is a sectional view of a vertical JFET 10b in the twenty sixth embodiment. The twenty sixth embodiment is different in the structure of the drift semiconductor portion from the sixteenth embodiment. Specifically, the sixteenth embodiment was directed to the configuration wherein the drift semiconductor portion had the same conductivity type as the conductivity type of the n$^+$ type drain semiconductor portion 2, whereas the twenty sixth embodiment is directed to a configuration wherein the drift semiconductor portion has the Super Junction (SJ) structure composed of semiconductor regions of different conductivity types.

With reference to FIG. 44, the drift semiconductor portion is placed on the principal surface of the n$^+$ type drain semiconductor portion 2. The drift semiconductor portion has p-type semiconductor regions 31, 33 and an n-type semiconductor region 32 extending along a reference plane intersecting with the principal surface of the n$^+$ type drain semiconductor portion 2. The p-type semiconductor regions 31, 33 are arranged so as to place the n-type semiconductor region 32 in between. Junction surfaces between the p-type semiconductor regions and the n-type semiconductor region are located between the p$^+$ type gate semiconductor portions 41, 42 and the n$^+$ type drain semiconductor portion 2.

The p-type semiconductor regions 31, 33 are located between the p$^+$ type gate semiconductor portions 41, 42 and the n$^+$ type drain semiconductor portion 2 and extend along the p$^+$ type gate semiconductor portions 41, 42 (in the x-axis direction in FIG. 44).

The n-type semiconductor region 32 is located between the n$^+$ type drain semiconductor portion 2 and the n-type channel semiconductor portion 5 existing between the p$^+$ type gate semiconductor portion 41 and the p$^+$ type gate semiconductor portion 42, and extends in the direction along the p$^+$ type gate semiconductor portions 41, 42 (the x-axis direction in FIG. 44). The n-type semiconductor region 32 has the same conductivity type as the conductivity type of the drain semiconductor portion 2.

Figure 45:
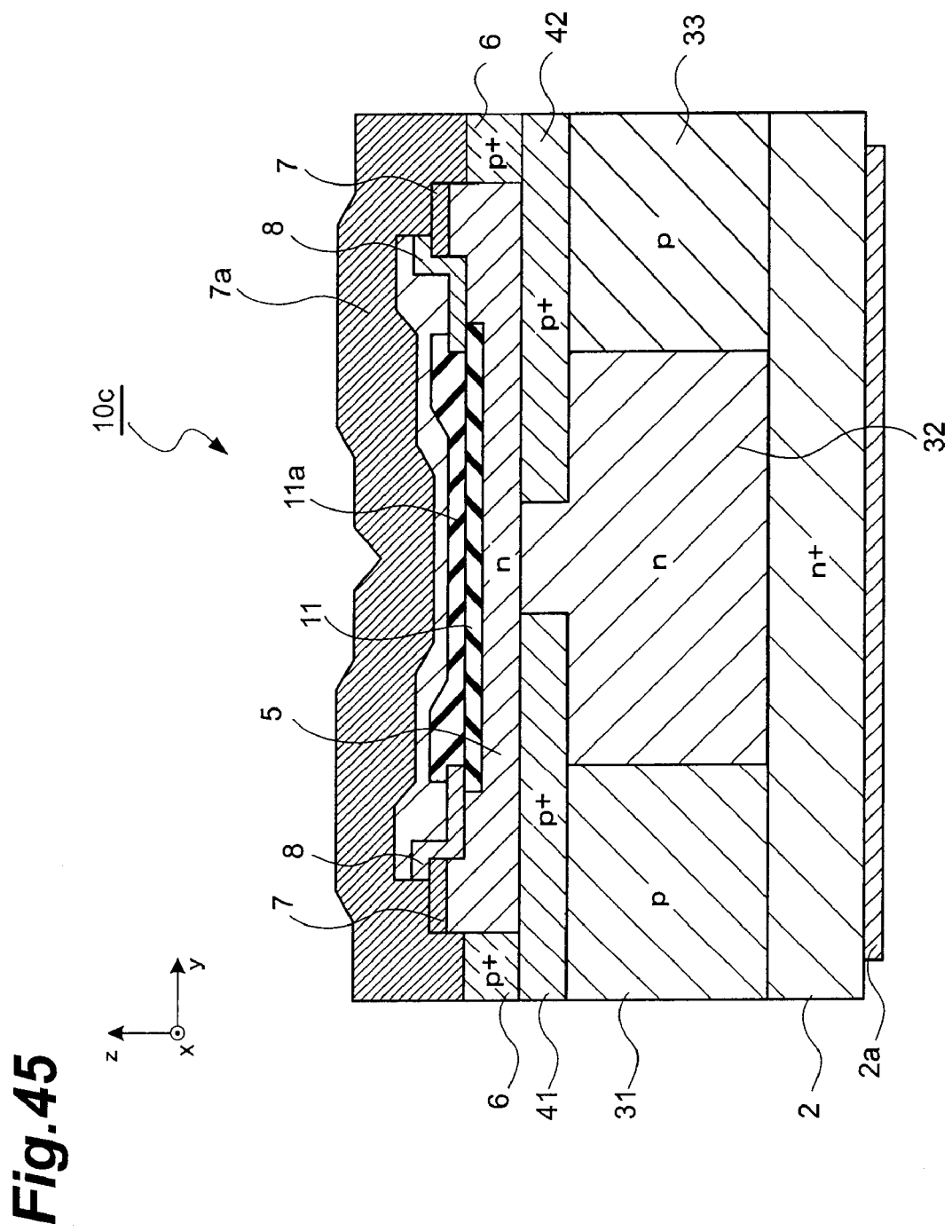
FIG. 45 is a sectional view of a vertical JFET showing another form having the super junction structure.
Figure 46:
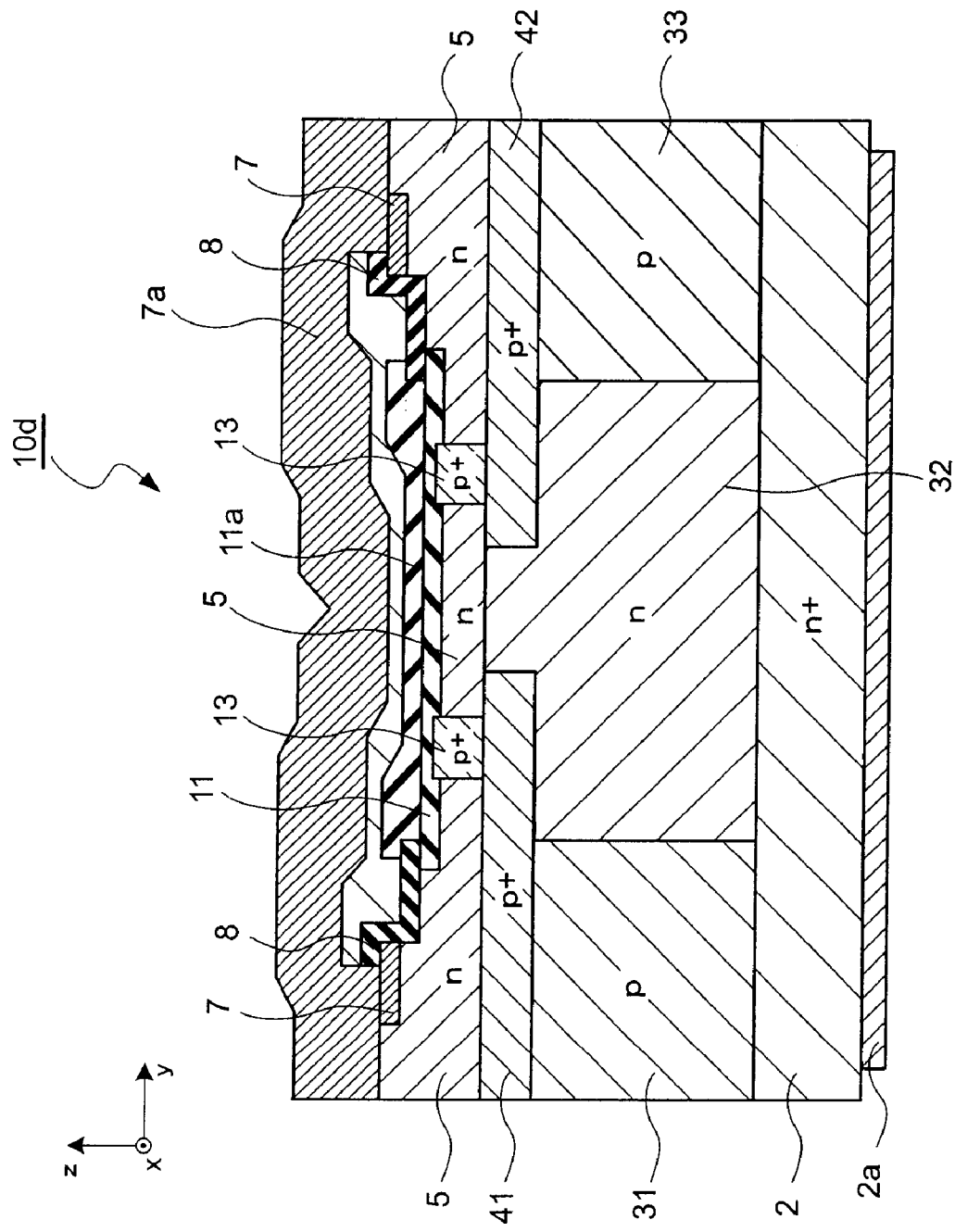
FIG. 46 is a sectional view of a vertical JFET showing still another form having the super junction structure.

The super junction structure is also applicable to the drift semiconductor portion of the vertical JFET 1x described in the twenty first embodiment, as shown in FIG. 45. The super junction structure is also applicable to the drift semiconductor portion of the vertical JFET 1z described in the twenty fourth embodiment, as shown in FIG. 46. The super junction structure is also applicable to the vertical JFETs described in the other embodiments.

In the vertical JFET 10b in the present embodiment, the drift semiconductor portion is comprised of a plurality of semiconductor regions of different conductivity types. In the case of the drift semiconductor portion having such structure, the whole of the drift semiconductor portion is fully depleted with application of a high drain voltage. Therefore, the maximum of the electric field in the drift semiconductor portion becomes lower. Consequently, the thickness of the drift semiconductor portion can be decreased. For this reason, the on-state resistance becomes smaller.

The dopant concentration of the p-type semiconductor regions 31, 33 is preferably nearly equal to that of the n-type semiconductor region 32. In a preferred example where the breakdown voltage of 500 V is assumed, the dopant concentrations of the p-type semiconductor regions 31, 33 and the n-type semiconductor region 32 are approximately $2.7 \times 10^{17}$ cm$^{-3}$. In a preferred example where the breakdown voltage of 500 V is assumed, the widths (in the y-axis direction in the drawing) of the p-type semiconductor regions 31, 33 and the n-type semiconductor region 32 are approximately 0.5 µm. This permits the depletion layer to extend into the entire p-type semiconductor regions and to extend into the entire n-type semiconductor region. Since the depletion layer extends into the both semiconductor regions in this manner, the concentration of the electric field in the drift semiconductor portion is alleviated.

Twenty Seventh Embodiment

Figure 47A:
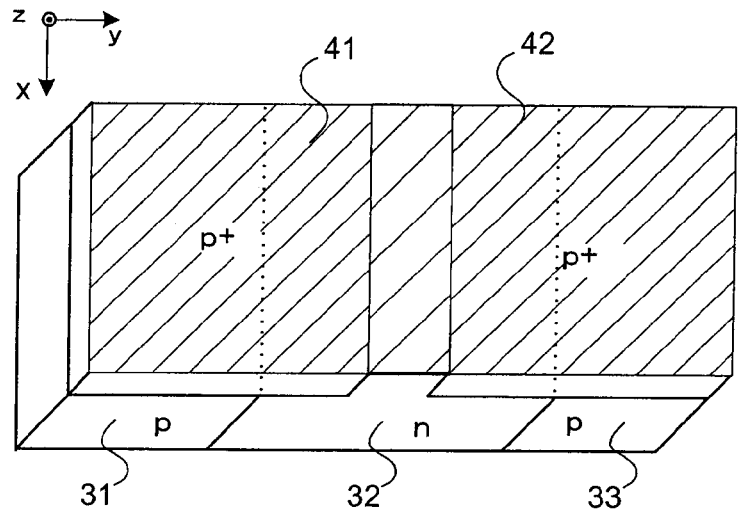
FIG. 47A is a schematic view showing a positional relation between semiconductor regions and gate semiconductor portions of a vertical JFET in the twenty seventh embodiment.

The positional relation of the gate semiconductor portions with the n-type semiconductor region and the p-type semiconductor regions is not limited to those described in the embodiments heretofore. FIG. 47A is a schematic diagram showing a positional relation between each of semiconductor regions and the gate semiconductor portions in the twenty seventh embodiment. The p-type semiconductor regions 31, 33 and the n-type semiconductor region 32 all extend in a predetermined axial direction (the x-axis direction in the drawing). The p-type semiconductor regions 31, 33 are arranged to place the n-type semiconductor region 32 in between. Junctions between the p-type semiconductor regions and the n-type semiconductor region are located below the p$^+$ type gate semiconductor portions 41, 42.

Figure 47B:
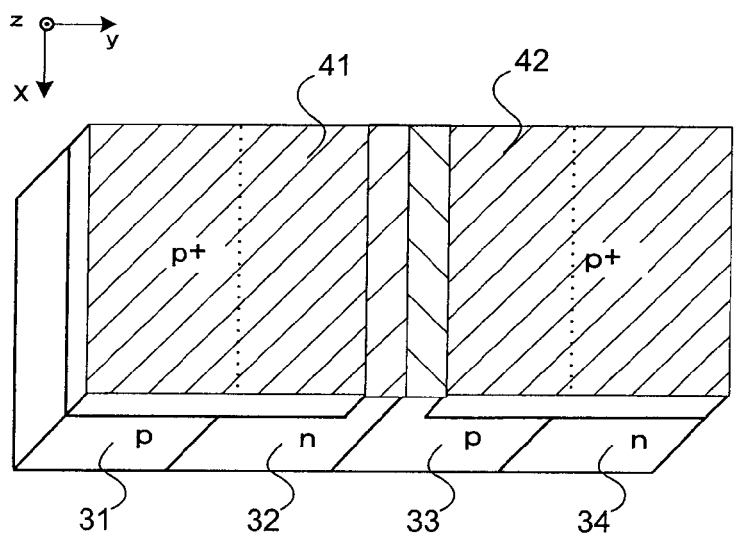
FIG. 47B is a schematic view showing a vertical JFET in the twenty seventh embodiment.

In contrast to it, FIG. 47B is a schematic diagram showing another positional relation between each of semiconductor regions and the gate semiconductor portions in the twenty seventh embodiment. The p-type semiconductor regions 31, 33 and n-type semiconductor regions 32, 34 all extend in a predetermined axial direction (the x-axis direction in the drawing). The p-type semiconductor regions 31, 33 and n-type semiconductor regions 32, 34 are alternately arranged. Junctions between the p-type semiconductor regions and the n-type semiconductor regions are located not only under the p$^+$ type gate semiconductor portions 41, 42, but also between the gate semiconductor portions.

Figure 47C:
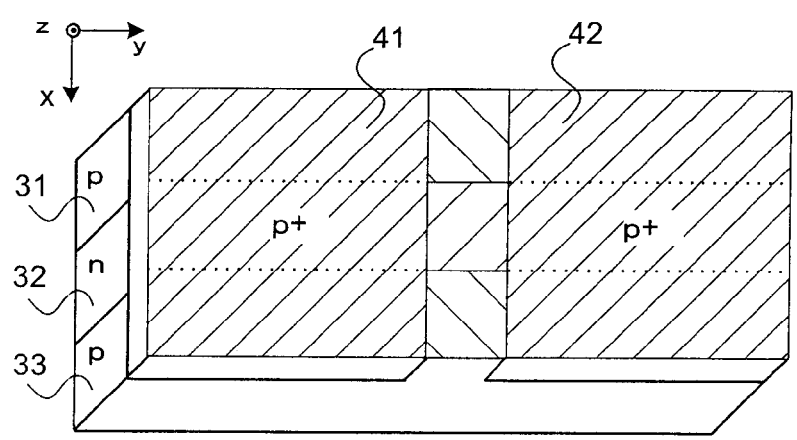
FIG. 47C is a schematic view showing a vertical JFET in still another form.

FIG. 47C is a schematic plan view showing a positional relation between each of semiconductor regions and the gate semiconductor portions in still another form. The p-type semiconductor regions 31, 33 and n-type semiconductor region 32 all extend in a predetermined axial direction (the y-axis direction in the drawing). The p-type semiconductor regions 31, 33 are arranged so as to place the n-type semiconductor region 32 in between. The n-type semiconductor region may consist of a plurality of regions.

Twenty Eighth Embodiment

The following will describe a method of forming n-type semiconductor regions and p-type semiconductor regions constituting the super junction structure, in a production method of a vertical JFET having the super junction structure.

Figure 48A:
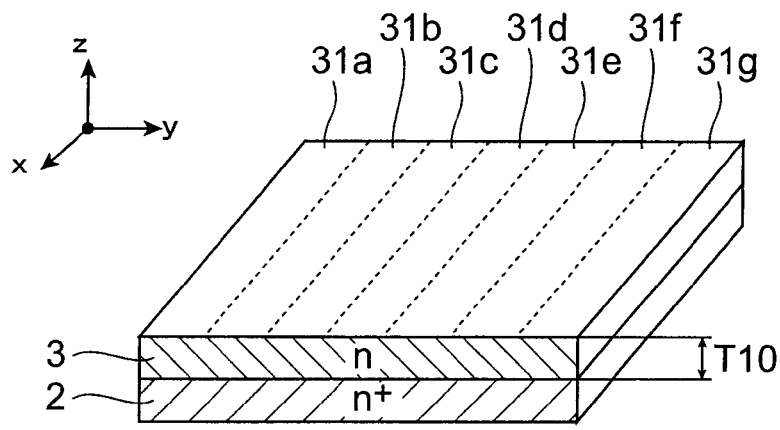
FIG. 48A is a perspective view of a vertical JFET in a drift region forming step.

(n-Type Semiconductor Layer Forming Step) First, an $n^+$ type SiC semiconductor substrate is prepared. The n-type impurity concentration of the substrate is as high as this substrate can be used as a drain semiconductor portion. As shown in FIG. 48A, an SiC film 3 is grown on the front surface of the $n^+$ type drain semiconductor portion 2 by epitaxial growth. In a preferred example where the breakdown voltage of 500 V is assumed, the thickness T10 of the SiC film 3 is not less than 2.0 μm nor more than 3.0 μm. The conductivity type of the SiC film 3 is the same as that of the drain semiconductor portion 2. The dopant concentration of the SiC film 3 is lower than that of the $n^+$ type drain semiconductor portion 2. N-type semiconductor layers 32, 34, and 36 are formed from this SiC film 3.

Figure 48B:
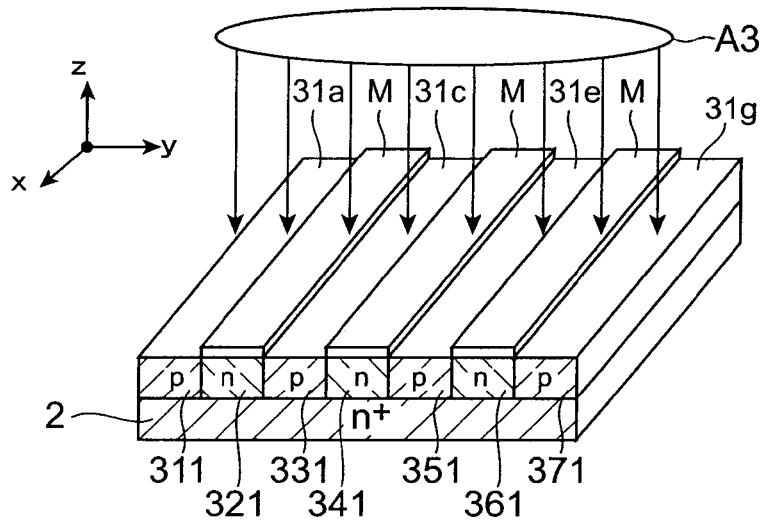
FIG. 48B is a perspective view of a vertical JFET in a p$^+$ type semiconductor region forming step.

(p-Type Semiconductor Layer Forming Step) A step of forming p-type semiconductor layers will be described with reference to FIG. 48B. Using a predetermined mask M, regions 31a, 31c, 31e, and 31g formed on the n-type semiconductor layer 3 are selectively ion-implanted with a dopant A3 to form p-type semiconductor layers 311, 331, 351, and 371 having a predetermined depth. After the p-type semiconductor layers are formed, the mask M is removed.

Figure 48C:
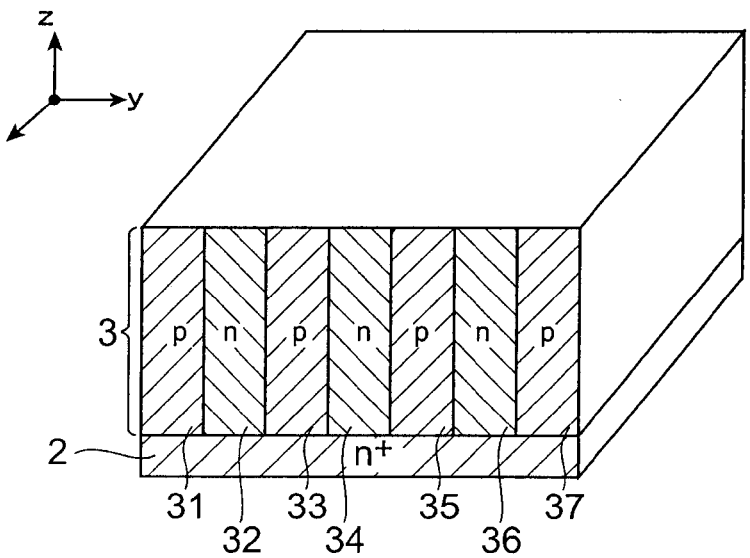
FIG. 48C is a perspective view of a vertical JFET in a source region forming step.

(Drift Semiconductor Portion Forming Step) A step of forming a drift semiconductor portion having a desired thickness will be described with reference to FIG. 48C. Specifically, the n-type semiconductor layer forming step and the p-type semiconductor layer forming step are alternately repeated to form the drift semiconductor portion having the super junction structure on the $n^+$ type drain semiconductor portion 2. As a result, the semiconductor layer 3 having a predetermined thickness (in the z-axis direction in the drawing) is formed. The above described the method of forming the drift semiconductor portion having the n-type semiconductor regions and the p-type semiconductor regions. The other steps are similar to those in the eighteenth, twelfth, and twenty second embodiments, but are not limited to these.

The vertical JFETs and production methods thereof according to the present invention are not limited to the forms described in the above respective embodiments, but can be modified in various modification forms according to other conditions or the like. For example, each of the above embodiments described the example in which the channel region was formed from the n-type semiconductor containing the donor impurity, but the present invention is also applicable to JFETs in which the channel region is formed from a p-type semiconductor. In this case, however, the current direction and the polarities of the gate voltage applied are reverse.

INDUSTRIAL APPLICABILITY

The present invention successfully provides the vertical junction field effect transistors with low loss while maintaining a high drain blocking voltage, and the production methods of the vertical junction field effect transistors.

The invention claimed is:

1. A vertical junction field effect transistor comprising:
a drain semiconductor portion;
a drift semiconductor portion placed on a principal surface of the drain semiconductor portion and having first, second, third, and fourth regions extending in a predetermined axial direction intersecting with the principal surface;
a buried semiconductor portion having a conductivity type opposite to a conductivity type of the drift semiconductor portion and placed on the first, second, and third regions of the drift semiconductor portion;
a channel semiconductor portion placed along the buried semiconductor portion, having the conductivity type opposite to the conductivity type of the buried semiconductor portion, and electrically connected to the fourth region of the drift semiconductor portion;
a source semiconductor portion placed on the channel semiconductor portion and the first region of the drift semiconductor portion; and
a gate semiconductor portion having a conductivity type opposite to a conductivity type of the drain semiconductor portion and placed on the channel semiconductor portion and the third and fourth regions;
wherein the gate semiconductor portion has a plurality of projections extending in a direction from the third region toward the fourth region, the channel semiconductor portion is placed between the projections, and the projections are connected to the buried semiconductor portion.

2. A vertical junction field effect transistor comprising:
a drain semiconductor portion;
a drift semiconductor portion placed on a principal surface of the drain semiconductor portion and having first, second, third, and fourth regions extending in a predetermined axial direction intersecting with the principal surface;
a buried semiconductor portion having a conductivity type opposite to a conductivity type of the drift semiconductor portion and placed on the first, second, and third regions of the drift semiconductor portion;
a channel semiconductor portion placed along the buried semiconductor portion, having the conductivity type opposite to the conductivity type of the buried semiconductor portion, and electrically connected to the fourth region of the drift semiconductor portion;
a source semiconductor portion placed on the channel semiconductor portion and the first region of the drift semiconductor portion; and
a plurality of gate semiconductor portions having a conductivity type opposite to a conductivity type of the drain semiconductor portion and placed on the channel semiconductor portion and the third and fourth regions;
wherein each of the gate semiconductor portions extends in a direction from the third region toward the fourth region, the channel semiconductor portion is placed between the gate semiconductor portions, and each gate semiconductor portion is connected to the buried semiconductor portion.

3. A vertical junction field effect transistor comprising:
a drain semiconductor portion;
a drift semiconductor portion placed on a principal surface of the drain semiconductor portion and having first, second, third, and fourth regions extending in a predetermined axial direction intersecting with the principal surface;
a buried semiconductor portion placed on a principal surface of the drift semiconductor portion and placed on the first, second, and third regions extending in the predetermined axial direction intersecting with the principal surface;
a channel semiconductor portion placed along the buried semiconductor portion, having a conductivity type opposite to a conductivity type of the buried semiconductor portion, and electrically connected to the fourth region of the drift semiconductor portion; and
a gate semiconductor portion having a conductivity type opposite to a conductivity type of the drift semiconductor portion and placed on the channel semiconductor portion and the third and fourth regions;

wherein the gate semiconductor portion has a plurality of projections extending in a direction from the third region toward the fourth region, the channel semiconductor portion is placed between the projections, and the drift semiconductor portion is connected to the buried semiconductor portion, wherein the drift semiconductor portion has a fifth region extending in the axial direction intersecting with the principal surface of the drain semiconductor portion, the transistor further comprising a second semiconductor portion having a conductivity type opposite to a conductivity type of the drain semiconductor portion and placed above the fifth region, wherein the second semiconductor portion extends from the buried semiconductor portion in the predetermined axial direction along a source semiconductor portion.

4. The vertical junction field effect transistor according to claim 1, further comprising a first semiconductor portion placed on the channel semiconductor portion and the first and second regions of the drift semiconductor portion and having the same conductivity type as the source semiconductor portion, wherein a dopant concentration of the first semiconductor portion is lower than a dopant concentration of the channel semiconductor portion.

5. A vertical junction field effect transistor comprising:
a drain semiconductor portion;
a drift semiconductor portion placed on a principal surface of the drain semiconductor portion and having first to fifth regions extending in a predetermined axial direction intersecting with a reference plane extending along the principal surface;
a buried semiconductor portion having a conductivity type opposite to a conductivity type of the drift semiconductor portion and placed along the reference plane on the first to fourth regions of the drift semiconductor portion;
a plurality of gate semiconductor portions placed along the reference plane on the second to fourth regions of the drift semiconductor portion and having the same conductivity type as the conductivity type of the buried semiconductor portion;
a channel semiconductor portion placed between the buried semiconductor portion and the plurality of gate semiconductor portions, and between the plurality of gate semiconductor portions, and having the conductivity type opposite to the conductivity type of the buried semiconductor portion;
a connection semiconductor portion having the same conductivity type as the conductivity type of the buried semiconductor portion and the channel semiconductor portion, extending in the predetermined axial direction, and connecting the buried semiconductor portion and the plurality of gate semiconductor portions;
a first aggregate semiconductor portion connecting the channel semiconductor portion on the first region of the drift semiconductor portion;
a second aggregate semiconductor portion connecting the channel semiconductor portion on the fifth region of the drift semiconductor portion; and
a source semiconductor portion placed above the first region of the drift semiconductor portion and connected to the first aggregate semiconductor portion.

6. The vertical junction field effect transistor according to claim 1, wherein a space between the projections of the gate semiconductor portion is determined so that the vertical junction field effect transistor can exhibit the normally-off characteristic.

7. The vertical junction field effect transistor according to claim 3, wherein a space between the projections of the gate semiconductor portion and a space between the projections of the gate semiconductor portion and the buried semiconductor portion are determined so that the vertical junction field effect transistor can exhibit the normally-off characteristic.

8. The vertical junction field effect transistor according to claim 1, wherein the channel semiconductor portion has a structure in which low-concentration layers and high-concentration layers are alternately stacked.

9. The vertical junction field effect transistor according to claim 3, further comprising a source electrode electrically connected to the source semiconductor portion and the second semiconductor portion, wherein the buried semiconductor portion is electrically connected through the second semiconductor portion to the source electrode.

10. A vertical junction field effect transistor comprising:
a drain semiconductor portion;
a drift semiconductor portion placed on a principal surface of the drain semiconductor portion and having first, second, third, and fourth regions extending in a direction intersecting with the principal surface;
a buried semiconductor portion having a conductivity type opposite to a conductivity type of the drift semiconductor portion and placed on the first, second, and fourth regions of the drift semiconductor portion;
a channel semiconductor portion placed along the buried semiconductor portion on the first and second regions, having a conductivity type different from the conductivity type of the buried semiconductor portion, and electrically connected to the third region of the drift semiconductor portion;
a source semiconductor portion placed on the channel semiconductor portion and the first region of the drift semiconductor portion;
a first gate semiconductor portion having the same conductivity type as the buried semiconductor portion, electrically connected to the buried semiconductor portion, and placed above the fourth region of the drift semiconductor portion;
a first gate electrode electrically connected to the first gate semiconductor portion above the fourth region of the drift semiconductor portion; and
a source electrode electrically connected to the source semiconductor portion above the first region of the drift semiconductor portion, electrically isolated from the first gate electrode above the first gate electrode, and placed above the first, second, third, and fourth regions of the drift semiconductor portion.

11. The vertical junction field effect transistor according to claim 10, further comprising a second gate semiconductor portion having a conductivity type opposite to a conductivity type of the drain semiconductor portion and placed above the second region or above the second and third regions of the drift semiconductor portion, wherein the channel semiconductor portion is placed between the buried semiconductor portion and the second gate semiconductor portion, and wherein a second gate electrode electrically connected to the second gate semiconductor portion and electrically isolated under the source electrode is placed above the second region or above the second and third regions of the drift semiconductor portion.

12. A vertical junction field effect transistor comprising:
a drain semiconductor portion;
a drift semiconductor portion placed on a principal surface of the drain semiconductor portion and having first, second, third, and fourth regions extending in a direction intersecting with the principal surface;
a buried semiconductor portion having a conductivity type opposite to a conductivity type of the drift semiconductor portion and placed on the first, second, and fourth regions of the drift semiconductor portion;
a channel semiconductor portion placed along the buried semiconductor portion on the first and second regions, having a conductivity type different from the conductivity type of the buried semiconductor portion, and electrically connected to the third region of the drift semiconductor portion;
a source semiconductor portion placed on the channel semiconductor portion and the first region of the drift semiconductor portion;
a first gate semiconductor portion having the same conductivity type as the buried semiconductor portion, electrically connected to the buried semiconductor portion, and placed above the fourth region of the drift semiconductor portion;
a source electrode electrically connected to the source semiconductor portion above the first region of the drift semiconductor portion, electrically isolated from the first gate electrode above the first gate electrode, and placed above the first, second, third, and fourth regions of the drift semiconductor portion; and
a second gate semiconductor portion having a conductivity type opposite to a conductivity type of the drain semiconductor portion and placed above the second region or above the second and third regions of the drift semiconductor portion;
wherein the channel semiconductor portion is placed between the buried semiconductor portion and the second gate semiconductor portion,
wherein a second gate electrode electrically connected to the second gate semiconductor portion and electrically isolated under the source electrode is placed above the second region or above the second and third regions of the drift semiconductor portion, and
wherein the first gate semiconductor portion and the source semiconductor portion are electrically connected by the source electrode.

13. A vertical junction field effect transistor comprising:
a drain semiconductor portion;
a drift semiconductor portion placed on a principal surface of the drain semiconductor portion and having first, second, and third regions extending in a direction intersecting with the principal surface;
a buried semiconductor portion having a conductivity type opposite to a conductivity type of the drift semiconductor portion and placed on the first, second, and third regions of the drift semiconductor portion;
a channel semiconductor portion placed along the buried semiconductor portion on the first and second regions, having a conductivity type different from the conductivity type of the buried semiconductor portion, and electrically connected to the third region of the drift semiconductor portion;
a source semiconductor portion placed on the channel semiconductor portion and the first region of the drift semiconductor portion;
a second gate semiconductor portion having a conductivity type opposite to a conductivity type of the drain semiconductor portion and placed above the second region or above the second and third regions of the drift semiconductor portion;
a second gate electrode placed above the second region or above the second and third regions of the drift semiconductor portion, electrically connected to the second gate semiconductor portion, and electrically isolated under the source electrode;
a source electrode electrically connected to the source semiconductor portion above the first region of the drift semiconductor portion, electrically isolated from the second gate electrode above the second gate electrode, and placed above the first, second, and third regions of the drift semiconductor portion; and
connection semiconductor portions having the same conductivity type as the buried semiconductor portion, penetrating the channel semiconductor portion so as to electrically connect the second gate semiconductor portion and the buried semiconductor portion, and scattered above the second region of the drift semiconductor portion.

14. The vertical junction field effect transistor according to claim 10, further comprising a first semiconductor portion placed on the channel semiconductor portion and the first region of the drift semiconductor portion and having the same conductivity type as a conductivity type of the source semiconductor portion,
wherein an impurity concentration of the first semiconductor portion is lower than an impurity concentration of the channel semiconductor portion.

15. The vertical junction field effect transistor according to claim 10, wherein at least one of the first and second gate electrodes is provided as a gate electrode in a peripheral portion of a primitive cell or chip comprised of a plurality of transistors.

16. The vertical junction field effect transistor according to claim 11, wherein the second gate semiconductor portion and the channel semiconductor portion are provided so as to constitute a heterojunction.

17. The vertical junction field effect transistor according to claim 10, wherein a thickness of the channel semiconductor portion placed above the second region of the drift semiconductor portion is smaller than a space between the source semiconductor portion and the buried semiconductor portion placed on the first region of the drift semiconductor portion.

18. The vertical junction field effect transistor according to claim 10, wherein a thickness of the channel semiconductor portion placed above the second region of the drift semiconductor portion is determined so that the vertical junction field effect transistor can exhibit the normally-off characteristic.

19. The vertical junction field effect transistor according to claim 10, wherein the drift semiconductor portion has an electroconductive semiconductor region extending along a reference plane intersecting with the principal surface of the drain semiconductor portion, having the same conductivity type as the drain semiconductor portion, and electrically connected from the third region of the drift semiconductor portion to the channel semiconductor portion; and
a non-electroconductive semiconductor region placed next to the electroconductive semiconductor region, having the conductivity type opposite to the conductivity type of the drain semiconductor portion, and electrically connected to the buried semiconductor portion; and
wherein the electroconductive semiconductor region and the non-electroconductive semiconductor region are formed in the same direction as a direction in which the first to fourth regions of the drift semiconductor portion are arranged.

20. The vertical junction field effect transistor according to claim 10, wherein the drift semiconductor portion has an electroconductive semiconductor region extending along a reference plane intersecting with the principal surface of the drain semiconductor portion, having the same conductivity type as the drain semiconductor portion, and electrically connected from the third region of the drift semiconductor portion to the channel semiconductor portion; and a non-electroconductive semiconductor region placed next to the electroconductive semiconductor region, having the conductivity type opposite to the conductivity type of the drain semiconductor portion, and electrically connected to the buried semiconductor portion; and wherein the electroconductive semiconductor region and the non-electroconductive semiconductor region are formed in a direction intersecting with a direction in which the first to fourth regions of the drift semiconductor portion are arranged.

21. The vertical junction field effect transistor according to claim 10, wherein the drain semiconductor portion, the drift semiconductor portion, the first gate semiconductor portion, and the channel semiconductor portion are made of SiC or GaN which is a wide-gap semiconductor material.

* * * * *